(12) United States Patent
Kikumoto et al.

(10) Patent No.: US 10,727,090 B2
(45) Date of Patent: Jul. 28, 2020

(54) SUBSTRATE PROCESSING APPARATUS AND SUBSTRATE PROCESSING METHOD

(71) Applicant: SCREEN Holdings Co., Ltd., Kyoto (JP)

(72) Inventors: Noriyuki Kikumoto, Kyoto (JP); Toyohide Hayashi, Kyoto (JP); Naoto Fujita, Kyoto (JP); Michinori Iwao, Kyoto (JP); Wataru Sakai, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/992,252

(22) Filed: May 30, 2018

(65) Prior Publication Data
US 2018/0350632 A1  Dec. 6, 2018

(30) Foreign Application Priority Data

May 31, 2017 (JP) ................................ 2017-108730

(51) Int. Cl.
| | | |
|---|---|---|
| H01L 21/67 | (2006.01) | |
| H01L 21/687 | (2006.01) | |
| H01L 21/683 | (2006.01) | |
| H01L 21/68 | (2006.01) | |

(52) U.S. Cl.
CPC .... H01L 21/6708 (2013.01); H01L 21/67051 (2013.01); H01L 21/67259 (2013.01); H01L 21/681 (2013.01); H01L 21/6838 (2013.01); H01L 21/68721 (2013.01); H01L 21/68742 (2013.01)

(58) Field of Classification Search
None
See application file for complete search history.

(56) References Cited

U.S. PATENT DOCUMENTS

| | | | | |
|---|---|---|---|---|
| 6,162,008 A | * | 12/2000 | Perkins | G01B 11/24 198/394 |
| 7,641,763 B2 | * | 1/2010 | Kobayashi | C03C 17/002 134/902 |
| 8,016,976 B2 | * | 9/2011 | Kamei | G03F 7/168 134/902 |
| 9,008,817 B2 | | 4/2015 | Amano | 700/114 |
| 9,786,522 B2 | * | 10/2017 | Kobayashi | H01L 21/67028 |
| 2006/0086462 A1 | | 4/2006 | Inada et al. | 156/345.33 |
| 2011/0281376 A1 | | 11/2011 | Amano | 438/5 |
| 2011/0282484 A1 | | 11/2011 | Amano | 700/114 |
| 2013/0206726 A1 | | 8/2013 | Oono | 216/85 |
| 2015/0093905 A1 | * | 4/2015 | Fujiwara | H01L 21/30604 438/745 |
| 2018/0350632 A1 | * | 12/2018 | Kikumoto | H01L 21/6708 |

FOREIGN PATENT DOCUMENTS

JP  5572575 B2  8/2014

\* cited by examiner

*Primary Examiner* — Sylvia MacArthur
(74) *Attorney, Agent, or Firm* — Ostrolenk Faber LLP

(57) ABSTRACT

A substrate processing apparatus includes a spin chuck, rotating a disk-shaped substrate around a rotational axis while holding it horizontally, a cylindrical guard, receiving a processing liquid scattered outward from the substrate held by the spin chuck, and a centering unit, which brings a center of the substrate close to the rotational axis. The centering unit includes a pusher, contacting the substrate on the spin chuck, and a linear motor, moving the pusher horizontally to move the substrate horizontally with respect to the spin chuck. At least a portion of the linear motor is disposed above the guard such as to overlap with the guard in plan view.

16 Claims, 27 Drawing Sheets

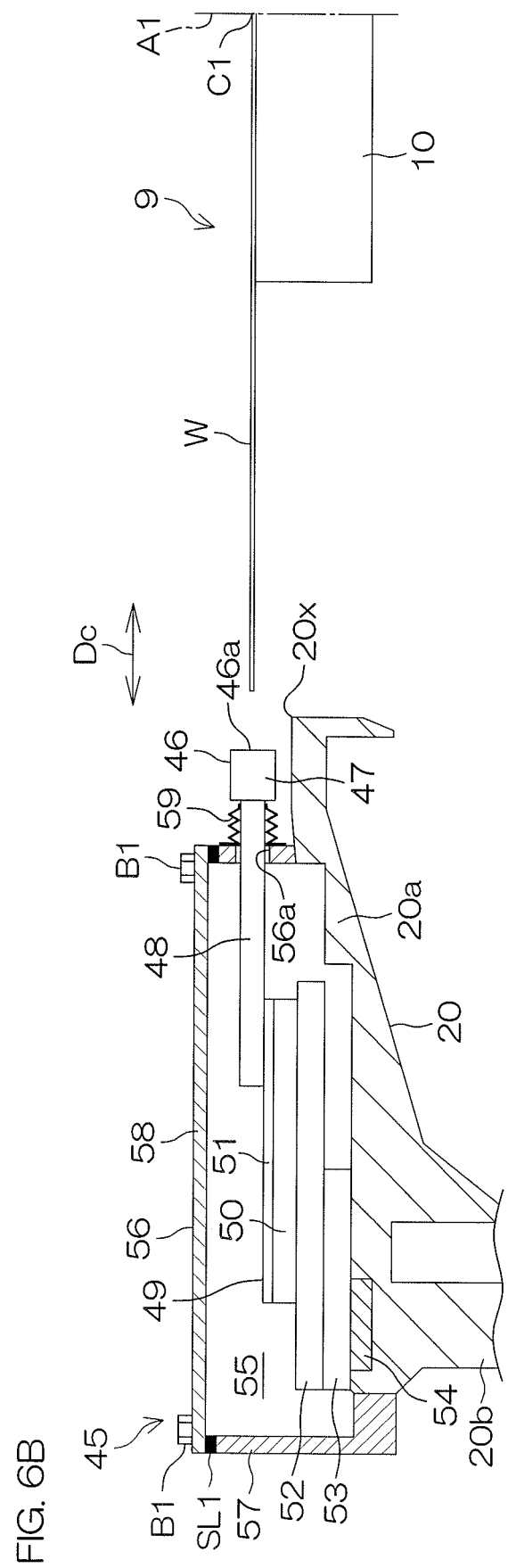

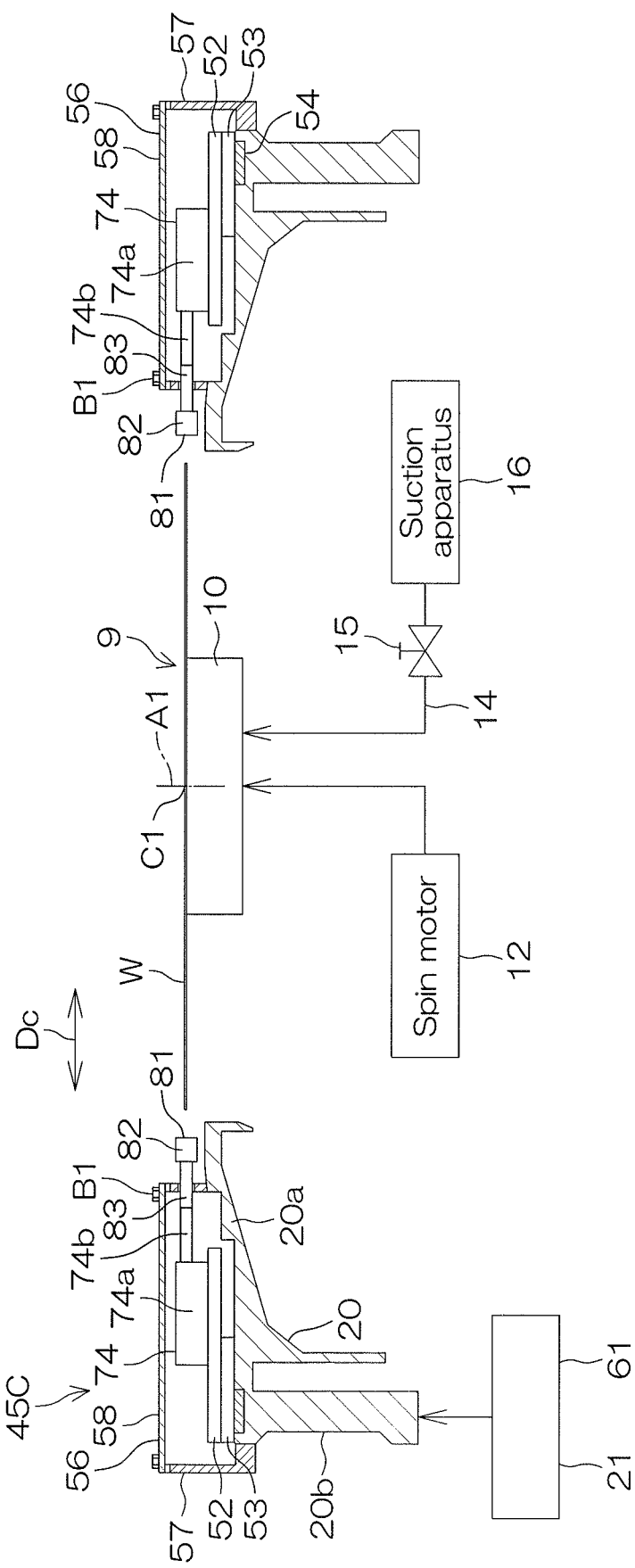

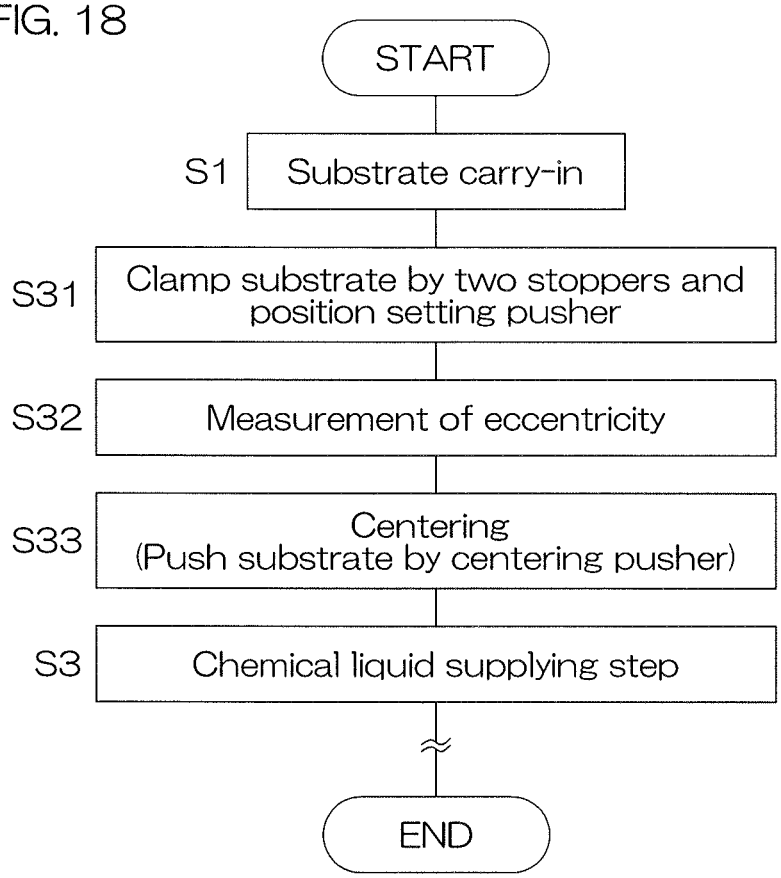
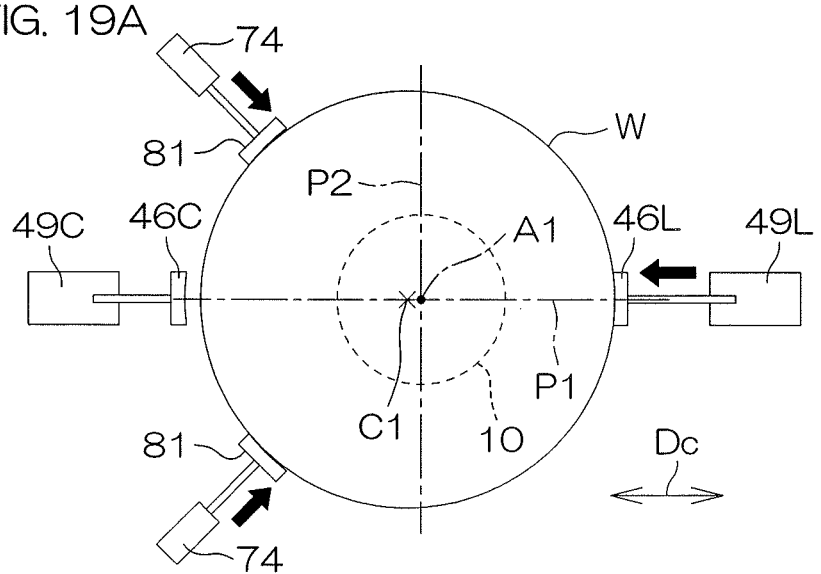

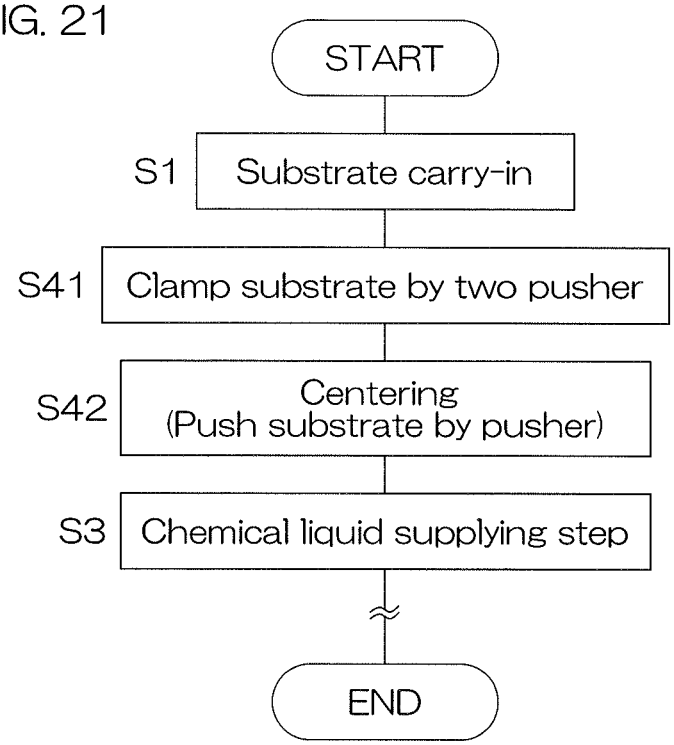
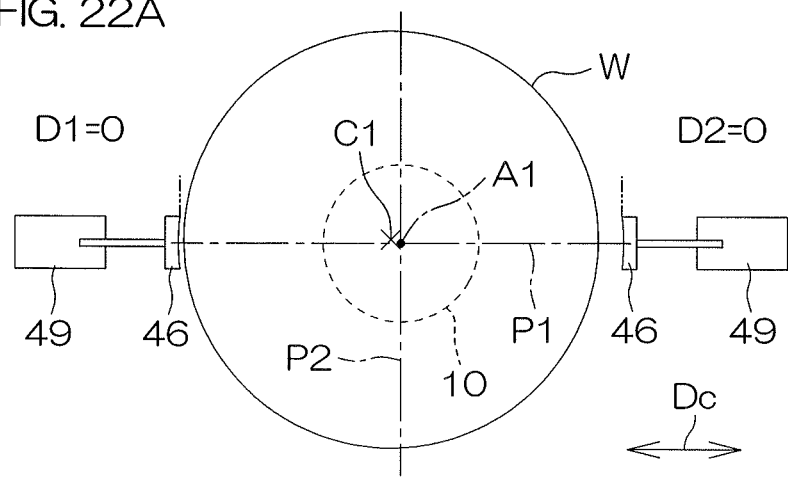

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method that process a substrate. Examples of substrates to be processed include semiconductor wafers, substrates for liquid crystal displays, substrates for optical disks, substrates for magnetic disks, substrates for magneto-optical disks, substrates for photomasks, ceramic substrates, substrates for solar cells, substrates for FPD (Flat Panel Display) such as organic EL (electroluminescence) display, etc.

2. Description of Related Art

US 2011281376 A1 discloses a single substrate processing type substrate processing system that processes substrates one by one. The substrate processing system includes a substrate processing unit including a bevel processing apparatus that performs bevel processing and a substrate position setting apparatus that performs position setting of a substrate.

The bevel processing apparatus described in US 2011281376 A1 includes a rotating portion, arranged to rotate the substrate, a drain cup, arranged to receive a processing liquid used in the bevel processing and drain the liquid to an exterior of the bevel processing apparatus, and a top plate, disposed above the drain cup.

The substrate position setting apparatus described in US 2011281376 A1 includes a first driving portion that is capable of moving a first reference portion rectilinearly in a radial direction of the substrate so as to make the first reference portion contact a side surface of the substrate, and a second driving portion that is capable of moving a second reference portion rectilinearly in the radial direction of the substrate so as to make the second reference portion contact the side surface of the substrate. The first driving portion and the second driving portion are disposed lower than the drain cup. A portion of each of these is disposed further outward than an outer peripheral surface of the drain cup.

When position setting of the substrate is performed, the substrate position setting apparatus enters between the drain cup and the top plate. Thereafter, the substrate position setting apparatus is retreated to outside the drain cup. Thereafter, the top plate is lowered and the drain cup is raised to put the top plate and the drain cup in contact. In this state, the processing liquid is supplied from a first nozzle, provided at the top plate side, and a second nozzle, provided at the drain cup side, to perform bevel processing of the substrate.

However, with the substrate processing system described in US 2011281376 A1, the first driving portion, which moves the first reference portion that contacts the substrate, is disposed lower than the drain cup that receives the processing liquid. Similarly, the second driving portion, which moves the second reference portion that contacts the substrate, is disposed lower than the drain cup that receives the processing liquid. Further, a portion of each of the first driving portion and the second driving portion is disposed further outward than the outer peripheral surface of the drain cup. The substrate processing unit including the bevel processing apparatus and the substrate position setting apparatus thus becomes large in a vertical direction and a horizontal direction.

SUMMARY OF THE INVENTION

A preferred embodiment of the present invention provides a substrate processing apparatus including a substrate holding unit, rotating a disk-shaped substrate around a vertical rotational axis passing through a central portion of the substrate while holding the substrate horizontally, a processing liquid supplying unit, supplying a processing liquid to the substrate held by the substrate holding unit, a cylindrical guard, surrounding the substrate holding unit and receiving the processing liquid scattered outward from the substrate held by the substrate holding unit, and a centering unit, which includes at least one contacting portion, contacting the substrate on the substrate holding unit, and a centering actuator, moving the at least one contacting portion horizontally to move the substrate horizontally with respect to the substrate holding unit and bring a center of the substrate close to the rotational axis, and with which at least a portion of the centering actuator is disposed above the guard such as to overlap with the guard in plan view.

With the present arrangement, the centering actuator moves the contacting portion, which contacts the substrate on the substrate holding unit, horizontally. Thereby, the substrate moves horizontally with respect to the substrate holding unit and the center of the substrate is brought close to the rotational axis of the substrate. Thereafter, the processing liquid supplying unit is made to supply the processing liquid while the substrate holding unit is made to rotate the substrate. The centered substrate can thereby be processed by the processing liquid. Uniformity of bevel processing, with which just an outer peripheral portion of the substrate is processed, and full-surface processing, with which an entire upper surface or lower surface of the substrate is processed, can thus be improved.

The processing liquid supplied to the rotating substrate scatters outward from the substrate and is received by the guard surrounding the substrate holding unit. At least a portion of the centering actuator is disposed above the guard and overlaps with the guard in plan view. Therefore, in comparison to a case where an entirety of the centering actuator is disposed at a periphery of the guard or disposed below the guard, the substrate processing apparatus can be made compact. Supplying of the processing liquid and centering can thereby be performed while suppressing enlargement of the substrate processing apparatus.

The centering actuator may be a linear actuator that rectilinearly moves the at least one contacting portion horizontally, or may be a rotary actuator that moves the at least one contacting portion within a horizontal plane. The centering actuator is preferably an electric actuator because the position of the contacting portion can then be controlled with high precision. If the centering actuator is a rotary actuator, a conversion mechanism (for example, a ball screw mechanism) that converts rotation of the rotary actuator to rectilinear motion of the contacting portion may be provided when the contacting portion is to be rectilinearly moved horizontally.

In the preferred embodiment, at least one of the following features may be added to the substrate processing apparatus.

At least a portion of the contacting portion is disposed above the guard such as to overlap with the guard in plan view when the at least one contacting portion is not in contact with the substrate.

With the present arrangement, not just at least a portion of the centering actuator but at least a portion of the contacting portion is also disposed above the guard and overlaps with the guard in plan view. Therefore, in comparison to a case where an entirety of the contacting portion is disposed at the periphery of the guard or disposed below the guard, the substrate processing apparatus can be made compact. The supplying of the processing liquid and the centering can thereby be performed while suppressing enlargement of the substrate processing apparatus.

The centering actuator is a linear motor that rectilinearly moves the at least one contacting portion horizontally.

With the present arrangement, the contacting portion moves rectilinearly horizontally and therefore a volume of a space through which the contacting portion passes can be decreased. Further, a mechanism that converts a rectilinear motion of the linear motor does not have to be provided because the contacting portion moves rectilinearly when the rectilinear motion of the linear motor is transmitted to the contacting portion. Enlargement of the substrate processing apparatus can thereby be suppressed further. Moreover, the position of contacting portion can be controlled with high precision because the contacting portion is moved by the linear motor, which is an example of an electric actuator.

The substrate processing apparatus further includes a unit housing defining, together with the guard, a housing chamber that houses the centering actuator.

With the present arrangement, the centering actuator is housed in the housing chamber defined by the unit housing. The centering actuator can thus be protected from the processing liquid scattering toward the centering actuator. Further, not just the unit housing but the guard also defines the housing chamber, and the unit housing can thus be made compact in comparison to a case where just the unit housing forms the housing chamber.

The processing liquid supplying unit includes a nozzle, discharging the processing liquid toward the upper surface of the substrate held by the substrate holding unit, and a nozzle moving unit, moving the nozzle horizontally between a processing position, at which the processing liquid discharged from the nozzle is supplied to the upper surface of the substrate held by the substrate holding unit, and a standby position, at which the nozzle is positioned at a periphery of the guard in plan view, and at least one of the unit housing, the centering actuator, and the at least one contacting portion is disposed below a passing region, through which the nozzle passes, and overlaps with the passing region in plan view.

With the present arrangement, the nozzle that discharges the processing liquid toward the upper surface of the substrate held by the substrate holding unit moves horizontally between the processing position and the standby position. At least one of the unit housing, the centering actuator, and the at least one contacting portion is disposed below the passing region, through which the nozzle passes, and overlaps with the passing region in plan view. That is, a space below the passing region is used as a space in which the unit housing, etc., are disposed. A space inside the substrate processing apparatus can thereby be used efficiently and enlargement of the substrate processing apparatus can thus be suppressed.

The unit housing includes an insertion hole, in which the contacting portion is inserted, and the substrate processing apparatus further includes a sealing member, surrounding the contacting portion and preventing entry of liquid into the unit housing via the insertion hole.

The sealing member may be a sealing ring that closes a gap between an outer peripheral surface of the contacting portion and an inner peripheral surface of the insertion hole, or may be a cylindrical bellows, including one end portion, mounted to the contacting portion, and another end portion, mounted to the unit housing, or may be of an arrangement besides these. The sealing member may be disposed inside the unit housing or may be disposed outside the unit housing.

With the present arrangement, the contacting portion of the centering unit is inserted in the insertion hole of the unit housing. The sealing member surrounds the contacting portion at the inside of the unit housing or at the outside of the unit housing. Entry of liquid and atmosphere into the unit housing via the insertion hole is prevented by the sealing member. Components, such as the centering actuator, etc., that are disposed inside the unit housing can thereby be prevented from getting wet with the processing liquid and corrosion of the components can be prevented.

The substrate processing apparatus further includes a raising/lowering unit that raises and lowers the guard and the centering unit.

With the present arrangement, the raising/lowering unit raises and lowers both the guard and the centering unit. Therefore, the substrate processing apparatus can be made compact in comparison to a case where a guard raising/lowering unit that raises and lowers the guard and a centering raising/lowering unit that raises and lowers the centering unit are provided. Further, the number of components of the substrate processing apparatus decreases and a manufacturing time of the substrate processing apparatus can thus be shortened.

The substrate processing apparatus further includes a guard raising/lowering unit, raising and lowering the guard and a centering raising/lowering unit, raising and lowering the centering unit independently of the guard and being separate of the guard raising/lowering unit.

With the present arrangement, the substrate processing apparatus is provided with the centering raising/lowering unit that is separate of the guard raising/lowering unit, which raises and lowers the guard. The centering unit can thus be raised and lowered independently of the raising and lowering of the guard. Further, the guard raising/lowering unit can be made compact in comparison to the case where the guard raising/lowering unit raises and lowers both the guard and the centering unit.

The substrate processing apparatus further includes a raising/lowering unit that includes a raising/lowering actuator, generating motive power to raise and lower the centering unit, and a transmission mechanism, transmitting the motive power of the raising/lowering actuator to the centering unit, and the transmission mechanism includes a support column that is inserted in a penetrating hole, penetrating through the guard in an up/down direction, and is raised and lowered together with the centering unit.

With the present arrangement, when the raising/lowering actuator of the raising/lowering unit raises and lowers the support column of the transmission mechanism, the centering unit is raised and lowered in accompaniment with the raising and lowering of the support column. The support column of the raising/lowering unit is not disposed at the periphery of the guard but is inserted in the penetrating hole, penetrating through the guard in the up/down direction. Enlargement of the substrate processing apparatus can thus be suppressed in comparison to a case where the support column is disposed at the periphery of the guard.

The substrate processing apparatus further includes an eccentricity detector that detects eccentricity with respect to the rotational axis of the substrate on the substrate holding unit without contacting the substrate.

With the present arrangement, the eccentricity of the substrate with respect to the rotational axis, that is, a shortest distance from the rotational axis to the center of the substrate is detected. Thereafter, the centering unit moves the substrate horizontally with respect to the substrate holding unit by a movement amount based on a detection value of the eccentricity detector. The substrate is thereby centered. Further, the eccentricity is detected by non-contact to the substrate and therefore the substrate is unlikely to move with respect to the substrate holding unit during detection or after detection of the eccentricity. The eccentricity of the substrate can thus be detected with higher precision.

The at least one contacting portion includes a pusher that contacts the outer peripheral portion of the substrate on the substrate holding unit to push the substrate on the substrate holding unit horizontally.

With the present arrangement, the centering actuator moves the pusher horizontally in a state where the substrate is on the substrate holding unit. The pusher thereby contacts the outer peripheral portion of the substrate on the substrate holding unit and the substrate on the substrate holding unit is pushed horizontally by the pusher. Consequently, the substrate moves horizontally with respect to the substrate holding unit and the center of the substrate is brought close to the rotational axis. The substrate is thereby centered.

The at least one contacting portion includes two lifters that contact the lower surface of the substrate on the substrate holding unit to lift the substrate on the substrate holding unit, and the substrate processing apparatus further includes a centering raising/lowering unit that raises and lowers the two lifters.

With the present arrangement, the centering raising/lowering unit raises the two lifters in the state where the substrate is on the substrate holding unit. Thereby, each lifter contacts the lower surface of the substrate and the substrate on the substrate holding unit is lifted by the two lifters. Thereafter, the centering actuator moves the two lifters horizontally. In this process, the substrate moves horizontally together with the two lifters in a state of being supported by the two lifters. Consequently, the substrate moves horizontally with respect to the substrate holding unit and the center of the substrate is brought close to the rotational axis. The substrate is thereby centered. Further, the substrate moves in a state of being separated upward from the substrate holding unit and therefore the substrate can be centered without generating friction between the substrate and the substrate holding unit. In addition, the substrate does not rub against the substrate holding unit and therefore the substrate can be centered with higher precision.

The centering unit further includes a slide bracket, supporting each of the two lifters and being driven horizontally by the centering actuator.

With the present arrangement, the centering actuator moves the slide bracket horizontally. In accompaniment with the movement of the slide bracket, the two lifters, supported by the slide bracket, move horizontally with the direction, speed, and movement amount being the same as the slide bracket. The substrate supported by the two lifters can thereby be moved horizontally. Further, the single centering actuator moves the two lifters horizontally and therefore two actuators respectively corresponding to the two lifters do not have to be provided.

The substrate processing apparatus further includes a guard raising/lowering unit that raises and lowers the guard and the centering raising/lowering unit is the same unit as the guard raising/lowering unit.

With the present arrangement, the centering raising/lowering unit also serves as the guard raising/lowering unit that raises and lowers the guard. In other words, the guard raising/lowering unit is used to lift the substrate on the substrate holding unit by the two lifters and place the substrate, supported by the two lifters, on the substrate holding unit. The substrate processing apparatus can thus be made compact in comparison to a case where the centering raising/lowering unit is a separate unit from the guard raising/lowering unit.

The at least one contacting portion includes two stoppers, respectively disposed at two positions that are symmetrical in relation to a reference plane that is a vertical plane passing through the rotational axis, a position setting pusher, pushing the substrate on the substrate holding unit horizontally toward the two stoppers until the outer peripheral portion of the substrate on the substrate holding unit contacts the two stoppers, and a centering pusher, pushing the substrate on the substrate holding unit in a centering direction, which is a horizontal direction parallel to the reference plane, to move the center of the substrate toward the rotational axis after the substrate on the substrate holding unit is horizontally clamped by the two stoppers and the position setting pusher, and the centering unit further includes a position setting actuator, moving the position setting pusher horizontally to horizontally clamp the substrate on the substrate holding unit by the two stoppers and the position setting pusher.

With the present arrangement, the position setting actuator moves the position setting pusher horizontally. The substrate on the substrate holding unit is thereby clamped horizontally by the two stoppers and the position setting pusher.

The two stoppers are respectively disposed at the two positions that are symmetrical in relation to the reference plane. If the center of the substrate is deviated with respect to the reference plane, that is, if the center of the substrate is not positioned on the reference plane, the substrate is guided by the two stoppers and the position setting pusher to a preparation position, at which the center of the substrate overlaps with the reference plane, and is set in position thereat.

The centering pusher pushes the substrate in the centering direction, which is the horizontal direction parallel to the reference plane. The substrate thereby moves horizontally with respect to the substrate holding unit. In this process, the center of the substrate moves on the reference plane toward the rotational axis. Thereby, the center of the substrate is brought close to the rotational axis and the substrate is centered.

The position setting pusher may be a member differing from the centering pusher or may be the same member as the centering pusher. Similarly, the position setting actuator may be an actuator differing from the centering actuator or may be the same actuator as the centering actuator.

The at least one contacting portion includes two pushers, movable in the centering direction that is the horizontal direction parallel to the reference plane, which is the vertical plane passing through the rotational axis, and contacts the outer peripheral portion of the substrate on the substrate holding unit to horizontally clamp the substrate on the substrate holding unit, and each of the two pushers includes a hand portion, contacting the outer peripheral portion of the substrate on the substrate holding unit at two positions symmetrical in relation to the reference plane.

With the present arrangement, at least one of the two pushers moves in the centering direction. The substrate on the substrate holding unit is thereby clamped horizontally by the two pushers. The hand portion of each pusher contacts the outer peripheral portion of the substrate on the substrate holding unit at two positions symmetrical in relation to the reference plane. If the center of the substrate is deviated with respect to the reference plane, the substrate is guided by the two pushers to the preparation position, at which the center of the substrate overlaps with the reference plane, and is set in position thereat.

After the substrate is disposed at the preparation position, one of the pushers pushes the substrate in the centering direction. The substrate thereby moves horizontally with respect to the substrate holding unit and the center of the substrate moves on the reference plane toward the rotational axis. The pair of pushers thus not only disposes the substrate at the preparation position but also brings the center of the substrate close to the rotational axis and therefore the number of components of the substrate processing apparatus can be decreased in comparison to a case where separate members perform the position setting of the substrate and the centering of the substrate.

Another preferred embodiment of the present invention provides a substrate processing method including a substrate holding step of making a substrate holding unit rotate a disk-shaped substrate around a vertical rotational axis, passing through a central portion of the substrate, while making the substrate holding unit hold the substrate horizontally, a processing liquid supplying step of making a processing liquid supplying unit supply a processing liquid to the substrate held by the substrate holding unit in parallel to the substrate holding step, a processing liquid capturing step of making a cylindrical guard, surrounding the substrate holding unit, receive the processing liquid scattered outward from the substrate held by the substrate holding unit in parallel to the processing liquid supplying step, and a centering step of making a centering actuator, disposed above the guard such that at least a portion thereof overlaps with the guard in plan view, horizontally move at least one contacting portion contacting the substrate on the substrate holding unit to make the substrate move horizontally with respect to the substrate holding unit and bring a center of the substrate close to the rotational axis before the processing liquid supplying step is performed. By the present method, the same effects as the effects described above can be exhibited.

In the preferred embodiment, at least one of the following features may be added to the substrate processing method.

The centering step includes a step of making the centering actuator horizontally move a pusher, included in the at least one contacting portion, to make the pusher contact an outer peripheral portion of the substrate on the substrate holding unit and horizontally push the substrate on the substrate holding unit by the pusher. By the present method, the same effects as the effects described above can be exhibited.

The substrate processing method further includes a lift-up step of making a centering raising/lowering unit raise two lifters, included in the at least one contacting portion, to make the two lifters contact a lower surface of the substrate on the substrate holding unit and lift the substrate by the two lifters, and the centering step includes a step of making the centering actuator horizontally move the two lifters in a state, in which the substrate is supported by the two lifters in the lift-up step, to move the substrate horizontally with respect to the substrate holding unit. By the present method, the same effects as the effects described above can be exhibited.

The substrate processing method further includes a preparation step of making a position setting actuator move a position setting pusher horizontally to horizontally clamp the substrate by the position setting pusher and two stoppers, respectively disposed at two positions symmetrical in relation to a reference plane, which is a vertical plane passing through the rotational axis, and the centering step includes a step of making the centering actuator horizontally move a centering pusher, included in the at least one contacting portion, to make the centering pusher contact the outer peripheral portion of the substrate on the substrate holding unit and push the substrate on the substrate holding unit in a centering direction, which is a horizontal direction parallel to the reference plane, by the centering pusher after the preparation step. By the present method, the same effects as the effects described above can be exhibited.

The at least one contacting portion includes two pushers, movable in the centering direction that is the horizontal direction parallel to the reference plane, which is the vertical plane passing through the rotational axis, and contacting the outer peripheral portion of the substrate on the substrate holding unit to horizontally clamp the substrate on the substrate holding unit, each of the two pushers includes a hand portion, contacting the outer peripheral portion of the substrate on the substrate holding unit at two positions symmetrical in relation to the reference plane, the substrate processing method further includes a preparation step of making the centering actuator move the two pushers in the centering direction to horizontally clamp the substrate on the substrate holding unit by the hand portions of the two pushers, and the centering step includes a step of making the centering actuator move one of the two pushers in the centering direction to make the pusher contact the outer peripheral portion of the substrate on the substrate holding unit and push the substrate on the substrate holding unit horizontally by the pusher after the preparation step. By the present method, the same effects as the effects described above can be exhibited.

The above and other objects, features, and effects of the present invention will become more apparent from the following detailed description of the preferred embodiments with reference to the attached drawings.

BRIEF DESCRIPTION OF THE DRAWINGS

FIG. 6B is a partially enlarged view of FIG. 6A.

FIG. 17 is a schematic vertical sectional view of the centering unit taken along line XVII-XVII shown in FIG. 15.

FIG. 18 is a flowchart for describing an example of centering processing performed by the centering system shown in FIG. 15.

FIG. 19A is a schematic view of an example of movements of the substrate and the centering unit when the example of centering processing shown in FIG. 18 is being performed.

FIG. 21 is a flowchart for describing an example of centering processing performed by the centering system shown in FIG. 20.

FIG. 22A is a schematic view of an example of movements of the substrate and the centering unit when the example of centering processing shown in FIG. 20 is being performed.

DETAILED DESCRIPTION OF PREFERRED EMBODIMENTS

Figure 1:
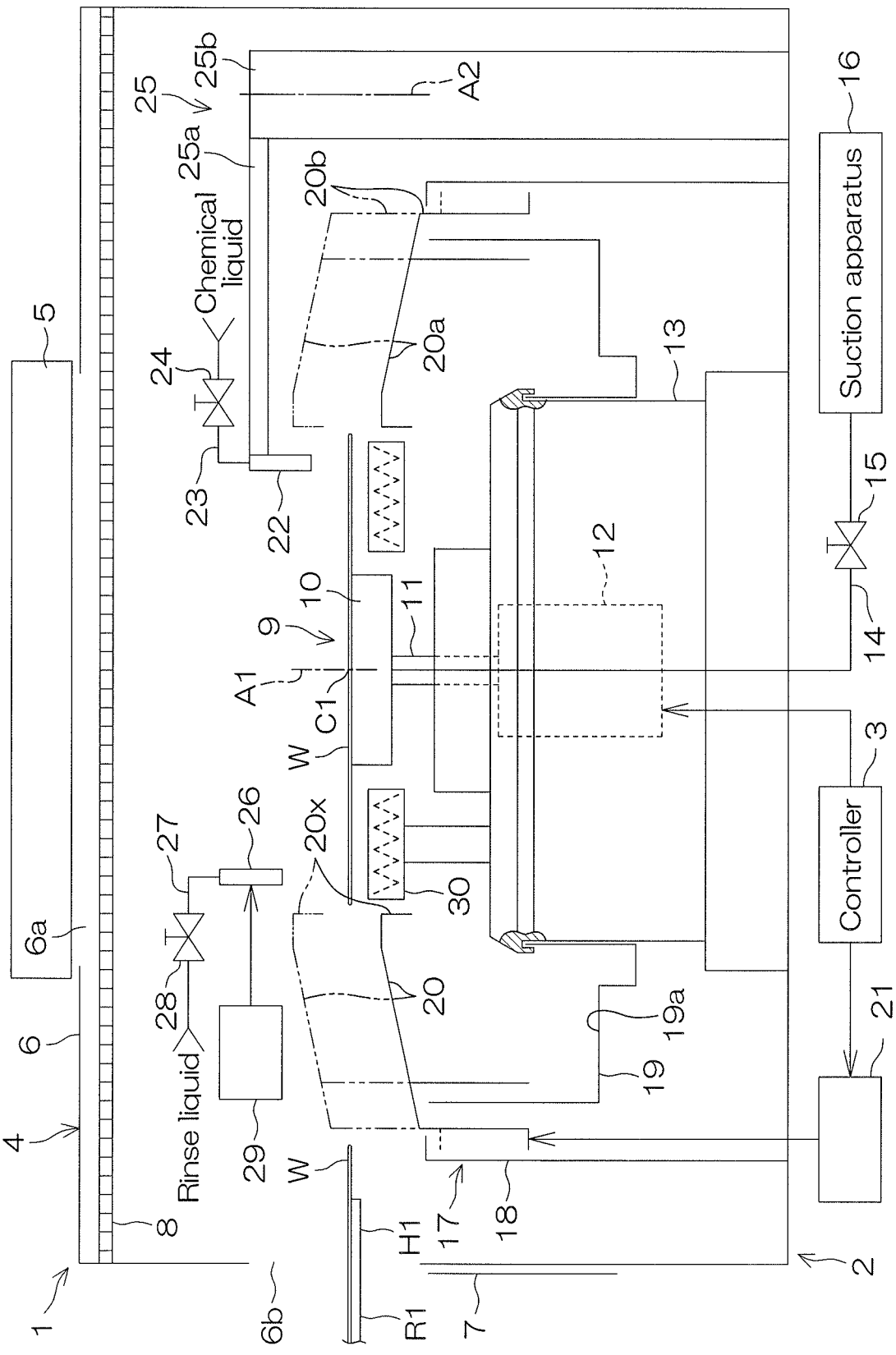
FIG. 1 is a schematic horizontal view of the interior of a processing unit included in a substrate processing apparatus according to a first preferred embodiment of the invention.

FIG. 1 is a schematic horizontal view of the interior of a processing unit 2 included in a substrate processing apparatus 1 according to a first preferred embodiment of the invention.

The substrate processing apparatus 1 is a single substrate processing type apparatus that processes disk-shaped substrates W, such as semiconductor wafers, etc., one by one. The substrate processing apparatus 1 includes the processing unit 2 that processes the substrate W using a processing fluid such as a processing liquid or processing gas, a transfer robot R1 that transports the substrate W to the processing unit 2, and a controller 3 that controls the substrate processing apparatus 1.

The processing unit 2 includes a box-shaped chamber 4 including an interior space, a spin chuck 9 that holds a single substrate W horizontally in the chamber 4 while rotating it around a vertical rotational axis A1 passing through the center portion of the substrate W and a cylindrical processing cup 17 that receives the processing liquid that has been expelled outward from the spin chuck 9. The spin chuck 9 is an example of a substrate holding unit.

The chamber 4 includes a box-shaped partition wall 6, provided with a carry-in/carry-out port 6b through which the substrate W passes, and a shutter 7 that opens and closes the carry-in/carry-out port 6b. The chamber 4 further includes an FFU 5 (Fan Filter Unit), sending clean air (air cleaned by a filter) downward inside the partition wall 6 from an air blowing port 6a opening at a ceiling surface of the partition wall 6, and a rectifying plate 8 rectifying the flow of clean air sent inside the partition wall 6 by the FFU 5.

The rectifying plate 8 partitions an interior of the partition wall 6 into an upper space above the rectifying plate 8 and a lower space below the rectifying plate 8. The upper space between the ceiling surface of the partition wall 6 and an upper surface of the rectifying plate 8 is a diffusion space in which the clean air diffuses. The lower space between a lower surface of the rectifying plate 8 and a floor surface of the partition wall 6 is a processing space in which processing of the substrate W is performed. The spin chuck 9 and the processing cup 17 are disposed in the lower space.

The clean air supplied into the upper space from the air blowing port 6a diffuses in the upper space upon hitting the rectifying plate 8. The clean air inside the upper space passes through a plurality of penetrating holes penetrating through the rectifying plate 8 in an up/down direction and flows downward from the entire rectifying plate 8. The clean air supplied to the lower space is exhausted from a bottom portion of the chamber 4. A uniform flow (down flow) of clean air that flows downward from the entire rectifying plate 8 is thereby constantly formed in the lower space.

The spin chuck 9 includes a disk-shaped spin base 10 having an outer diameter smaller than the substrate W, a suction apparatus 16 that causes the spin base 10 to horizontally hold the substrate W on the spin base 10 by suctioning a lower surface (rear surface) of the substrate W on the spin base 10, a suction piping 14 that transmits a suction force of the suction apparatus 16 to the spin base 10, and a suction valve 15 that opens and closes the suction piping 14. The spin chuck 9 further includes a spin shaft 11 extending downward from a central portion of the spin base 10, a spin motor 12 that rotates the spin shaft 11 and the spin base 10 around the rotational axis A1, and a motor housing 13 that houses the spin motor 12.

The processing cup 17 includes a cylindrical guard 20, receiving the processing liquid expelled outward from the substrate W, a cup 19, receiving the processing liquid guided downward by the guard 20, and an outer peripheral ring 18, surrounding the guard 20 and the cup 19. The guard 20 includes a cylindrical portion 20b, surrounding the spin chuck 9, and a circular annular ceiling portion 20a, extending obliquely upward from an upper end portion of the cylindrical portion 20b toward the rotational axis A1. A circular annular upper end of the ceiling portion 20a corresponds to an upper end 20x of the guard 20. The upper end 20x of the guard 20 surrounds the substrate W and the spin base 10 in plan view (see FIG. 5). The cup 19 is disposed below the ceiling portion 20a. The cup 19 defines an annular liquid receiving groove 19a that is open upward.

The guard 20 is movable vertically with respect to the bottom portion of the chamber 4. The cup 19 is fixed to the bottom portion of the chamber 4. The processing unit 2 includes a guard raising/lowering unit 21 that raises and lowers the guard 20. The guard raising/lowering unit 21 raises and lowers the guard 20 vertically between an upper position (position indicated by alternate long and two short dashed lines) and a lower position (position indicated by solid lines) and makes the guard 20 stand still at an arbitrary position from the upper position to the lower position. The upper position is a position at which the upper end 20x of the guard 20 is positioned higher than a support position where the substrate W, supported by the spin chuck 9, is disposed (position of the substrate W shown in FIG. 1). The lower position is a position at which the upper end 20x of the guard 20 is positioned lower than the support position.

When, in a state where the spin chuck 9 is rotating the substrate W, the processing liquid is supplied to the substrate W, the processing liquid supplied to the substrate W is spun off to a periphery of the substrate W. When the processing liquid is supplied to the substrate W, the upper end 20x of the guard 20 is disposed higher than the substrate W. The processing liquid, such as a chemical liquid or rinse liquid, etc., that is expelled to the periphery of the substrate W is thus received by the guard 20 and guided to the cup 19.

The processing unit 2 includes a chemical liquid nozzle 22 that discharges chemical liquid downward toward an upper surface of the substrate W. The chemical liquid nozzle 22 is included in a processing liquid supplying unit. The chemical liquid nozzle 22 is connected to a chemical liquid piping 23 that guides the chemical liquid. When a chemical liquid valve 24 interposed in the chemical liquid piping 23 is opened, the chemical liquid is discharged downward and continuously from a discharge port of the chemical liquid nozzle 22. The chemical liquid to be discharged from the chemical liquid nozzle 22 may be a liquid containing at least one of sulfuric acid, nitric acid, hydrochloric acid, hydrofluoric acid, phosphoric acid, acetic acid, ammonia water, hydrogen peroxide water, an organic acid (for example, citric acid, oxalic acid, etc.), an organic alkali (for example, TMAH (tetramethylammonium hydroxide aqueous solution), etc.), a surfactant, and a corrosion inhibitor, or may be a liquid other than this.

While not shown, the chemical liquid valve 24 includes a valve body that defines a flow passage, a valve element that is disposed in the flow passage, and an actuator that moves the valve element. The same applies to other valves. The actuator may be a pneumatic actuator or an electric actuator or an actuator besides these. The controller 3 changes an opening degree of the chemical liquid valve 24 by controlling the actuator.

The chemical liquid nozzle 22 is a scan nozzle that is movable inside the chamber 4. The chemical liquid nozzle 22 is connected to a nozzle moving unit 25 that moves the chemical liquid nozzle 22 in at least one of a vertical direction and a horizontal direction. The nozzle moving unit 25 moves the chemical liquid nozzle 22 horizontally between a processing position, at which the chemical liquid discharged from the chemical liquid nozzle 22 lands on the upper surface of the substrate W, and a standby position, at which the chemical liquid nozzle 22 is positioned at a periphery of the processing cup 17 in plan view. FIG. 1 shows an example where the nozzle moving unit 25 is a swinging unit that moves the chemical liquid nozzle 22 horizontally around a nozzle pivoting axis A2 extending vertically at the periphery of the processing cup 17.

The nozzle moving unit 25 includes a nozzle arm 25a, holding the chemical liquid nozzle 22, and a drive unit 25b, moving the nozzle arm 25a to move the chemical liquid nozzle 22 horizontally. The chemical liquid nozzle 22 extends downward from a tip portion of the horizontally extending nozzle arm 25a. When the chemical liquid nozzle 22 is disposed at the processing position, the nozzle arm 25a overlaps with the substrate W on the spin chuck 9 in plan view. When the chemical liquid nozzle 22 is disposed at the standby position, the nozzle arm 25a is disposed at the periphery of the substrate W on the spin chuck 9 in plan view.

The processing unit 2 further includes a rinse liquid nozzle 26 that discharges rinse liquid downward toward the upper surface of the substrate W. The rinse liquid nozzle 26 is included in the processing liquid supplying unit. The rinse liquid nozzle 26 is connected to a rinse liquid piping 27 that guides the rinse liquid. When a rinse liquid valve 28 interposed in the rinse liquid piping 27 is opened, the rinse liquid is discharged downward and continuously from a discharge port of the rinse liquid nozzle 26. The rinse liquid is, for example, pure water (deionized water). The rinse liquid is not restricted to pure water and may be any of IPA (isopropyl alcohol), electrolyzed ion water, hydrogen water, ozone water, and aqueous hydrochloric acid solution of dilute concentration (for example of approximately 10 to 100 ppm) and may be a liquid other than these.

The rinse liquid nozzle 26 is a scan nozzle. The rinse liquid nozzle 26 may instead be a fixed nozzle fixed to the bottom portion of the chamber 4. The rinse liquid nozzle 26 is connected to a nozzle moving unit 29 that moves the rinse liquid nozzle 26 in at least one of the vertical direction and a horizontal direction. The nozzle moving unit 29 moves the rinse liquid nozzle 26 horizontally between a processing position, at which the rinse liquid discharged from the rinse liquid nozzle 26 lands on the upper surface of the substrate W, and a standby position, at which the rinse liquid nozzle 26 is positioned at a periphery of the spin chuck 9 in plan view.

The processing unit 2 may include a heater 30 that heats the substrate W on the spin base 10. The heater 30 is disposed below the substrate W supported by the spin base 10. The heater 30 surrounds the spin base 10. An outer diameter of the heater 30 is smaller than an inner diameter of the upper end 20x of the guard 20. An inner diameter of the heater 30 is greater than an outer diameter of the spin base 10. The heater 30 is disposed above the motor housing 13 and is supported by the motor housing 13. Even if the spin base 10 rotates, the heater 30 does not rotate.

Figure 2:
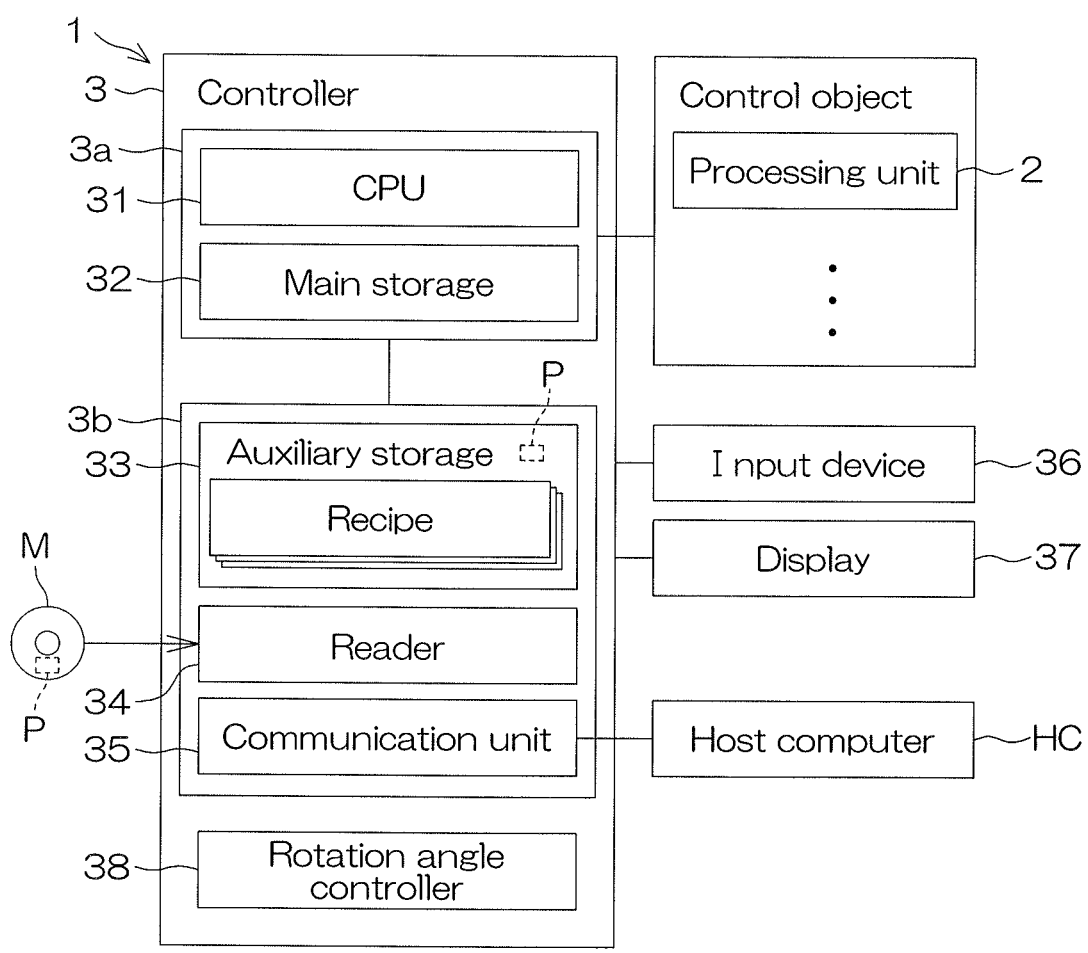
FIG. 2 is a block diagram showing hardware and a functional block of a controller included in the substrate processing apparatus.

FIG. 2 is a block diagram showing hardware and a functional block of the controller 3 included in the substrate processing apparatus 1. A rotation angle controller 38 shown in FIG. 2 is the functional block that is realized by a CPU 31 executing a program P installed in the controller 3.

The controller 3 includes a computer main body 3a and a peripheral unit 3b connected to the computer main body 3a. The computer main body 3a includes the CPU 31 (central processing unit) that executes various instructions and a main storage 32 that stores information. The peripheral unit 3b includes an auxiliary storage 33 that stores information such as the program P, a reader 34 that reads information from a removable medium M, and a communication unit 35 that communicates with a device other than the controller 3 such as a host computer HC.

The controller 3 is connected to an input device 36 and a display 37. The input device 36 is operated when an operator, such as a user or a maintenance staff, etc., inputs information into the substrate processing apparatus 1. The information is displayed on a screen of the display 37. The input device 36 may be any of a keyboard, a pointing device, and a touch panel or may be a unit besides these. The substrate processing apparatus 1 may include a touch panel display that serves as both the input device 36 and the display 37.

The CPU 31 executes the program P stored in the auxiliary storage 33. The program P inside the auxiliary storage 33 may be one that is installed in the controller 3 in advance or may be one that is sent from the removable medium M to the auxiliary storage 33 through the reader 34 or may be one that is sent from an external device such as the host computer HC to the auxiliary storage 33 through the communication unit 35.

Each of the auxiliary storage 33 and the removable medium M is a nonvolatile memory, with which stored contents are held even if electrical power is not supplied. The auxiliary storage 33 is, for example, a magnetic storage, such as a hard disk drive, etc. The removable medium M is, for example, an optical disk, such as a compact disk, etc., or a semiconductor memory, such as a memory card, etc. The removable medium M is an example of a computer readable storage medium storing the program P.

The controller 3 includes the rotation angle controller 38 that controls a rotation angle of the spin motor 12. If the spin motor 12 is a stepping motor, the rotation angle controller 38 adjusts a number of driving pulses supplied to the spin motor 12 to stop the spin base 10 at an arbitrary rotation angle. If the spin motor 12 is a rotary motor other than a stepping motor, the rotation angle of the spin motor 12 is detected by a rotation angle sensor, such as an encoder, etc. The rotation angle controller 38 adjusts an energization time of supplying electric power to the spin motor 12, etc., based on a detection value of the rotation angle sensor to stop the spin base 10 at an arbitrary rotation angle.

The controller 3 controls the substrate processing apparatus 1 such that the substrate W is processed in accordance with a recipe designated by the host computer HC. The auxiliary storage 33 stores a plurality of recipes. Each recipe is information specifying processing contents, processing conditions, and processing procedures for the substrate W. The plurality of recipes differ from each other in at least one of the processing contents, the processing conditions, and the processing procedures for the substrate W. The following respective steps are executed by the controller 3 controlling the substrate processing apparatus 1. In other words, the controller 3 is programmed to execute the following respective steps.

Next, an example of processing of the substrate W will be described.

Figure 3:
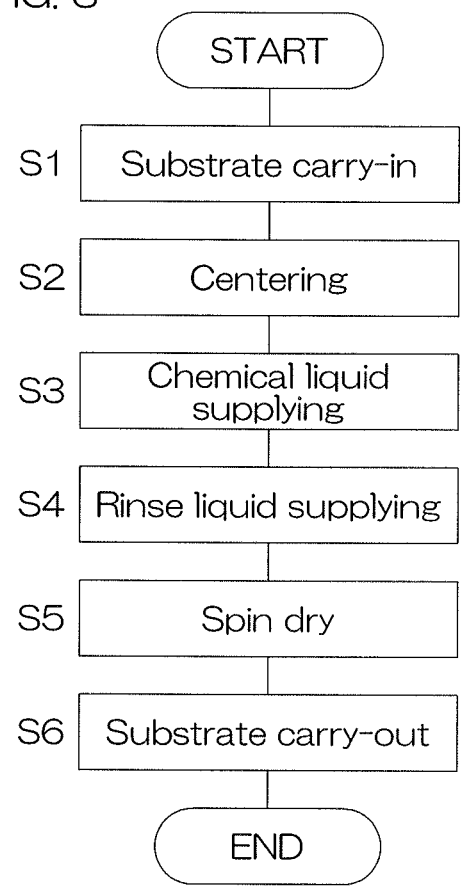
FIG. 3 is a process flowchart for describing an example of processing of a substrate performed by the substrate processing apparatus.

FIG. 3 is a process flowchart for describing an example of processing of the substrate W performed by the substrate processing apparatus 1. In the following description, reference is made to FIGS. 1 and 3.

An example of processing of the substrate W is bevel processing, with which the chemical liquid is supplied just to a bevel region of the substrate W. The bevel region is an annular region that includes a bevel portion (inclined portion) positioned at an upper surface outer peripheral portion of the substrate W. An inner peripheral edge of the bevel region mostly matches a liquid landing position of the chemical liquid. A width of the bevel region (distance in a radial direction from an outer peripheral edge of the substrate W to the inner peripheral edge of the bevel region) is shorter than a distance in the radial direction from a center C1 of the substrate W to the inner peripheral edge of the bevel region. The width of the bevel region may be approximately several millimeters to several dozen millimeters or may be not more than 1 millimeter.

When the substrate W is to be processed by the substrate processing apparatus 1, a carry-in step (step S1 shown in FIG. 3) of carrying the substrate W into the chamber 4 is performed.

Specifically, in a state where the chemical liquid nozzle 22 is retreated from above the spin chuck 9 and the guard 20 is positioned at the lower position, the transfer robot R1 makes a hand H1 enter inside the chamber 4 while supporting the substrate W with the hand H1. Thereafter, the transfer robot R1 places the substrate W, on the hand H1, on the spin base 10 in a state where a front surface of the substrate W is faced upward and makes the hand H1 retreat from the interior of the chamber 4. Thereafter, a centering processing (step S2 shown in FIG. 3) of making the center C1 of the substrate W be disposed on or at a vicinity of the rotational axis A1 is performed. The centering processing will be described later.

After the centering processing is performed, a chemical liquid supplying step (step S3 shown in FIG. 3) of supplying the chemical liquid to the substrate W is performed.

Specifically, if the substrate W is not suctioned onto the spin base 10, the suction valve 15 is opened and the substrate W is fixed to the spin base 10. In this state, the spin motor 12 starts rotation of the substrate W. Further, the nozzle moving unit 25 moves the chemical liquid nozzle 22 to the processing position and the guard raising/lowering unit 21 positions the guard 20 at the upper position. Thereby, the chemical liquid nozzle 22 is disposed above an outer peripheral portion of the substrate W and the upper end 20x of the guard 20 is disposed higher than the substrate W.

Thereafter, the chemical liquid valve 24 is opened and the chemical liquid nozzle 22 starts discharge of the chemical liquid. When the chemical liquid nozzle 22 is discharging the chemical liquid, the nozzle moving unit 25 may move the chemical liquid nozzle 22 such that the liquid landing position of the chemical liquid moves in a radial direction within the bevel region or may keep the chemical liquid nozzle 22 still. Also, to promote reaction of the chemical liquid and the substrate W, the heater 30 may heat the substrate W and the chemical liquid on the substrate W at least in a portion of a period in which the chemical liquid nozzle 22 discharges the chemical liquid.

The chemical liquid discharged from the chemical liquid nozzle 22 lands on the bevel region of the substrate W and thereafter flows outward along the bevel region. Thereby, the chemical liquid is supplied just to the bevel region and the bevel region is processed by the chemical liquid. In particular, if the nozzle moving unit 25 moves the liquid landing position of the chemical liquid within the bevel region, the bevel region is scanned by the liquid landing position of the chemical liquid and therefore the chemical liquid is supplied uniformly to the bevel region. When a predetermined time elapses from when the chemical liquid valve 24 is opened, the chemical liquid valve 24 is closed and the discharge of the chemical liquid from the chemical liquid nozzle 22 is stopped. Thereafter, the nozzle moving unit 25 moves the chemical liquid nozzle 22 to the standby position.

Next, a rinse liquid supplying step of supplying pure water, which is an example of the rinse liquid, to the upper surface of the substrate W is performed (step S4 shown in FIG. 3).

Specifically, the nozzle moving unit 29 moves the rinse liquid nozzle 26 to the processing position. Thereby, the rinse liquid nozzle 26 is disposed above the outer peripheral portion of the substrate W. Thereafter, the rinse liquid valve 28 is opened and the rinse liquid nozzle 26 starts discharge of the pure water. When the rinse liquid nozzle 26 is discharging the pure water, the nozzle moving unit 29 may move the rinse liquid nozzle 26 such that the liquid landing position of the pure water moves in a radial direction within the bevel region or may keep the rinse liquid nozzle 26 still. Also, to promote reaction of the pure water and the substrate W, the heater 30 may heat the substrate W and the pure water on the substrate W at least in a portion of a period in which the rinse liquid nozzle 26 discharges the pure water.

The pure water discharged from the rinse liquid nozzle 26 lands on the bevel region of the substrate W and thereafter flows outward along the bevel region. Thereby, the pure water is supplied just to the bevel region and the chemical liquid on the bevel region is rinsed off. In particular, if the nozzle moving unit 29 moves the liquid landing position of the pure water within the bevel region, the bevel region is scanned by the liquid landing position of the pure water and therefore the pure water is supplied uniformly to the bevel region. When a predetermined time elapses from when the rinse liquid valve 28 is opened, the rinse liquid valve 28 is closed and the discharge of the pure water from the rinse liquid nozzle 26 is stopped. Thereafter, the nozzle moving unit 29 moves the rinse liquid nozzle 26 to the standby position.

Next, a drying step of drying the substrate W by high-speed rotation of the substrate W is performed (step S5 shown in FIG. 3).

Specifically, the spin motor 12 accelerates the substrate W in a rotation direction and rotates the substrate W at a high rotational speed (of, for example, several thousand rpm) greater than the rotational speed of the substrate W up to then. Liquid is thereby removed from the substrate W and the substrate W is dried. When a predetermined time elapses from when the high-speed rotation of the substrate W is started, the spin motor 12 stops rotating. The rotation of the substrate W is thereby stopped.

Next, a carry-out step of carrying the substrate W out from the chamber 4 is performed (step S6 shown in FIG. 3).

Specifically, the guard raising/lowering unit 21 lowers the guard 20 to the lower position. Thereafter, the transfer robot R1 makes the hand H1 enter inside the chamber 4. After the suction valve 15 is closed and the holding of the substrate W with respect to the spin base 10 is released, the transfer robot R1 supports the substrate W, on the spin base 10, with the hand H1. Thereafter, while supporting the substrate W with the hand H1, the transfer robot R1 makes the hand H1 retreat from the interior of the chamber 4. The processed substrate W is thereby carried out from the chamber 4.

A centering system of the substrate processing apparatus 1 will now be described.

Figure 4:
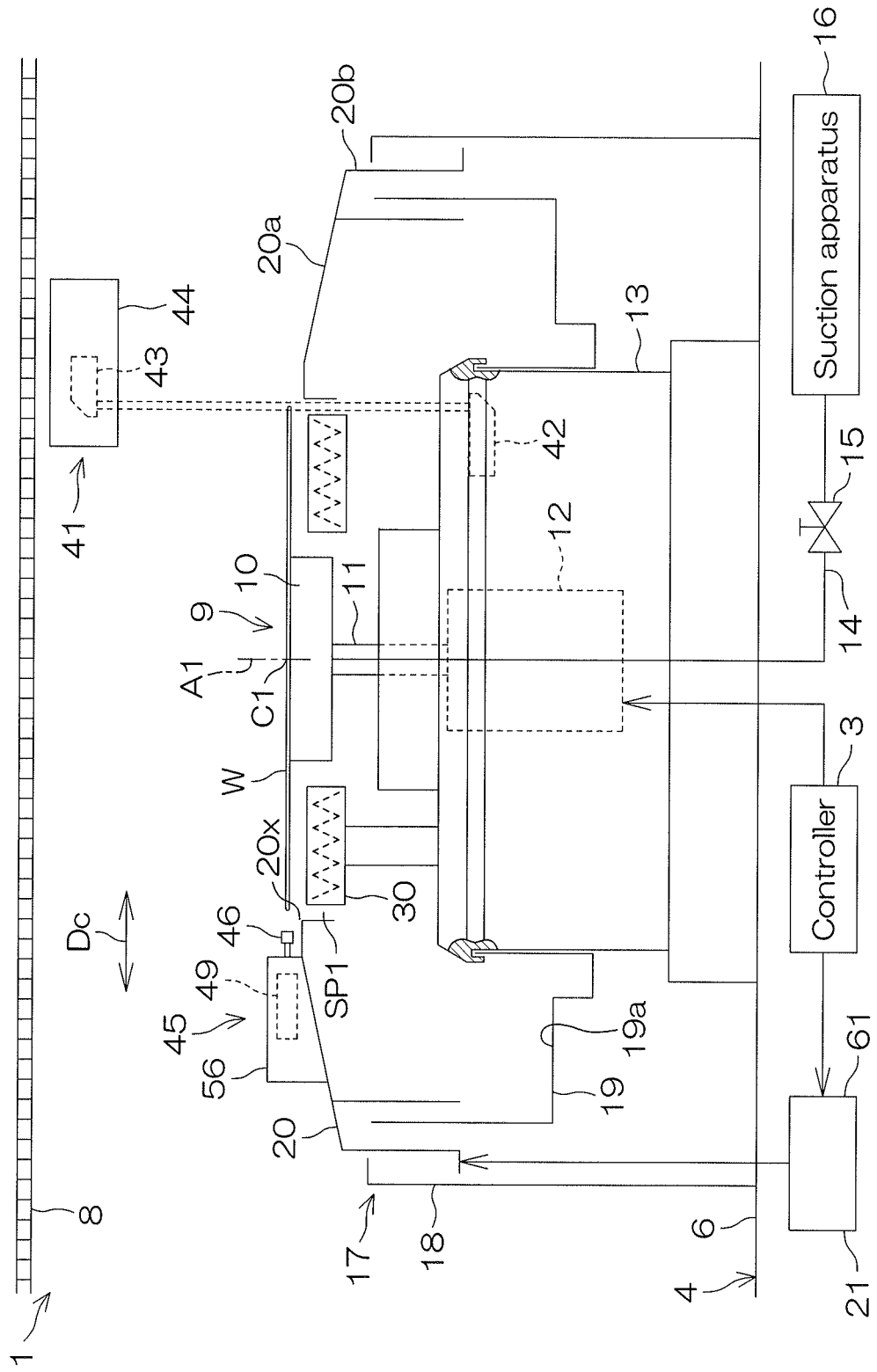
FIG. 4 is a schematic horizontal view of a centering system that decreases eccentricity of the substrate with respect to a rotation center of the substrate.
Figure 5:
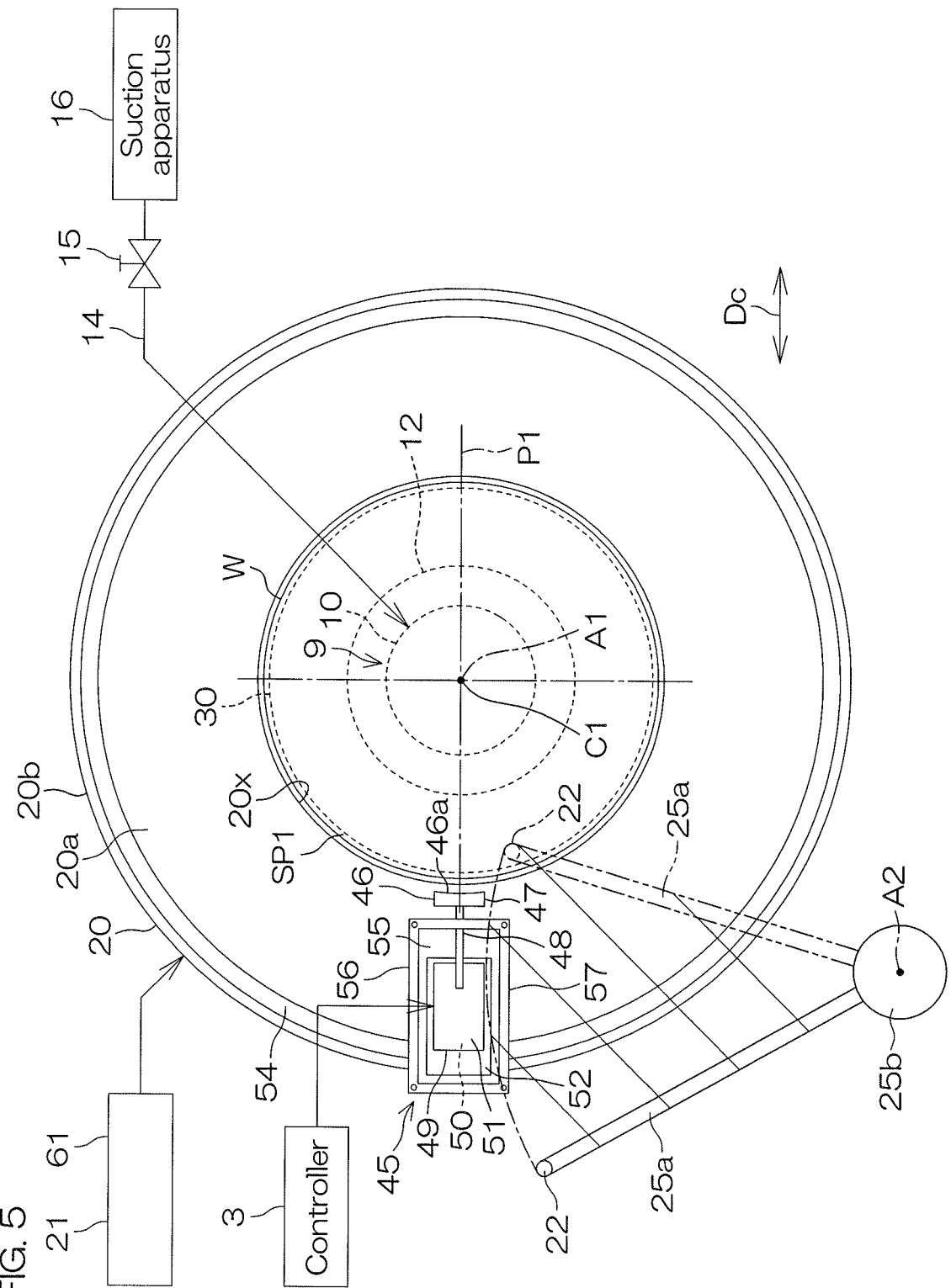
FIG. 5 is a schematic top view of a centering unit included in the centering system.
Figure 6A:
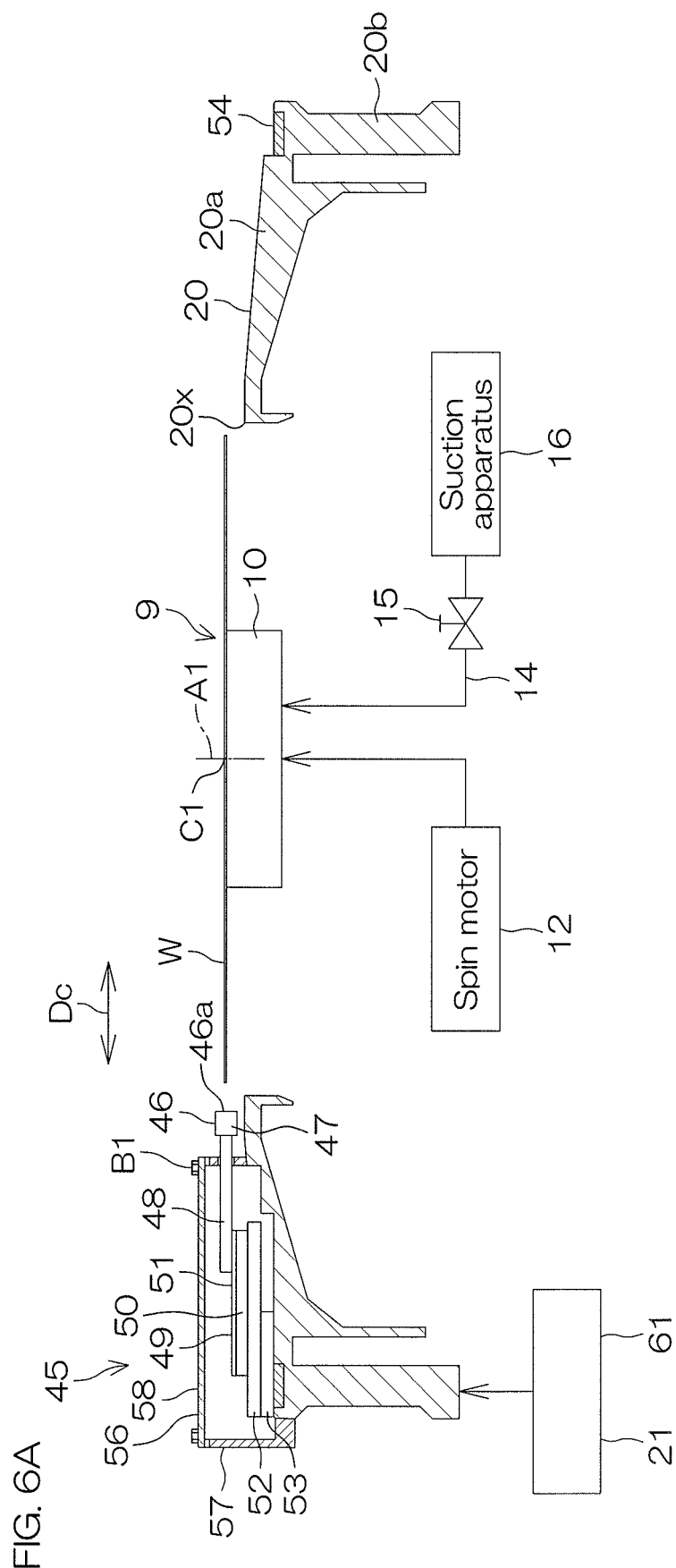
FIG. 6A is a schematic vertical sectional view of the centering unit.

FIG. 4 is a schematic horizontal view of the centering system that decreases eccentricity of the substrate W with respect to a rotation center of the substrate W. FIG. 5 is a schematic top view of a centering unit 45 included in the centering system. FIG. 6A is a schematic vertical sectional view of the centering unit 45. FIG. 6B is a partially enlarged view of FIG. 6A. FIG. 4, FIG. 5, FIG. 6A, and FIG. 6B show a state in which a pusher 46 is disposed at an origin position.

As shown in FIG. 4, the substrate processing apparatus 1 includes the centering system that decreases the eccentricity of the substrate W with respect to the rotational axis A1, that is, a shortest distance from the rotational axis A1 to the center C1 of the substrate W. The centering system includes an eccentricity detector 41 that detects the eccentricity of the substrate W on the spin base 10 without contacting the substrate W on the spin base 10.

The eccentricity detector 41 may be an outer periphery detector that detects the eccentricity of the substrate W by detecting just a position of the outer peripheral edge of the substrate W, or may be a photographing unit that detects the eccentricity of the substrate W based on an image of the substrate W positioned on the spin base 10. Also, the eccentricity detector 41 may detect a position with respect to the rotational axis A1 (angle around the rotational axis A1) of the center C1 of the substrate W in addition to the eccentricity of the substrate W with respect to the rotational axis A1. FIG. 4 shows an example where the eccentricity detector 41 is an outer periphery detector and detects both the eccentricity of the substrate W and the position of the center C1 of the substrate W.

The eccentricity detector 41 includes a light emitter 42, emitting light toward the outer peripheral portion of the substrate W on the spin base 10, and a light receiver 43, receiving light radiated from the light emitter 42. One of the light emitter 42 and the light receiver 43 is disposed above the support position and the other of the light emitter 42 and the light receiver 43 is disposed below the support position. FIG. 4 shows an example where the light emitter 42 is disposed below the support position and the light receiver 43 is disposed above the support position.

The light emitter 42 is disposed inside the motor housing 13 of the spin chuck 9. The light emitter 42 includes a light emitting portion that includes a light source. The light emitting portion of the light emitter 42 is disposed below a transmission hole penetrating through the motor housing 13 in the up/down direction. The transmission hole of the motor housing 13 is covered by a transparent member that transmits the light of the light emitting portion. The light of the light emitter 42 is radiated out of the motor housing 13 through the transparent member.

The light receiver 43 is disposed inside a sensor housing 44, which is disposed inside the chamber 4. The light receiver 43 includes a light receiving portion that receives the light of the light emitting portion. The light receiving portion of the light receiver 43 is disposed above a transmission hole penetrating through the sensor housing 44 in the up/down direction. The transmitting hole of the sensor housing 44 is closed by a transparent member that transmits the light of the light emitting portion. The light of the light emitter 42 enters inside the sensor housing 44 through the transparent member and is irradiated on the light receiving portion.

If the substrate W is not on the spin base 10, the light of the light emitter 42 passes in the up/down direction through an annular space SP1 (see FIG. 5), defined between an inner peripheral surface of the upper end 20x of the guard 20 and an outer peripheral surface of the heater 30 when the guard 20 and the heater 30 are viewed from above, and reaches the light receiver 43 without being blocked by the guard 20 and the heater 30. If the substrate W is on the spin base 10, a portion of the light irradiated from the light emitter 42 is blocked by the outer peripheral portion of the substrate W. The controller 3 can thus detect whether or not the substrate W is on the spin base 10 based on a detection value of the light receiver 43.

If the substrate W on the spin base 10 is not eccentric with respect to the rotational axis A1, a width of the light made incident on the light receiver 43 does not change even when the substrate W is rotated. If the substrate W is eccentric with respect to the rotational axis A1, the width of the light made incident on the light receiver 43 changes when the substrate W is rotated. Therefore, by making the substrate W rotate by 360 degrees or an angle close thereto while making light be radiated from the light emitter 42, the controller 3 can detect the eccentricity of the substrate W with respect to the rotational axis A1 and the position of the center C1 of the substrate W with respect to the rotational axis A1 based on the detection value of the light receiver 43.

The centering system includes the centering unit 45 that moves the center C1 of the substrate W toward the rotational axis A1 based on a detection value of the eccentricity detector 41. As shown in FIG. 4, the centering unit 45 is disposed between the rectifying plate 8 and the guard 20. The nozzle arm 25a (see FIG. 1) holding the chemical liquid nozzle 22 is disposed higher than the centering unit 45. As shown in FIG. 5, the centering unit 45 is disposed lower than a passing region (hatched region), through which the chemical liquid nozzle 22 and the nozzle arm 25a pass. A unit housing 56 to be described below is disposed lower than the passing region and overlaps with the passing region in plan view.

As shown in FIG. 6A, the centering unit 45 includes the pusher 46 that contacts the substrate W on the spin base 10, and a linear motor 49 that moves the pusher 46 horizontally. The centering unit 45 further includes a main base 52, supporting the linear motor 49, a base ring 54, supporting the main base 52, and a spacer 53, interposed between the main base 52 and the base ring 54.

The pusher 46 is supported by the linear motor 49. The linear motor 49 is disposed on the main base 52. The main base 52 is disposed between the linear motor 49 and the guard 20. The main base 52 is supported by the base ring 54 via the spacer 53. The main base 52 is fixed to the base ring 54. As shown in FIG. 5, the base ring 54 has an annular shape surrounding the rotational axis A1 in plan view. At least a portion of the base ring 54 is disposed above the guard 20 and overlaps with the guard 20 in plan view.

The linear motor 49 is an example of a centering actuator that moves the pusher 46, which is an example of a contacting portion, horizontally to move the substrate W horizontally with respect to the spin chuck 9. As shown in FIG. 6A, the linear motor 49 includes a fixed member 50, fixed to the main base 52, a movable member 51, movable with respect to the fixed member 50, a permanent magnet, moving together with the movable member 51, and an electromagnet, forming a magnetic field that moves the movable member 51 together with the permanent magnet.

The movable member 51 is disposed above the fixed member 50. The permanent magnet and the electromagnet are disposed between the fixed member 50 and the movable member 51. The pusher 46 is mounted to the movable member 51. The pusher 46 moves together with the movable member 51 with respect to the fixed member 50. A movement direction of the pusher 46 and the movable member 51 is a horizontal direction parallel to a reference plane P1 (see FIG. 5) that is a vertical plane passing through the rotational axis A1. The movement direction of the pusher 46 and the movable member 51 is the same direction as a centering direction Dc (right-left direction in FIG. 6A) that is the direction in which the substrate W moves in a centering step to be described below.

The linear motor 49 moves the movable member 51 horizontally with respect to the fixed member 50 to rectilinearly move the pusher 46 in a radial direction of the substrate W (a direction orthogonal to the rotational axis A1) between the origin position and an end position. The origin position and the end position are positions at respective ends of a rectilinear path through which the pusher 46 passes. The origin position and the end position are fixed positions. The controller 3 controls the linear motor 49 to make the pusher 46 stand still at an arbitrary position from the origin position to the end position.

The origin position is a position that is further outward than the end position, that is, at an opposite side from the rotational axis A1 of the substrate W. The origin position is a position at which an inner end of the pusher 46 is disposed further outward than the upper end 20x of the guard 20. The end position is a position at which the inner end of the pusher 46 is disposed further inward than the upper end 20x of the guard 20. The end position is set such that no matter by what eccentricity the substrate W on the spin base 10 is eccentric with respect to the rotational axis A1, the pusher 46 contacts the substrate W.

The pusher 46 is an example of the contacting portion that contacts the substrate W on the spin base 10. As shown in FIG. 5 and FIG. 6A, the pusher 46 includes a hand portion 47, contacting the substrate W on the spin base 10, and an arm portion 48, extending outward from the hand portion 47. The hand portion 47 is supported by the linear motor 49 via the arm portion 48. The hand portion 47 and the arm portion 48 are disposed higher than the upper end 20x of the guard 20. The hand portion 47 may include a contacting surface 46a that contacts the substrate W or may include two contacting projections that contact the substrate W. FIG. 5 shows an example where the hand portion 47 is provided with the contacting surface 46a.

A horizontal cross section of the contacting surface 46a of the pusher 46 may be a V shape that is open toward the substrate W or may be a circular arc that is open toward the substrate W and has a radius of curvature smaller than the substrate W or a shape other than the above. If the contacting surface 46a is a V shape or a circular arc, respective ends of the contacting surface 46a are respectively disposed at two positions that are symmetrical in relation to the reference plane P1. Similarly, if the hand portion 47 is provided with two contacting projections instead of the contacting surface 46a, the two contacting projections are respectively disposed at two positions that are symmetrical in relation to the reference plane P1. The pusher 46 thus contacts the substrate W at two positions that are symmetrical in relation to the reference plane P1.

As shown in FIG. 6B, the centering system includes the unit housing 56 that forms, together with the guard 20, a housing chamber 55 that houses the centering unit 45. The linear motor 49 is housed in the unit housing 56. The unit housing 56 includes a case 57, surrounding the linear motor 49, and a lid 58, disposed above the linear motor 49. The case 57 forms a peripheral wall of the housing chamber 55 and the lid 58 forms an upper wall of the housing chamber 55. The guard 20 forms at least a portion of a bottom of the housing chamber 55.

The case 57 is fixed to the guard 20. An opening portion provided at an upper end portion of the case 57 is closed by the lid 58. A gap between the case 57 and the lid 58 is sealed by a sealing member SL1. The lid 58 is detachably mounted to the case 57 by a plurality of bolts B1. By removing the bolts B1, the lid 58 can be removed from the case 57 to access an interior of the case 57. Maintenance and replacement of components of the centering unit 45 are therefore easy.

The arm portion 48 of the pusher 46 is inserted in an insertion hole 56a, penetrating through the case 57 in the movement direction of the pusher 46. The hand portion 47 of the pusher 46 is disposed outside the unit housing 56. Similarly, a cylindrical bellows 59 surrounding the arm portion 48 is disposed outside the unit housing 56. One end portion of the bellows 59 is fixed to the pusher 46 and another end portion of the bellows 59 is fixed to the case 57. The bellows 59 elongates and contracts in the movement direction of the pusher 46 in accompaniment with the movement of the pusher 46. Entry of liquid into the unit housing 56 via the insertion hole 56a is prevented by the bellows 59.

As shown in FIG. 5, all or a portion of the linear motor 49 is disposed above the guard 20 and overlaps with the guard 20 in plan view. When the pusher 46 is disposed at the origin position, an entirety of the pusher 46 is disposed above the guard 20 and overlaps with the guard 20 in plan view. In this state, the linear motor 49 and the pusher 46 are disposed at a periphery of the upper end 20x of the guard 20 in plan view and do not overlap with the upper end 20x of the guard 20.

Figure 7:
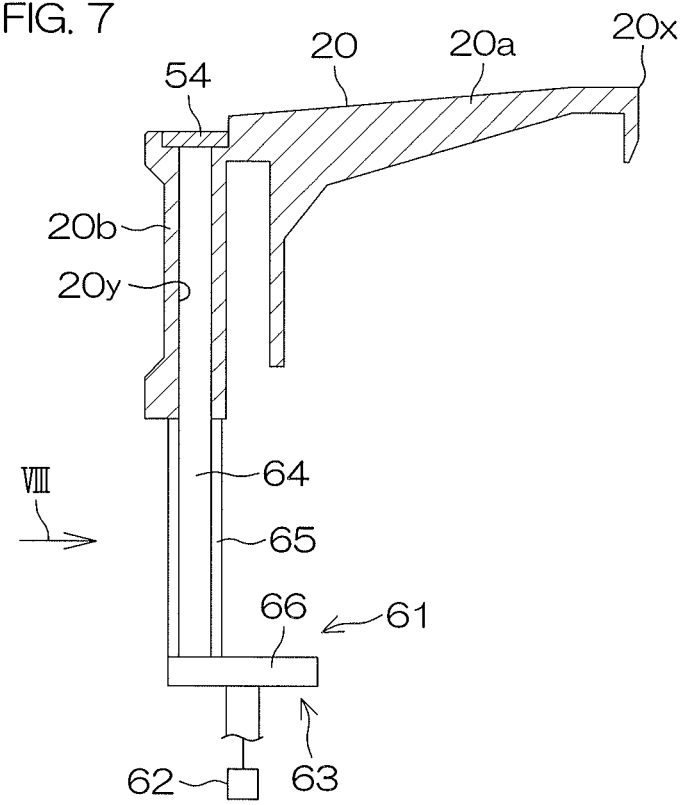
FIG. 7 is a schematic vertical sectional view of a centering raising/lowering unit that raises and lowers the centering unit.
Figure 8:
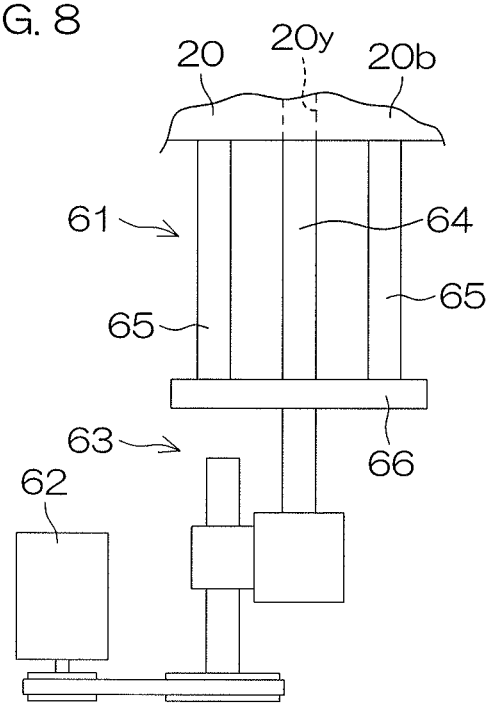
FIG. 8 is a schematic view of the centering raising/lowering unit as viewed in a direction of an arrow VIII shown in FIG. 7.

FIG. 7 is a schematic vertical sectional view of a centering raising/lowering unit 61 that raises and lowers the centering unit 45. FIG. 8 is a schematic view of the centering raising/lowering unit 61 as viewed in a direction of an arrow VIII shown in FIG. 7.

As shown in FIG. 7 and FIG. 8, the centering system includes the centering raising/lowering unit 61 that raises and lowers the centering unit 45, including the pusher 46 and the linear motor 49. The centering raising/lowering unit 61 also serves as the guard raising/lowering unit 21. That is, the centering raising/lowering unit 61 raises and lowers the centering unit 45 and also raises and lowers the guard 20.

As shown in FIG. 8, the centering raising/lowering unit 61 includes a raising/lowering actuator 62, generating motive power to raise and lower the centering unit 45, and a transmission mechanism 63, transmitting the motive power of the raising/lowering actuator 62 to the centering unit 45. The raising/lowering actuator 62 is, for example, a rotary actuator, such as an electric motor, etc. In this case, the transmission mechanism 63 includes a ball screw mechanism that converts rotation transmitted from the raising/lowering actuator 62 to rectilinear motion. The raising/lowering actuator 62 may instead be a linear actuator, such as an air cylinder, etc.

As shown in FIG. 7, the transmission mechanism 63 includes a support column 64, extending downward from the base ring 54, and a raising/lowering base 66, coupled to the support column 64. The transmission mechanism 63 further includes a raising/lowering bracket 65, extending from the guard 20 to the raising/lowering base 66. The support column 64 and the raising/lowering bracket 65 are fixed to the raising/lowering base 66. The support column 64 is inserted in a penetrating hole 20y, penetrating through the guard 20 in the up/down direction. The raising/lowering base 66 is disposed below the guard 20. When the raising/lowering actuator 62 generates motive power, the raising/lowering base 66 moves vertically and the centering unit 45 and the guard 20 move vertically with the direction, speed, and movement amount being the same as the raising/lowering base 66.

The controller 3 controls the raising/lowering actuator 62 to position the centering unit 45 and the guard 20 at an arbitrary height from the upper position to the lower position. When the centering of the substrate W is to be performed, the controller 3 positions the centering unit 45 and the guard 20 at a centering height. Thereby, the pusher 46 faces the outer peripheral surface of the substrate W on the spin base 10 horizontally. As long as it is of such height, the centering height may be the upper position or the lower position or may be a position in between the upper position and the lower position.

Next, an example of centering processing will be described.

The controller 3 conducts each of the following steps by controlling the substrate processing apparatus 1.

Figure 9:
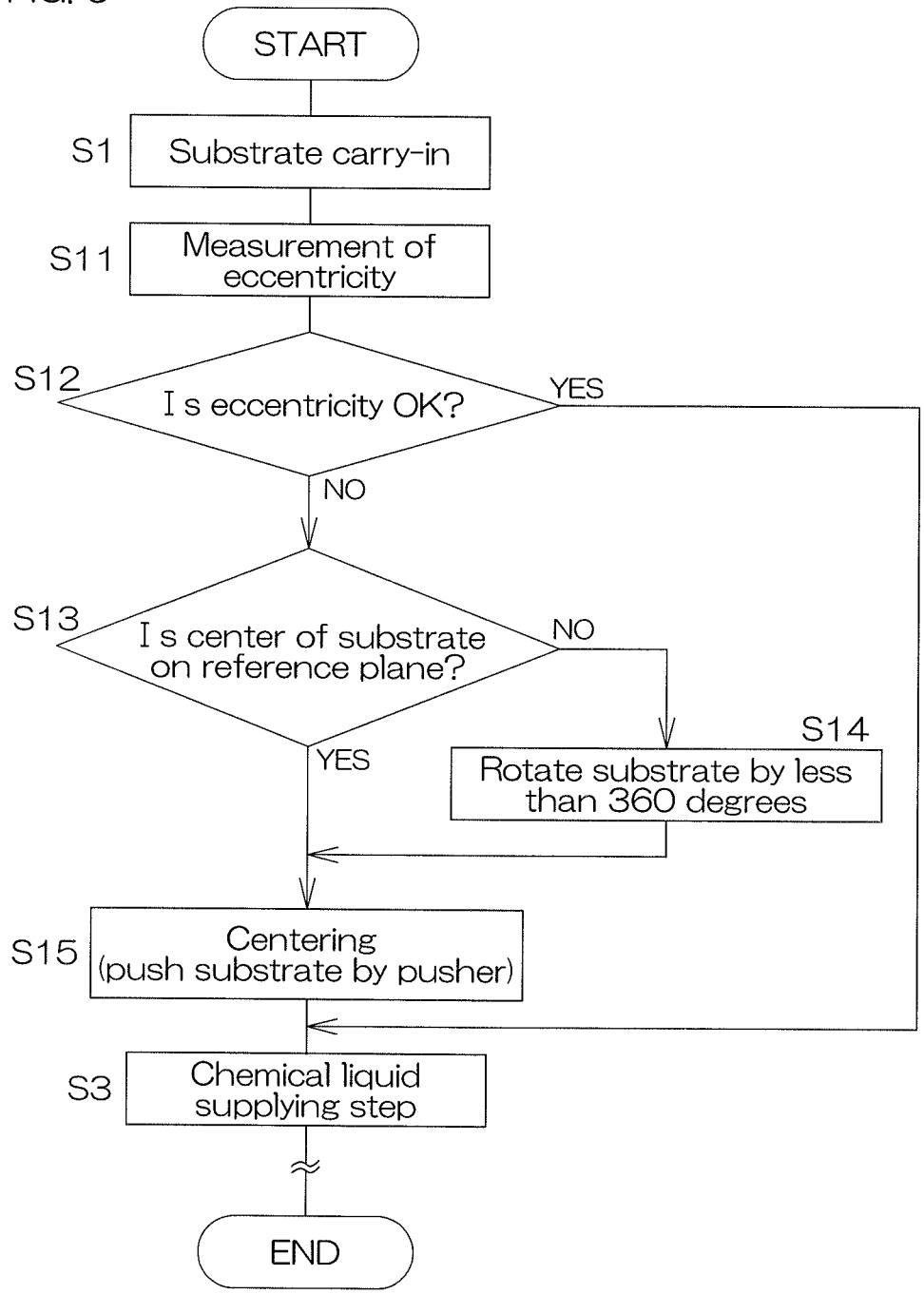
FIG. 9 is a flowchart for describing an example of centering processing performed by the centering system.

FIG. 9 is a flowchart for describing the example of centering processing performed by the centering system. FIG. 10A to FIG. 10D are schematic views of an example of movements of the substrate W and the centering unit 45 when the example of centering processing shown in FIG. 9 is being performed. FIG. 4 and FIG. 9 will be referenced in the following description. FIG. 10A to FIG. 10D will be referenced where appropriate.

When the centering of the substrate W is to be performed, a measuring step of measuring the eccentricity of the substrate W with respect to the rotational axis A1 and the position of the center C1 of the substrate W with respect to the rotational axis A1 is performed (step S11 of FIG. 9).

Specifically, after the substrate W is placed on the spin base 10 in the carry-in step (step S1 of FIG. 9) described above, the controller 3 opens the suction valve 15 to make the substrate W be suctioned onto the spin base 10. Further, the controller 3 makes the light emitter 42 radiate light toward the outer peripheral portion of the substrate W. In this state, the spin motor 12 rotates the substrate W and the spin base 10 by 360 degrees and thereafter makes these stand still on the spot. In this process, the guard 20 and the centering unit 45 may be disposed at any height as long as the pusher 46 does not obstruct the substrate W. The emission of light by the light emitter 42 is stopped after the rotation of the substrate W is stopped.

Figure 10A:
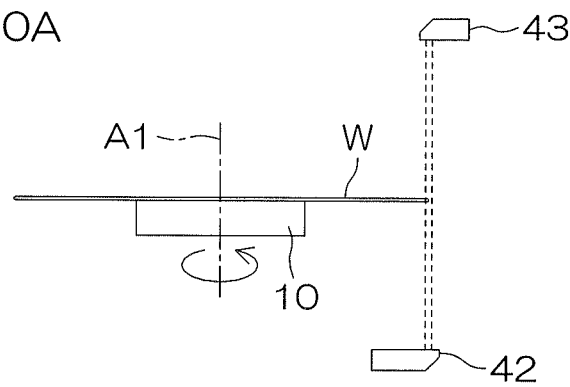
FIG. 10A is a schematic view of an example of movements of the substrate and the centering unit when the example of centering processing shown in FIG. 9 is being performed.

As shown in FIG. 10A, a portion of the light of the light emitter 42 is blocked by the outer peripheral portion of the substrate W on the spin base 10 and the remaining light is made incident on the light receiver 43. When the substrate W is rotated in the state where the light emitter 42 is emitting light, an irradiation position of the light with respect to the substrate W moves in the rotation direction of the substrate W along the outer peripheral portion of the substrate W. If the substrate W is eccentric with respect to the rotational axis A1, the width of the light made incident on the light receiver 43 changes when the substrate W is rotated. Based on the detection value of the light receiver 43, the controller 3 detects the shortest distance from the rotational axis A1 to the center C1 of the substrate W and the position of the center C1 of the substrate W with respect to the rotational axis A1.

After the eccentricity of the substrate W with respect to the rotational axis A1 is detected, an eccentricity judging step of judging whether or not the eccentricity of the substrate W with respect to the rotational axis A1 is within an allowable range is performed (step S12 of FIG. 9). If the eccentricity is within the allowable range (Yes in step S12 of FIG. 9), the above-described chemical liquid supplying step (step S3 of FIG. 9) and steps subsequent thereto are performed without performing the centering step of moving the center C1 of the substrate W toward the rotational axis A1. If the eccentricity is outside the allowable range (No in step S12 of FIG. 9), a position checking step of checking whether or not the substrate W is positioned at a preparation position, at which the substrate W is disposed before the centering step, is performed (step S13 of FIG. 9).

Figure 10B:
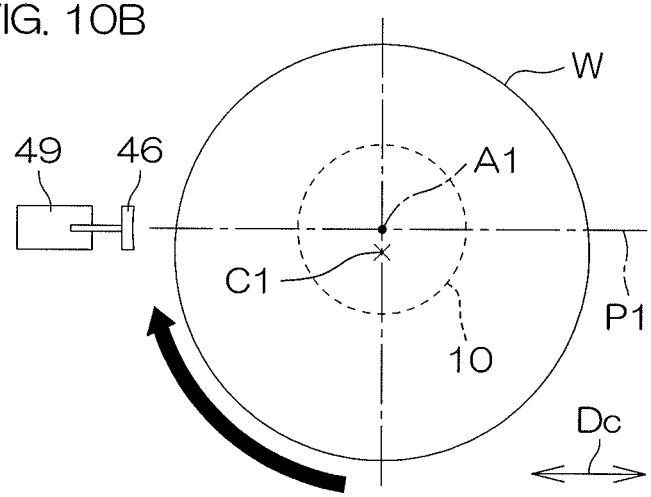
FIG. 10B is a schematic view of an example of movements of the substrate and the centering unit when the example of centering processing shown in FIG. 9 is being performed.

Specifically, after the measuring step is performed, the position of the center C1 of the substrate W with respect to the rotational axis A1 (angle around the rotational axis A1 and shortest distance from the rotational axis A1) is known. Based on the detection value of the light receiver 43, the controller 3 checks whether or not the substrate W is positioned at the preparation position. The preparation position is a rotation angle at which the center C1 of the substrate W overlaps with the reference plane P1 and is positioned between the pusher 46 and the rotational axis A1 of the substrate W in plan view. FIG. 10B shows a state where the center C1 of the substrate W does not overlap with the reference plane P1.

Figure 10C:
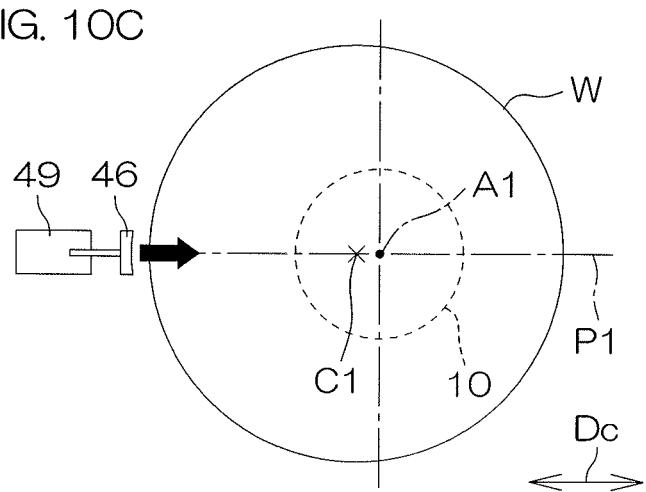
FIG. 10C is a schematic view of an example of movements of the substrate and the centering unit when the example of centering processing shown in FIG. 9 is being performed.

If the substrate W is positioned at the preparation position (Yes in step S13 of FIG. 9), the spin motor 12 does not rotate the substrate W and the spin base 10 but make these stand still on the spot. If the substrate W is not positioned at the preparation position (No in step S13 of FIG. 9), the spin motor 12 rotates the substrate W and the spin base 10 to the preparation position and make these stand still at the preparation position (preparation step; step S14 of FIG. 9). For example, if the substrate W is in the state shown in FIG. 10B, the spin motor 12 rotates the substrate W and the spin base 10 clockwise by 90 degrees. Thereby, the center C1 of the substrate W overlaps with the reference plane P1 and the substrate W is disposed at the preparation position as shown in FIG. 10C.

Next, the centering step of pushing the substrate W horizontally by the pusher 46 to move the center C1 of the substrate W toward the rotational axis A1 is performed (step S15 of FIG. 9).

Specifically, in a state where the substrate W is positioned at the preparation position and the pusher 46 is positioned at the origin position, the centering raising/lowering unit 61, serving in common as the guard raising/lowering unit 21, raises the centering unit 45, together with the guard 20, to the centering height. The centering height is the height at which the pusher 46 is disposed at a height equal to that of the outer peripheral portion of the substrate W positioned on the spin base 10. Therefore, when the centering unit 45 is disposed at the centering height, the pusher 46 faces the outer peripheral portion of the substrate W horizontally.

After the centering unit 45 is disposed at the centering height, the suction valve 15 is closed and the holding of the substrate W with respect to the spin base 10 is released. In this state, the linear motor 49 moves the pusher 46 horizontally from the origin position to a centering position (position shown in FIG. 10D). The centering position is a position at which the eccentricity of the substrate W with respect to the rotational axis A1 is decreased to a value within the allowable range and is set based on the eccentricity of the substrate W measured in the measuring step. That is, if the eccentricity of the substrate W measured in the measuring step differs, the centering position also differs. The centering position may be a position between the origin position and the end position or may be the end position.

Figure 10D:
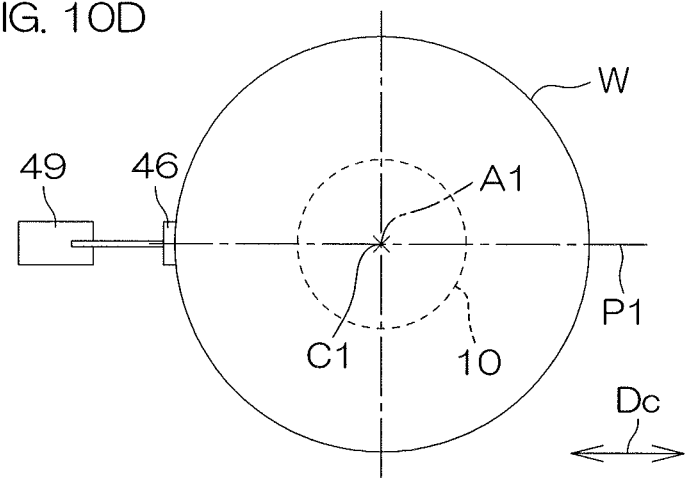
FIG. 10D is a schematic view of an example of movements of the substrate and the centering unit when the example of centering processing shown in FIG. 9 is being performed.

The pusher 46 contacts the outer peripheral surface of the substrate W before reaching the centering position and thereafter pushes the substrate W toward the rotational axis A1. When the pusher 46 is pushing the substrate W, the holding of the substrate W with respect to the spin base 10 is released. The substrate W thus moves horizontally with respect to the spin motor 12 while in a state of contacting the spin base 10. Thereby, the substrate W moves in the centering direction Dc, which is the same direction as the movement direction of the pusher 46, and the center C1 of the substrate W is brought close to the rotational axis A1. As shown in FIG. 10D, when the pusher 46 reaches the centering position, the eccentricity of the substrate W with respect to the rotational axis A1 is decreased to a value within the allowable range.

After the pusher 46 reaches the centering position, the linear motor 49 returns the pusher 46 to the origin position. In this process, the pusher 46 separates from the substrate W. The suction valve 15 is opened after the pusher 46 reaches the centering position. The holding of the substrate W with respect to the spin base 10 is thereby restarted and movement of the substrate W with respect to the spin base 10 is prevented. A state where the substrate W is centered with respect to the rotational axis A1 can thus be maintained.

After the pusher 46 returns to origin position and the holding of the substrate W with respect to the spin base 10 is restarted, the measuring step (return to step S11 of FIG. 9) may be performed or the above-described chemical liquid supplying step (step S3 of FIG. 9) and steps subsequent thereto may be performed without performing the measuring step a second time. If the measuring step is performed again, the chemical liquid supplying step and steps subsequent thereto can be performed in a state where the substrate W is centered reliably.

As described above, with the first preferred embodiment, the linear motor 49, which is an example of the centering actuator, moves the pusher 46, which is an example of the contacting portion, horizontally. Thereby, the substrate W moves horizontally with respect to the spin chuck 9 and the center C1 of the substrate W is brought close to the rotational axis A1 of the substrate W. Thereafter, the chemical liquid nozzle 22 is made to supply the chemical liquid while the spin chuck 9 is made to rotate the substrate W. The centered substrate W can thereby be processed by the chemical liquid. Uniformity of bevel processing, with which just the outer peripheral portion of the substrate W is processed, and full-surface processing, with which the entire upper surface or an entire lower surface of the substrate W is processed, can thus be improved.

The processing liquid supplied to the rotating substrate W scatters outward from the substrate W and is received by the guard 20 surrounding the spin chuck 9. At least a portion of the linear motor 49 is disposed above the guard 20 and overlaps with the guard 20 in plan view. Therefore, in comparison to a case where an entirety of the linear motor 49 is disposed at a periphery of the guard 20 or disposed below the guard 20, the substrate processing apparatus 1 can be made compact. The supplying of the processing liquid and the centering can thereby be performed while suppressing enlargement of the substrate processing apparatus 1.

With the first preferred embodiment, not just at least a portion of the linear motor 49 but at least a portion of the pusher 46 is also disposed above the guard 20 and overlaps with the guard 20 in plan view. Therefore, in comparison to a case where an entirety of the pusher 46 is disposed at the periphery of the guard 20 or disposed below the guard 20, the substrate processing apparatus 1 can be made compact. The supplying of the processing liquid and the centering can thereby be performed while suppressing enlargement of the substrate processing apparatus 1.

With the first preferred embodiment, the pusher 46 moves rectilinearly horizontally and therefore a volume of a space through which the pusher 46 passes can be decreased. Further, a mechanism that converts a rectilinear motion of the linear motor 49 does not have to be provided because the pusher 46 moves rectilinearly when the rectilinear motion of the linear motor 49 is transmitted to the pusher 46. Enlargement of the substrate processing apparatus 1 can thereby be suppressed further. Moreover, the position of the pusher 46 can be controlled with high precision because the pusher 46 is moved by the linear motor 49, which is an example of an electric actuator.

With the first preferred embodiment, the linear motor 49 is housed in the housing chamber 55 defined by the unit housing 56. The linear motor 49 can thus be protected from the processing liquid scattering toward the linear motor 49. Further, not just the unit housing 56 but the guard 20 also defines the housing chamber 55, and the unit housing 56 can thus be made compact in comparison to a case where just the unit housing 56 forms the housing chamber 55.

With the first preferred embodiment, the chemical liquid nozzle 22 that discharges the chemical liquid toward the upper surface of the substrate W held by the spin chuck 9 moves horizontally between the processing position and the standby position. At least one of the unit housing 56, the linear motor 49, and the pusher 46 is disposed below the passing region, through which the chemical liquid nozzle 22 passes, and overlaps with the passing region in plan view. That is, a space below the passing region is used as a space in which the unit housing 56, etc., are disposed. A space inside the substrate processing apparatus 1 can thereby be used efficiently and enlargement of the substrate processing apparatus 1 can thus be suppressed.

With the first preferred embodiment, the pusher 46 of the centering unit 45 is inserted in the insertion hole 56a of the unit housing 56. The bellows 59, which is an example of a sealing member, surrounds the pusher 46 at the inside of the unit housing 56 or at the outside of the unit housing 56. Entry of liquid and atmosphere into the unit housing 56 via the insertion hole 56a is prevented by the bellows 59. Components, such as the linear motor 49, etc., that are disposed inside the unit housing 56 can thereby be prevented from getting wet with the processing liquid and corrosion of the components can be prevented.

With the first preferred embodiment, the centering raising/lowering unit 61 raises and lowers both the guard 20 and the centering unit 45. Therefore, the substrate processing apparatus 1 can be made compact in comparison to a case where the guard raising/lowering unit 21 that raises and lowers the guard 20 and the centering raising/lowering unit 61 that raises and lowers the centering unit 45 are provided. Further, the number of components of the substrate processing apparatus 1 decreases and a manufacturing time of the substrate processing apparatus 1 can thus be shortened.

With the first preferred embodiment, when the raising/lowering actuator 62 of the centering raising/lowering unit 61 raises and lowers the support column 64 of the transmission mechanism 63, the centering unit 45 is raised and lowered in accompaniment. The support column 64 of the centering raising/lowering unit 61 is not disposed at the periphery of the guard 20 but is inserted in the penetrating hole 20y, penetrating through the guard 20 in the up/down direction. Enlargement of the substrate processing apparatus 1 can thus be suppressed in comparison to a case where the support column 64 is disposed at the periphery of the guard 20.

With the first preferred embodiment, the eccentricity of the substrate W with respect to the rotational axis A1, that is, the shortest distance from the rotational axis A1 to the center C1 of the substrate W is detected. Thereafter, the centering unit 45 moves the substrate W horizontally with respect to the spin chuck 9 by the movement amount based on the detection value of the eccentricity detector 41. The substrate W is thereby centered. Further, the eccentricity is detected by non-contact to the substrate W and therefore the substrate W is unlikely to move with respect to the spin chuck 9 during detection or after detection of the eccentricity. The eccentricity of the substrate W can thus be detected with higher precision.

With the first preferred embodiment, the linear motor 49 moves the pusher 46 horizontally in the state where the substrate W is on the spin chuck 9. The pusher 46 thereby contacts the outer peripheral portion of the substrate W on the spin chuck 9 and the substrate W on the spin chuck 9 is pushed horizontally by the pusher 46. Consequently, the substrate W moves horizontally with respect to the spin chuck 9 and the center C1 of the substrate W is brought close to the rotational axis A1. The substrate W is thereby centered.

Second Preferred Embodiment

In the following description, a second preferred embodiment of the present invention will be described with reference to FIG. 11 to FIG. 14E. In FIG. 11 to FIG. 14E, components equivalent to the above described components shown in FIGS. 1 to 10D are designated by the same reference symbols as in FIG. 1, etc., and description thereof is omitted.

Figure 11:
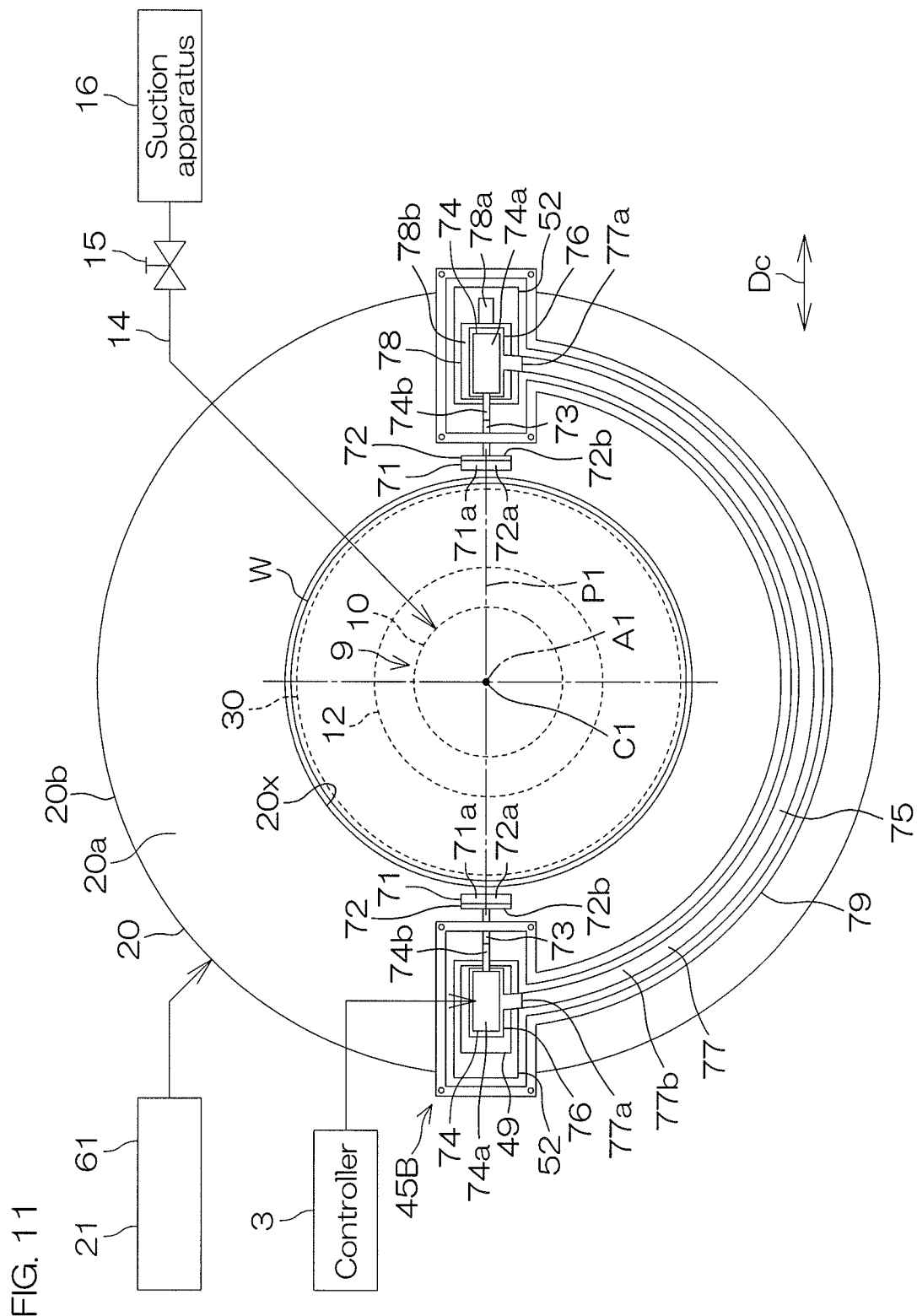
FIG. 11 is a schematic top view of a centering unit included in a centering system according to a second preferred embodiment of the present invention.
Figure 12:
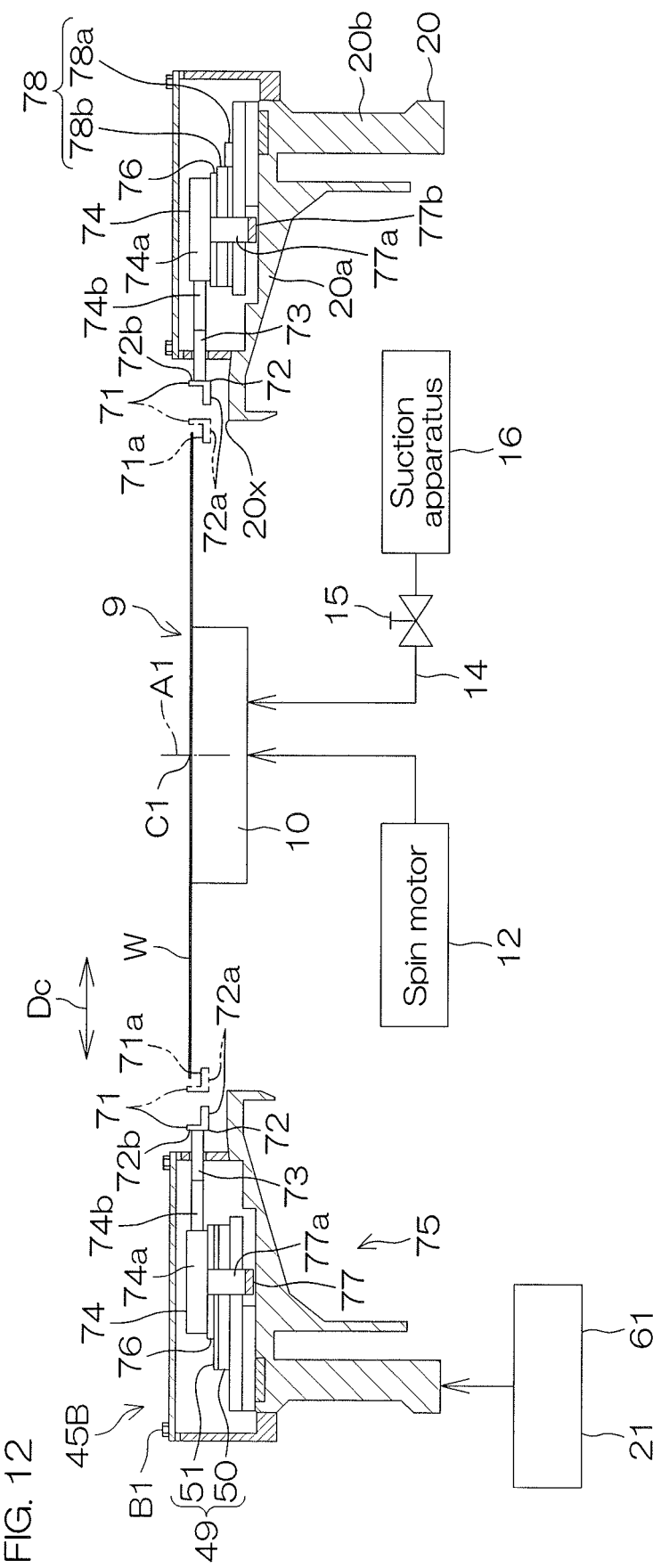
FIG. 12 is a schematic vertical sectional view of the centering unit included in the centering system shown in FIG. 11.

FIG. 11 is a schematic top view of a centering unit 45B included in a centering system according to the second preferred embodiment of the present invention. FIG. 12 is a schematic vertical sectional view of the centering unit 45B included in the centering system shown in FIG. 11. FIG. 11 and FIG. 12 show a state where lifters 71 are disposed at origin positions. Positions of the lifters 71 indicated by alternate long and two short dashed lines in FIG. 12 express end positions of the lifter 71.

As shown in FIG. 12, the centering unit 45B includes two lifters 71 contacting the substrate W on the spin base 10, two air cylinders 74, respectively supporting the two lifters 71 and moving the two lifters 71 individually in the centering direction Dc, and a slide bracket 75, supporting the two air cylinders 74. As will be described below, the two lifters 71 lift the substrate W on the spin base 10 and place the substrate W on the spin base 10. The lifters 71 are an example of contacting portions that contact the substrate W on the spin base 10.

As shown in FIG. 11, the two air cylinders 74 are respectively disposed at two positions differing by 180 degrees in angle around the rotational axis A1. The two air cylinders 74 are disposed at the same height. The two air cylinders 74 face each other horizontally in the centering direction Dc. The spin base 10 is disposed between the two air cylinders 74 in plan view.

Each air cylinder 74 includes a cylinder main body 74a, having an internal space, a piston, partitioning the internal space of the cylinder main body 74a into two chambers separated in an axial direction of the air cylinder 74, and a rod 74b, projecting in the axial direction of the air cylinder 74 from an end surface of the cylinder main body 74a and moving in the axial direction of the air cylinder 74 together with the piston. The cylinder main bodies 74a are fixed to the slide bracket 75. The lifters 71 are mounted to the rods 74b.

The lifters 71 move, together with the rods 74b, in the axial directions of the air cylinders 74 with respect to the cylinder main bodies 74a and the slide brackets 75. The axial directions of the air cylinders 74 match the centering direction Dc. Each air cylinder 74 moves the corresponding lifter 71 rectilinearly in the centering direction Dc between the origin position, at which an inner end of the lifter 71 is disposed further outward than the upper end 20x of the guard 20, and the end position, at which the inner end of the lifter 71 is disposed further inward than the upper end 20x of the guard 20.

As shown in FIG. 12, the two lifters 71 are disposed at the same height. The lifters 71 are disposed higher than the upper end 20x of the guard 20. The two lifters 71 face each other horizontally in the centering direction Dc. Each lifter 71 includes a hand portion 72, contacting the substrate W on the spin base 10, and an arm portion 73, extending outward from the hand portion 72. The hand portions 72 are supported by the air cylinders 74 via the arm portions 73.

As shown in FIG. 12, the hand portions 72 include lower wall portions 72a that overlap with the substrate W in plan view when the lifters 71 are at the end positions (positions of the lifters 71 indicated by the alternate long and two short dashed lines in FIG. 12). In addition to the lower wall portions 72a, the hand portions 72 may include outer wall portions 72b that are disposed at the periphery of the substrate W in plan view when the lifters 71 are positioned at the end positions. FIG. 11 and FIG. 12 show an example where the lifters 71 are provided with both the lower wall portions 72a and the outer wall portions 72b. The end positions of the lifters 71 are set such that the lower wall portions 72a of the lifters 71 overlap with the substrate W in plan view and the outer wall portions 72b of the lifters 71 do not overlap with the substrate W in plan view.

The lower wall portions 72a of the lifters 71 contact the lower surface of the substrate W. Each lower wall portion 72a may include a contacting surface 71a that contacts the substrate W or may include a plurality of contacting projections that contact the substrate W. FIG. 11 and FIG. 12 show an example where the lifters 71 are provided with the contacting surfaces 71a. The contacting surfaces 71a are flat surfaces parallel to the lower surface of the substrate W. Upper ends of the plurality of contacting projections are disposed at the same height. Regardless of which of the contacting surfaces 71a and the plurality of contacting projections the lifters 71 are provided with, the substrate W is supported in a horizontal orientation by the two lifters 71 when the lower wall portions 72a of the two lifters 71 contact the lower surface of the substrate W.

As shown in FIG. 12, the two air cylinders 74 are disposed above the slide bracket 75. The slide bracket 75 includes two base plates 76 disposed below the two air cylinders 74, respectively. The two base plates 76 are fixed respectively to the cylinder main bodies 74a of the two air cylinders 74. The two base plates 76 are disposed at the same height.

As shown in FIG. 11, the slide bracket 75 further includes one or more joint arms 77 coupling the two base plates 76. FIG. 11 shows an example where the number of joint arms 77 is one. The slide bracket 75 may include two joint arms 77, disposed at mutually opposite sides, for the two base plates 76. The joint arm 77 may be of an arcuate shape in plan view having a center positioned on the rotational axis A1 or may be of a shape besides this.

At least a portion of the joint arm 77 may be disposed at a height equal to that of the two base plates 76 or may be disposed at a height differing from that of the two base plates 76. FIG. 12 shows an example where a portion of the joint arm 77 is disposed at a height differing from that of the two base plates 76. In the present example, the joint arm 77 includes two downwardly extending portions 77a, extending downward from the two base plates 76 toward the guard 20, and a coupling portion 77b, coupling lower end portions of the two downwardly extending portions 77a. The coupling portion 77b is disposed closer to the guard 20 than the two base plates 76 in regard to the up/down direction.

As shown in FIG. 12, the centering unit 45B includes the linear motor 49, moving the slide bracket 75 in the centering direction Dc, a linear guide 78, guiding the slide bracket 75 in the centering direction Dc, and two main bases 52, supporting the linear motor 49 and the linear guide 78, respectively. The linear motor 49 is an example of the centering actuator that moves the two lifters 71 that are an example of the contacting portions horizontally to move the substrate W horizontally with respect to the spin chuck 9.

The linear motor 49 includes the fixed member 50 and the movable member 51. The linear guide 78 includes a guide rail 78a, extending in the centering direction Dc, and a slide block 78b, guided in the centering direction Dc by the guide rail 78a. The linear motor 49 is disposed between a base plate 76 and a main base 52 of the slide bracket 75. Similarly, the linear guide 78 is disposed between a base plate 76 and a main base 52 of the slide bracket 75. The two main bases 52 are disposed below the linear motor 49 and the linear guide 78, respectively.

The guide rail 78a of the linear guide 78 and the fixed member 50 of the linear motor 49 are fixed to the two main bases 52, respectively. The slide block 78b of the linear guide 78 and the movable member 51 of the linear motor 49 are fixed to the two base plates 76, respectively. When the linear motor 49 generates a force that moves the movable member 51, the slide bracket 75 moves in the centering direction Dc while being guided by the linear guide 78. In this process, the two air cylinders 74, supported by the slide bracket 75, and the two lifters 71, supported by the two air cylinders 74, move horizontally with the direction, speed, and movement amount being the same as the slide bracket 75.

As shown in FIG. 11, at least a portion of the linear motor 49 is disposed above the guard 20 and overlaps with the guard 20 in plan view. When the movable member 51 of the linear motor 49 and the lifters 71 are disposed at the origin positions, entireties of the lifters 71 are disposed above the guard 20 and overlap with the guard 20 in plan view. In this state, at least a portion of each air cylinder 74 and at least a portion of the slide bracket 75 are disposed above the guard 20 and overlap with the guard 20 in plan view. In addition, the lifters 71, the air cylinders 74, the slide bracket 75, and the linear motor 49 are disposed at a periphery of the upper end 20x of the guard 20 and do not overlap with the upper end 20x of the guard 20 in plan view.

As shown in FIG. 12, the centering system includes two unit housings 56 housing the two air cylinders 74, respectively. The linear motor 49 and the linear guide 78 are housed in the two unit housings 56, respectively. The hand portions 72 of the lifters 71 are disposed outside the unit housings 56. The arm portions 73 of the lifters 71 are inserted in insertion holes 56a of the unit housings 56. Entry of liquid into the unit housings 56 via the insertion holes 56a is prevented by bellows 59 (see FIG. 6B) mounted to the lifters 71 and the unit housings 56.

As shown in FIG. 11, the centering system may include a bracket housing 79 that houses the slide bracket 75. In this case, the bracket housing 79 may cover an entirety of an exposed portion (portion outside the two unit housings 56) of the slide bracket 75 in plan view or may cover just a portion of the exposed portion in plan view. FIG. 11 shows an example where the bracket housing 79 covers the entirety of the exposed portion of the slide bracket 75 in plan view. The bracket housing 79 is mounted to the guard 20 and is raised and lowered together with the guard 20.

As shown in FIG. 12, each main base 52 is supported by the base ring 54 via a spacer 53. Each main base 52 is fixed to the base ring 54. The base ring 54 is disposed at a periphery of the slide bracket 75 in plan view. At least a portion of the base ring 54 is disposed above the guard 20 and overlaps with the guard 20 in plan view. The base ring 54 is fixed in horizontal and vertical directions with respect to the guard 20.

The motive power of the centering raising/lowering unit 61 is transmitted to the base ring 54. When the base ring 54 is raised or lowered, the guard 20 and the main bases 52 move vertically with the direction, speed, and movement amount being the same as the base ring 54. In this process, the plurality of members supported by the two main bases 52, such as the lifters 71, the air cylinders 74, the slide bracket 75, the linear motor 49, and the linear guide 78, etc., also move vertically with the direction, speed, and movement amount being the same as the base ring 54.

When, in a state where the guard 20 is disposed at the lower position and the substrate W is disposed on the spin base 10, each lifter 71 is disposed at the end position, the lower wall portions 72a of the two lifters 71 are disposed below the substrate W. When in this state, the centering raising/lowering unit 61 raises the guard 20 and the centering unit 45B to the upper positions, the substrate W on the spin base 10 is lifted by the two lifters 71 and becomes separated from the spin base 10 (see FIG. 14C).

When, in the state where the two lifters 71 support the substrate W horizontally, the linear motor 49 moves the slide bracket 75 in the centering direction Dc, the substrate W supported by the two lifters 71 moves horizontally with the direction, speed, and movement amount being the same as the slide bracket 75. Thereby, the center C1 of the substrate W moves with respect to the rotational axis A1. The center C1 of the substrate W can thus be brought close to the rotational axis A1 by adjusting the movement amount of the slide bracket 75.

Next, an example of centering processing will be described.

The controller 3 conducts each of the following steps by controlling the substrate processing apparatus 1.

Figure 13:
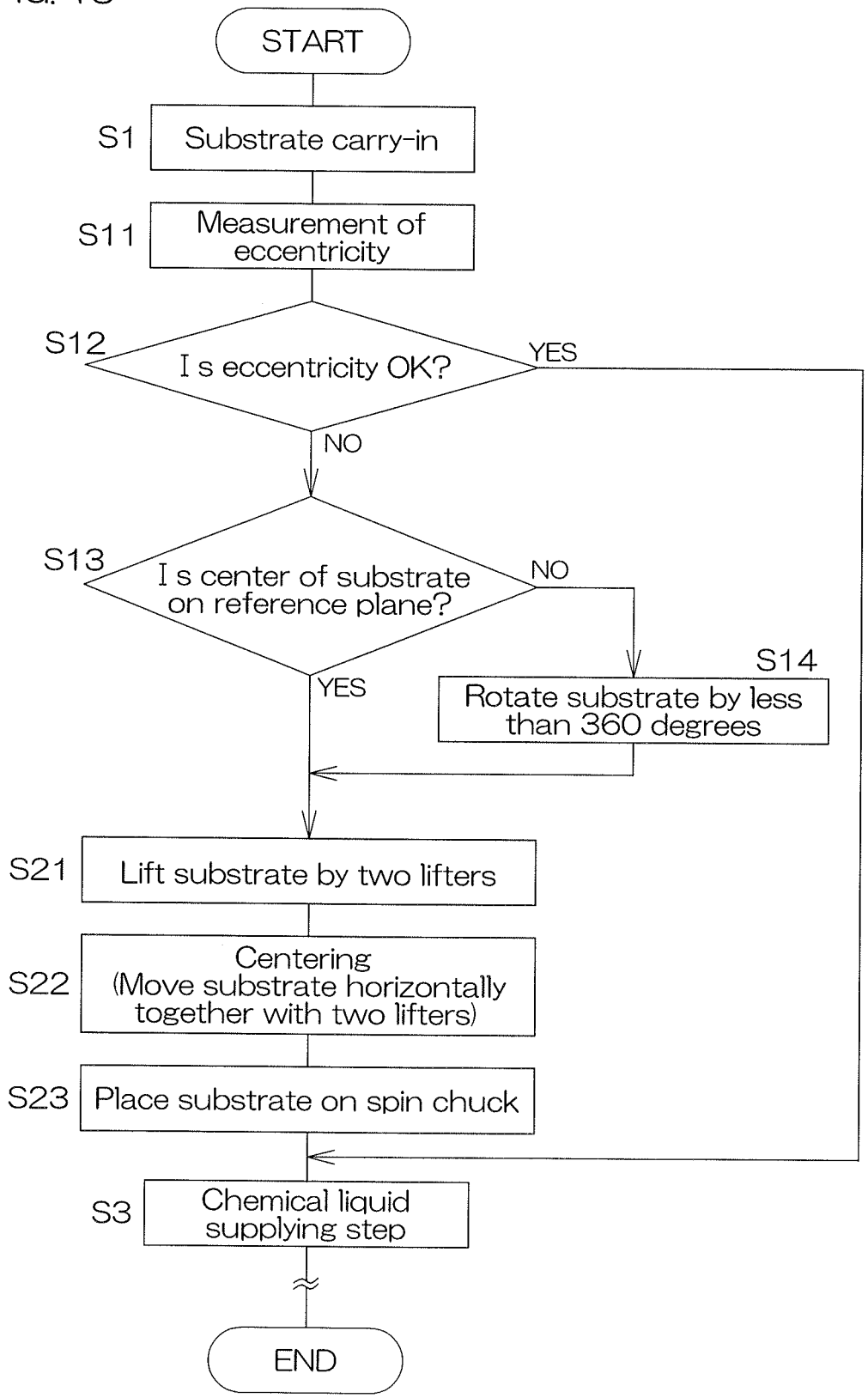
FIG. 13 is a flowchart for describing an example of centering processing performed by the centering system shown in FIG. 11.

FIG. 13 is a flowchart for describing the example of centering processing performed by the centering system shown in FIG. 11. FIG. 14A to FIG. 14E are schematic views of an example of movements of the substrate W and the centering unit 45B when the example of centering processing shown in FIG. 13 is being performed. FIG. 11 to FIG. 13 will be referenced in the following description. FIG. 14A to FIG. 14E will be referenced where appropriate.

As in the first preferred embodiment, when the centering of the substrate W is to be performed, a measuring step of measuring the eccentricity of the substrate W with respect to the rotational axis A1 and the position of the center C1 of the substrate W with respect to the rotational axis A1 is performed (step S11 of FIG. 13). Thereafter, an eccentricity judging step of judging whether or not the eccentricity of the substrate W with respect to the rotational axis A1 is within an allowable range is performed (step S12 of FIG. 13).

If the eccentricity is within the allowable range (Yes in step S12 of FIG. 13), the above-described chemical liquid supplying step (step S3 of FIG. 13) and steps subsequent thereto are performed without performing the centering step of moving the center C1 of the substrate W toward the rotational axis A1. If the eccentricity is outside the allowable range (No in step S12 of FIG. 13), a position checking step of checking whether or not the substrate W is positioned at a preparation position, at which the substrate W is disposed before the centering step, is performed (step S13 of FIG. 13).

Figure 14A:
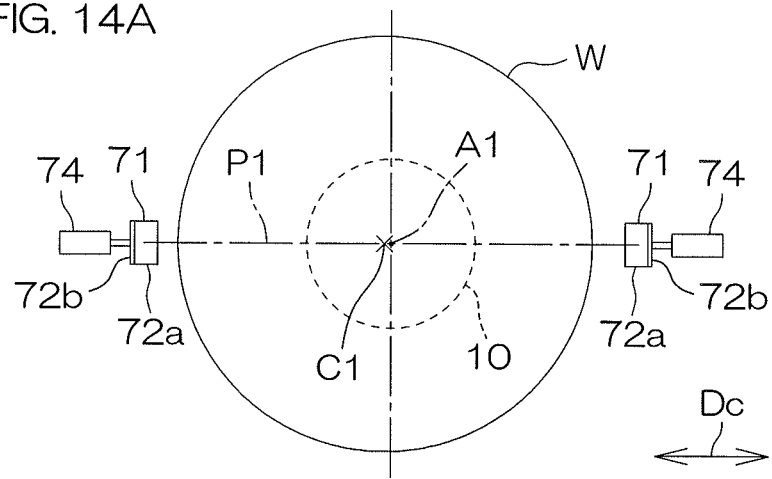
FIG. 14A is a schematic view of an example of movements of the substrate and the centering unit when the example of centering processing shown in FIG. 13 is being performed.

If the substrate W is not positioned at the preparation position (No in step S13 of FIG. 13), the spin motor 12 rotates the substrate W and the spin base 10 to the preparation position and make these stand still at the preparation position (preparation step; step S14 of FIG. 13). FIG. 14A shows a state where the center C1 of the substrate W overlaps with the reference plane P1 and the substrate W is disposed at the preparation position.

Next, a lift-up step of lifting the substrate W on the spin base 10 by the two lifters 71 is performed (step S21 of FIG. 13).

Figure 14B:
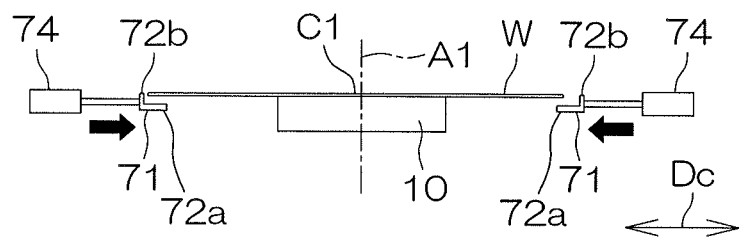
FIG. 14B is a schematic view of an example of movements of the substrate and the centering unit when the example of centering processing shown in FIG. 13 is being performed.

Specifically, in a state where the substrate W is positioned at the preparation position and the two lifters 71 are disposed lower than the substrate W, the two air cylinders 74 move the two lifters 71 from the origin positions to the end positions. Thereby, as shown in FIG. 14B, the lower wall portion 72a of each lifter 71 is disposed below the substrate W while the outer wall portion 72b of each lifter 71 is kept disposed at the periphery of the substrate W. Thereafter, the suction valve 15 is closed and the holding of the substrate W with respect to the spin base 10 is released.

Figure 14C:
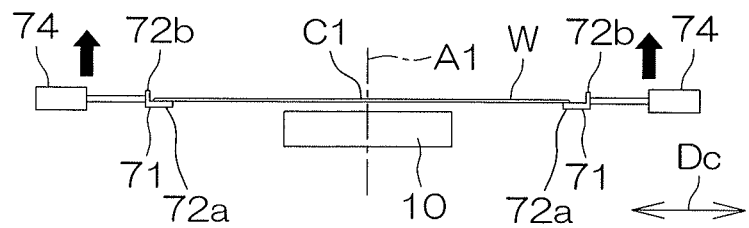
FIG. 14C is a schematic view of an example of movements of the substrate and the centering unit when the example of centering processing shown in FIG. 13 is being performed.

Subsequently, the centering raising/lowering unit 61 raises the guard 20 and the centering unit 45B to a lift-up height. The lift-up height is a height at which the lower wall portion 72a of each lifter 71 is disposed higher than a support position (position at which the substrate W, supported by the spin base 10, is disposed). As the lifters 71 are raised, the lower wall portion 72a of each lifter 71 contacts the lower surface of the substrate W and the spin base 10 separates from the lower surface of the substrate W. As shown in FIG. 14C, when the guard 20 and the centering unit 45B reach the lift-up height, the substrate W is supported horizontally by the two lifters 71 in a state of being separated from the spin base 10. The substrate W is thereby lifted by the two lifters 71.

Next, the centering step of moving the two lifters 71 horizontally to move the center C1 of the substrate W, supported by the two lifters 71, toward the rotational axis A1 is performed (step S22 of FIG. 13).

Figure 14D:
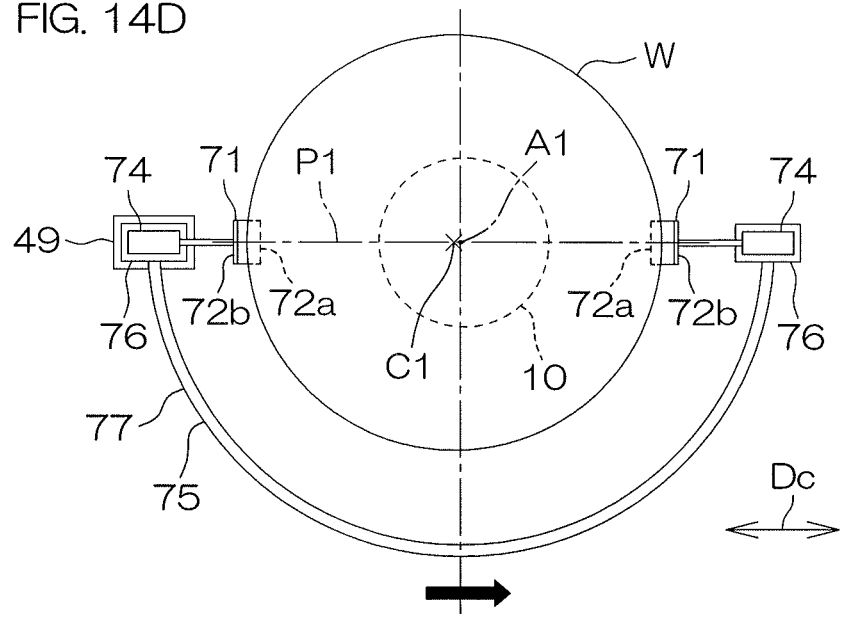
FIG. 14D is a schematic view of an example of movements of the substrate and the centering unit when the example of centering processing shown in FIG. 13 is being performed.

Specifically, as shown in FIG. 14D, after the lifters 71 are disposed at the lift-up height, the linear motor 49 moves the slide bracket 75 from an origin position to a centering position. When the slide bracket 75 moves horizontally, the two air cylinders 74 and the two lifters 71 move horizontally and the substrate W supported by the two lifters 71 also moves horizontally. As the slide bracket 75 is brought close to the centering position, the center C1 of the substrate W is brought close to the rotational axis A1. When the slide bracket 75 reaches the centering position, the eccentricity of the substrate W with respect to the rotational axis A1 is decreased to a value within the allowable range. The substrate W is thereby centered.

Next, a placing step of placing the substrate W, supported by the two lifters 71, on the spin base 10 is performed (step S23 of FIG. 13).

Figure 14E:
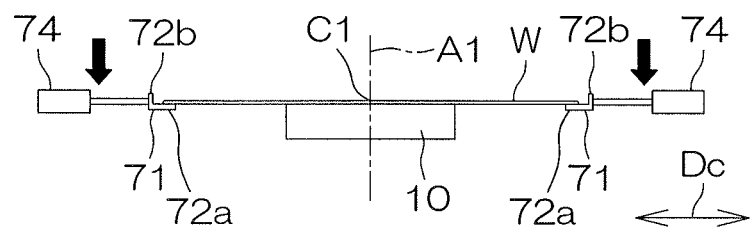
FIG. 14E is a schematic view of an example of movements of the substrate and the centering unit when the example of centering processing shown in FIG. 13 is being performed.

Specifically, after the lifters 71 are disposed at the centering position, the centering raising/lowering unit 61 lowers the guard 20 and the centering unit 45B from the lift-up height to a placing height. The placing height is a height at which the lower wall portions 72a of the lifters 71 are positioned lower than the support positions. As the lifters 71 are lowered, the spin base 10 contacts the lower surface of the substrate W and each lifter 71 separates from the lower surface of the substrate W. As shown in FIG. 14E, when the guard 20 and the centering unit 45B reach the placing height, the substrate W is supported just by the spin base 10. The substrate W is thereby placed on the spin base 10.

The suction valve 15 is opened after the lifters 71 are disposed at the placing height. The holding of the substrate W with respect to the spin base 10 is thereby restarted. After the lifters 71 are disposed at the placing height, the two air cylinders 74 make the two lifters 71 retreat to the origin positions. Similarly, after the lifters 71 are disposed at the placing height, the linear motor 49 moves the slide bracket 75 to the origin position. The inner end of each lifter 71 is thereby disposed further outward than the upper end 20x of the guard 20. After the placing step is performed, the measuring step (return to step S11 of FIG. 13) may be performed or the above-described chemical liquid supplying step (step S3 of FIG. 13) and steps subsequent thereto may be performed without performing the measuring step a second time.

With the second preferred embodiment, the following actions and effects can be exhibited in addition to the actions and effects of the first preferred embodiment.

Specifically, with the second preferred embodiment, the centering raising/lowering unit 61 raises the two lifters 71, which are an example of the contacting portions, in the state where the substrate W is on the spin chuck 9. Thereby, each lifter 71 contacts the lower surface of the substrate W and the substrate W on the spin chuck 9 is lifted by the two lifters 71. Thereafter, the linear motor 49 moves the two lifters 71 horizontally.

In this process, the substrate W moves horizontally together with the two lifters 71 in a state of being supported by the two lifters 71. Consequently, the substrate W moves horizontally with respect to the spin chuck 9 and the center C1 of the substrate W is brought close to the rotational axis A1. The substrate W is thereby centered. Further, the substrate W moves in a state of being separated upward from the spin chuck 9 and therefore the substrate W can be centered without generating friction between the substrate W and the spin chuck 9. In addition, the substrate W does not rub against the spin chuck 9 and therefore the substrate W can be centered with higher precision.

With the second preferred embodiment, the linear motor 49 moves the slide bracket 75 horizontally. In accompaniment with the movement of the slide bracket 75, the two lifters 71, supported by the slide bracket 75, move horizontally with the direction, speed, and movement amount being the same as the slide bracket 75. The substrate W supported by the two lifters 71 can thereby be moved horizontally. Further, the single linear motor 49 moves the two lifters 71 horizontally and therefore two actuators respectively corresponding to the two lifters 71 do not have to be provided.

With the second preferred embodiment, the centering raising/lowering unit 61 also serves as the guard raising/lowering unit 21 that raises and lowers the guard 20. In other words, the guard raising/lowering unit 21 is used to lift the substrate W on the spin chuck 9 by the two lifters 71 and place the substrate W, supported by the two lifters 71, on the spin chuck 9. The substrate processing apparatus 1 can thus be made compact in comparison to a case where the centering raising/lowering unit 61 is a separate unit from the guard raising/lowering unit 21.

Third Preferred Embodiment

In the following description, a third preferred embodiment of the present invention will be described with reference to FIG. 15 to FIG. 19C. In FIG. 15 to FIG. 19C, components equivalent to the above described components shown in FIGS. 1 to 14E are designated by the same reference symbols as in FIG. 1, etc., and description thereof is omitted.

Figure 15:
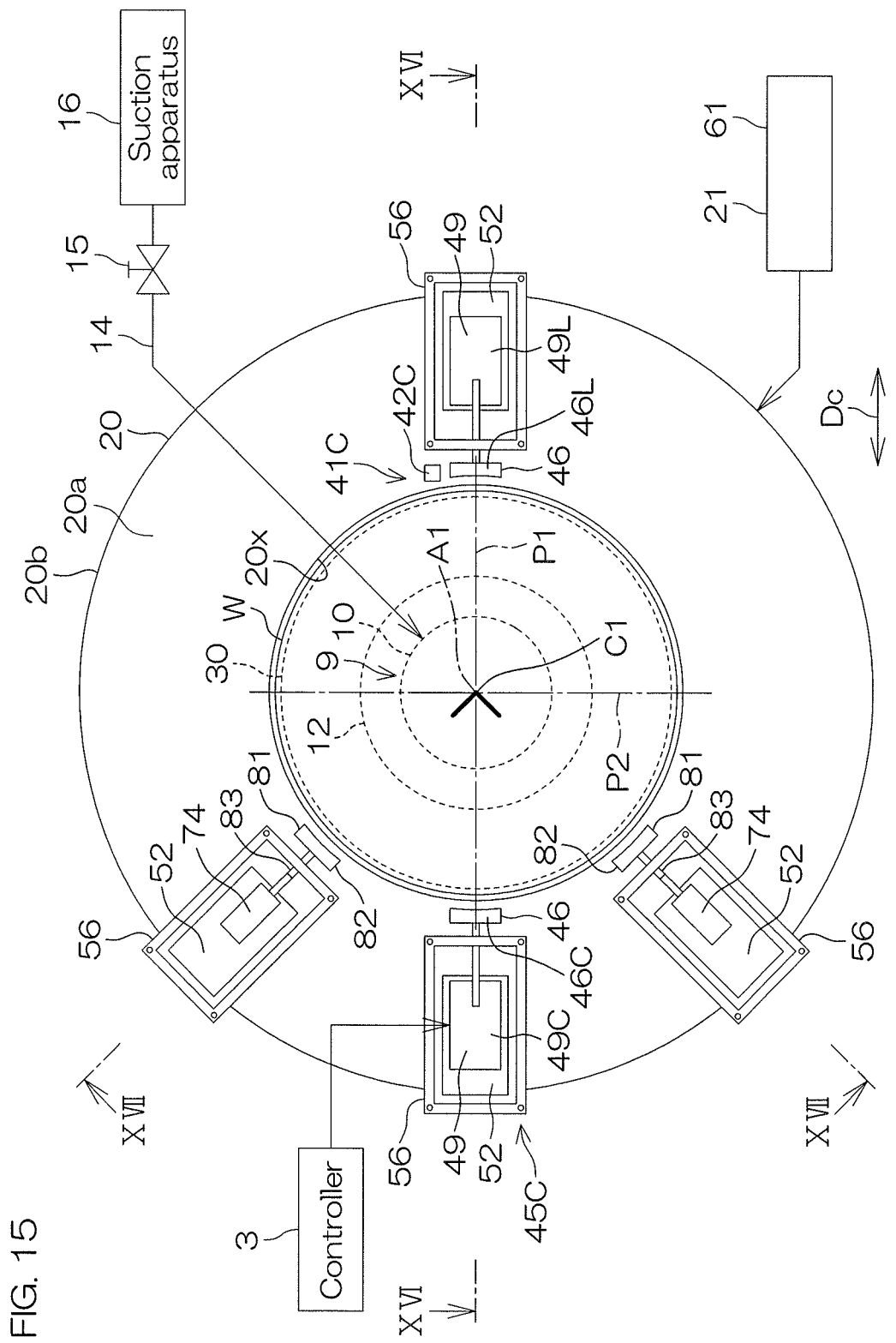
FIG. 15 is a schematic top view of a centering unit included in a centering system according to a third preferred embodiment of the present invention.
Figure 16:
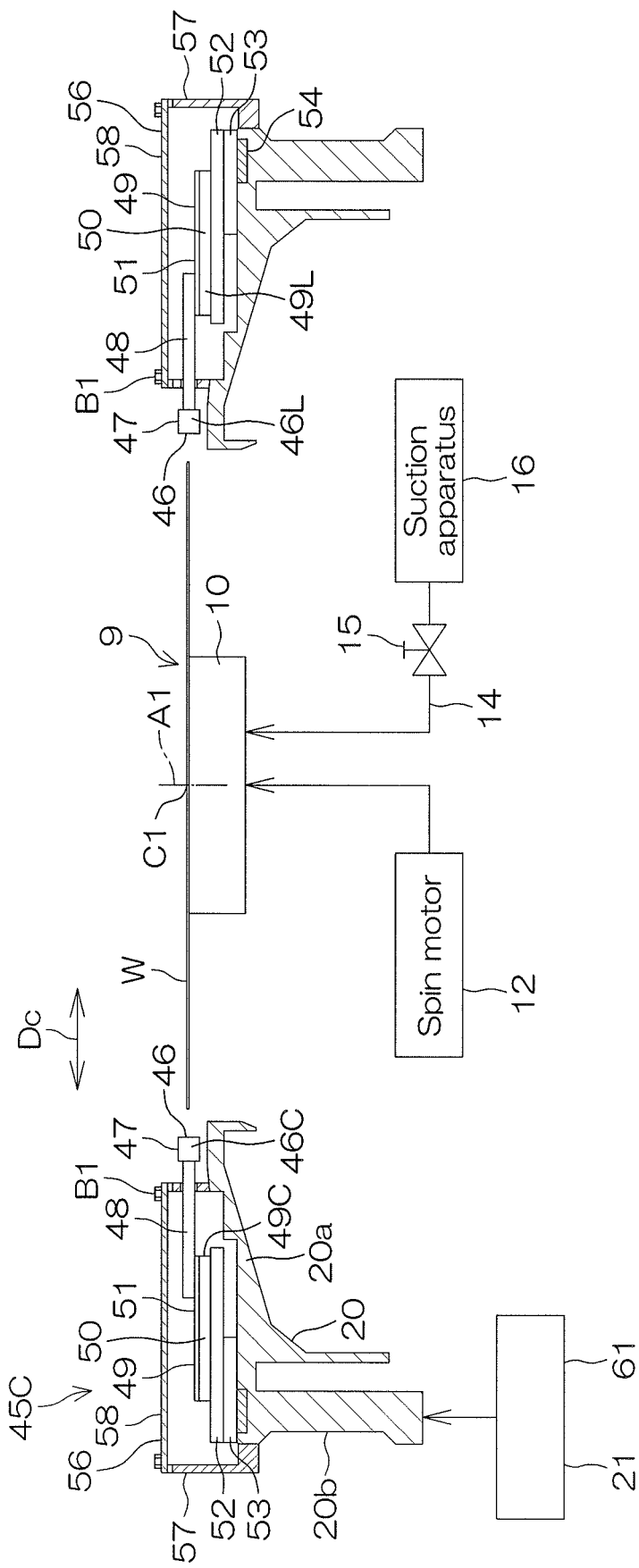
FIG. 16 is a schematic vertical sectional view of the centering unit taken along line XVI-XVI shown in FIG. 15.

FIG. 15 is a schematic top view of a centering unit 45C included in a centering system according to the third preferred embodiment of the present invention. FIG. 16 is a schematic vertical sectional view of the centering unit 45C taken along line XVI-XVI shown in FIG. 15. FIG. 17 is a schematic vertical sectional view of the centering unit 45C taken along line XVII-XVII shown in FIG. 15. FIG. 15 to FIG. 17 show a state where pushers 46 and stoppers 81 are disposed at origin positions.

As shown in FIG. 15, the centering unit 45C includes two stoppers 81, contacting the substrate W on the spin base 10, and two air cylinders 74, respectively supporting the two stoppers 81 and moving the two stoppers 81 individually. The centering unit 45C further includes two pushers 46, contacting the substrate W on the spin base 10, and two linear motors 49, respectively supporting the two pushers 46 and moving the two pushers 46 individually in the centering direction Dc.

The stoppers 81 are an example of the contacting portions that contact the substrate W on the spin base 10. Each stopper 81 includes a hand portion 82, contacting the substrate W on the spin base 10, and an arm portion 83, extending outward from the hand portion 82. The hand portions 82 are supported by the air cylinders 74 via the arm portions 83. The air cylinders 74 move the stoppers 81 rectilinearly in radial directions of the substrate W to make the stoppers 81 move back and forth between the origin positions and end positions.

The origin position and the end position of each stopper 81 are positions at respective ends of a rectilinear path through which the stopper 81 passes. The origin positions and the end positions are fixed positions. The origin positions are positions at which inner ends of the stoppers 81 are disposed further outward than the upper end 20x of the guard 20. The end positions are positions at which the inner ends of the stoppers 81 are disposed further inward than the upper end 20x of the guard 20. A direction in which each stopper 81 is brought close to the end position is an advancing direction. A direction in which each stopper 81 is brought close to the origin position is a retreating direction. Each of the radial directions of the substrate W is a direction that includes both the advancing direction and the retreating direction.

The linear motors 49 move the pushers 46 rectilinearly in the centering direction Dc between origin positions and end positions. The origin positions of the pushers 46 are positions at which the inner ends of the pushers 46 are disposed further outward than the upper end 20x of the guard 20. The end positions of the pushers 46 are positions at which the inner ends of the pushers 46 are disposed further inward than the upper end 20x of the guard 20. The controller 3 controls the linear motors 49 to make the pushers 46 stand still at arbitrary positions from the origin positions to the end positions.

The two stoppers 81 and the two pushers 46 are disposed at the same height. When the two stoppers 81 are disposed at the end positions, the two stoppers 81 are respectively disposed at two positions that are symmetrical in relation to the reference plane P1 and offset in the centering direction Dc with respect to the rotational axis A1 (see FIG. 19A). On the other hand, the two pushers 46 are respectively disposed at two positions that overlap with the reference plane P1 in plan view. The two pushers 46 face each other in the centering direction Dc. The pushers 46 move rectilinearly on the reference plane P1.

The right side pusher 46 in FIG. 15 is a position setting pusher 46L, which, together with the two stoppers 81, performs position setting of the substrate W, on the spin base 10, at the preparation position. The left side pusher 46 in FIG. 15 is a centering pusher 46C, which pushes the substrate W to move the center C1 of the substrate W1 toward the rotational axis A1. The position setting pusher 46L and the two stoppers 81 are disposed at mutually opposite sides with respect to an orthogonal plane P2 that is a vertical plane orthogonal to the reference plane P1 and passing through the rotational axis A1.

In the following description, the linear motor 49 corresponding to the position setting pusher 46L may also be referred to as the position setting linear motor 49L, and the linear motor 49 corresponding to the centering pusher 46C may also be referred to as the centering linear motor 49C. The linear motor 49 corresponding to the position setting pusher 46L is an example of a position setting actuator. The linear motor 49 corresponding to the centering pusher 46C is an example of the centering actuator.

As shown in FIG. 15, an entirety or a portion of each linear motor 49 is disposed above the guard 20 and overlaps with the guard 20 in plan view. When the pushers 46 are disposed at the origin positions, entireties of the pushers 46 are disposed above the guard 20 and overlap with the guard 20 in plan view. Similarly, an entirety or a portion of each air cylinder 74 is disposed above the guard 20 and overlaps with the guard 20 in plan view. When the stoppers 81 are disposed at the origin positions, entireties of the stoppers 81 are disposed above the guard 20 and overlap with the guard 20 in plan view.

The centering system includes four unit housings 56 that house the two air cylinders 74 and the two linear motors 49. The two air cylinders 74 are housed in two of the unit housings 56, respectively. The two linear motors 49 are housed in the remaining two unit housings 56, respectively. As shown in FIG. 17, the hand portions 82 of the stoppers 81 are disposed outside the unit housings 56. The arm portions 83 of the stoppers 81 are inserted in insertion holes 56a of the unit housings 56. Entry of liquid into the unit housings 56 via the insertion holes 56a is prevented by bellows 59 (see FIG. 6B) mounted to the stoppers 81 and the unit housings 56.

As shown in FIG. 16 and FIG. 17, the centering unit 45C includes four main bases 52, supporting the two air cylinders 74 and the two linear motors 49, and the base ring 54, supporting the four main bases 52 via four spacers 53. The two air cylinders 74 are disposed on two of the main bases 52, respectively. The two linear motors 49 are disposed on the remaining two main bases 52, respectively. Each main base 52 is fixed to the base ring 54.

The motive power of the centering raising/lowering unit 61 is transmitted to the base ring 54. When the base ring 54 is raised or lowered, the guard 20 and the main bases 52 move vertically with the direction, speed, and movement amount being the same as the base ring 54. In this process, the plurality of members supported by the four main bases 52, such as the stoppers 81, the air cylinders 74, the pushers 46, and the linear motors 49, etc., also move vertically with the direction, speed, and movement amount being the same as the base ring 54.

As shown in FIG. 15, the centering system includes, in place of or in addition to the eccentricity detector 41 of the first preferred embodiment, an eccentricity detector 41C that detects the eccentricity of the substrate W positioned on the spin base 10. The eccentricity detector 41C includes a distance sensor 42C that measures a distance to a measurement point on the outer peripheral edge of the substrate W disposed on the spin base 10. The distance sensor 42C is disposed on the guard 20 and is mounted to at least one of either of the guard 20 and the centering unit 45C. The distance sensor 42C is raised and lowered together with the guard 20 and the centering unit 45C.

The distance sensor 42C includes a light emitting portion, including a light source, a light receiving portion, receiving light of the light emitting portion, and a sensor housing, housing the light emitting portion and the light receiving portion. The distance sensor 42C irradiates light on the outer peripheral portion of the substrate W on the spin base 10 and receives light reflected by the outer peripheral portion of the substrate W. The distance from the distance sensor 42C to the outer peripheral edge of the substrate W is calculated based on a detection value of the distance sensor 42C. The detection value of the distance sensor 42C is input into the controller 3. The measurement point irradiated with the light of the distance sensor 42C may be at any position as long as it is a position on the outer peripheral edge of the substrate W.

Next, an example of centering processing will be described.

The controller 3 conducts each of the following steps by controlling the substrate processing apparatus 1.

Figure 19B:
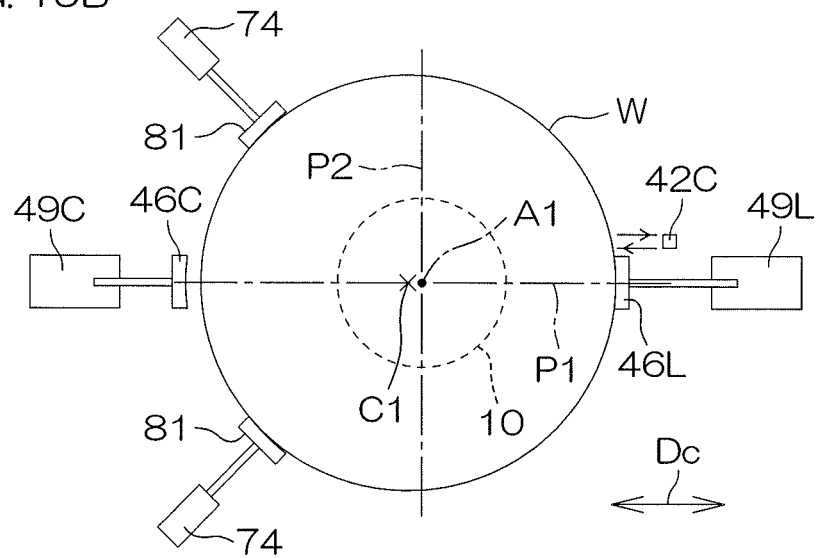
FIG. 19B is a schematic view of an example of movements of the substrate and the centering unit when the example of centering processing shown in FIG. 18 is being performed.
Figure 19C:
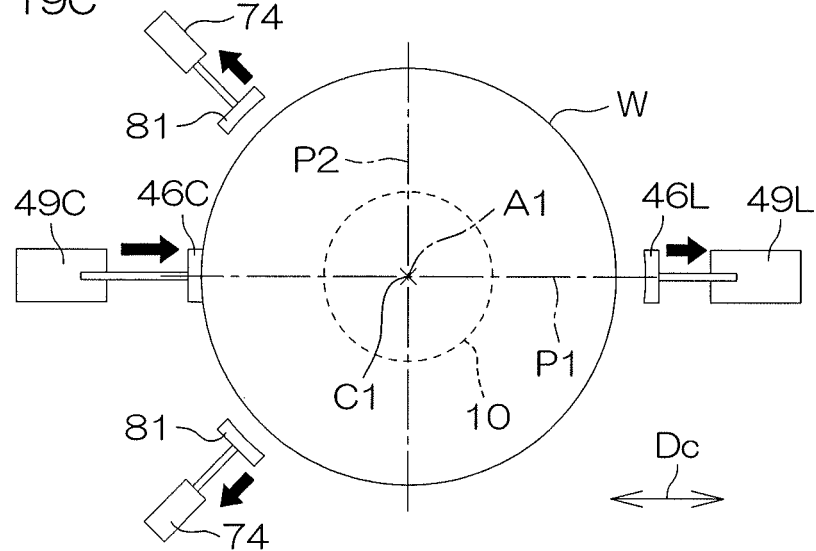
FIG. 19C is a schematic view of an example of movements of the substrate and the centering unit when the example of centering processing shown in FIG. 18 is being performed.

FIG. 18 is a flowchart for describing the example of centering processing performed by the centering system shown in FIG. 15. FIG. 19A to FIG. 19C are schematic views of an example of movements of the substrate W and the centering unit 45C when the example of centering processing shown in FIG. 18 is being performed. FIG. 15 to FIG. 18 will be referenced in the following description. FIG. 19A to FIG. 19C will be referenced where appropriate.

When the centering of the substrate W is to be performed, a preparation step of clamping the substrate W horizontally by the two stoppers 81 and the position setting pusher 46L to dispose the substrate W at the preparation position is performed (step S31 of FIG. 18).

Specifically, after the substrate W is placed on the spin base 10 in the carry-in step (step S1 of FIG. 18) described above, the centering raising/lowering unit 61 raises the centering unit 45C, together with the guard 20, to a centering height. The centering height is the height at which each pusher 46 and each stopper 81 are disposed at a height equal to that of the outer peripheral portion of the substrate W. When the centering unit 45C is disposed at the centering height, the two pushers 46 and the two stoppers 81 face the outer peripheral portion of the substrate W horizontally.

After the centering unit 45C is disposed at the centering height, the two air cylinders 74 move the two stoppers 81 from the origin positions to the end positions (positions shown in FIG. 19A) in a state where the holding of the substrate W with respect to the spin base 10 is released. Thereafter, the position setting linear motor 49L moves the position setting pusher 46L from the origin position to a contact position (positions shown in FIG. 19A).

As shown in FIG. 19A, the end positions of the two stoppers 81 are positions that are symmetrical in relation to the reference plane P1. The contact position of the position setting pusher 46L is a position at which the two stoppers 81 and the position setting pusher 46L contact the substrate W and the substrate W is clamped horizontally by the two stoppers 81 and the position setting pusher 46L. Whereas the end positions of the stoppers 81 are fixed positions, the contact position of the position setting pusher 46L is a position that changes in accordance with an outer diameter of the substrate W. For example, if the outer diameter of the substrate W is greater than a design central value, the contact position moves in a direction away from the rotational axis A1.

The position setting pusher 46L contacts the outer peripheral portion of the substrate W when it reaches the contact position or before it reaches the contact position. As shown in FIG. 19A, when the position setting pusher 46L is disposed at the contact position, the two stoppers 81 and the position setting pusher 46L contact the outer peripheral portion of the substrate W and the substrate W is clamped horizontally by the two stoppers 81 and the position setting pusher 46L.

If the substrate W is disposed at a position differing from the preparation position, the substrate W is pushed by at least one of the two stoppers 81 and the position setting pusher 46L and brought close to the preparation position. When the position setting pusher 46L is disposed at the contact position, the substrate W is disposed at the preparation position. As shown in FIG. 19A, the preparation position is a position at which the center C1 of the substrate W overlaps with the reference plane P1 and is positioned between the centering pusher 46C and the rotational axis A1 in plan view. The center C1 of the substrate W is thereby disposed between the two pushers 46.

When the position setting pusher 46L is disposed at the contact position, the position setting pusher 46L pushes the substrate W toward the two stoppers 81 and therefore forces that move the stoppers 81 toward the origin positions act on the respective stoppers 81. However, these forces are smaller than the forces by which the air cylinders 74 hold the stoppers 81 at the end positions. Therefore, the end positions do not change in accordance with the outer diameter of the substrate W and just the contact position changes in accordance with the outer diameter of the substrate W. Whether or not the substrate W is clamped by the two stoppers 81 and the position setting pusher 46L may be determined by the controller 3 based on a detection value of a pressure sensor that detects a pressure applied to the position setting pusher 46L.

After the preparation step is performed, a measuring step of measuring the eccentricity of the substrate W with respect to the rotational axis A1 is performed (step S32 of FIG. 18).

Specifically, as shown in FIG. 19B, the controller 3 makes the distance sensor 42C emit light in the state where the substrate W is disposed at the preparation position and makes the distance sensor 42C measure the distance from the measurement point on the outer peripheral edge of the substrate W disposed at the preparation position to the distance sensor 42C. The measurement point may be at any position as long as it is a position on the outer peripheral edge of the substrate W disposed at the preparation position.

In the preparation step described above, each stopper 81 is disposed at the end position and the position setting pusher 46L is disposed at the contact position. Whereas the contact position changes in accordance with the outer diameter of the substrate W, the end positions do not change in accordance with the outer diameter of the substrate W. That is, the end positions are fixed positions. The two end positions are known and therefore if the distance between the outer peripheral edge of the substrate W and the distance sensor 42C is made known, positions of three or more points located on the outer peripheral edge of the substrate W can be made known. The controller 3 can thus calculate the outer diameter of the substrate W and the eccentricity of the substrate W with respect to the rotational axis A1 based on the detection value of the distance sensor 42C.

While the distance between the outer peripheral edge of the substrate W and the distance sensor 42C is being measured, each stopper 81 may be disposed at the end position or may be disposed at a position separated from the substrate W. Similarly, the position setting pusher 46L may be disposed at the contact position or at a position separated from the substrate W.

As shown in FIG. 19C, when the measurement of the distance between the outer peripheral edge of the substrate W and the distance sensor 42C ends, the two air cylinders 74 move the two stoppers 81 to the origin positions and the position setting linear motor 49L moves the position setting pusher 46L to the origin position. The two stoppers 81 and the position setting pusher 46L are thereby separated from the substrate W.

After the measuring step is performed, a centering step of pushing the substrate W by the centering pusher 46C to move the center C1 of the substrate W toward the rotational axis A1 is performed (step S33 of FIG. 18).

Specifically, as shown in FIG. 19C, in a state where the substrate W is positioned at the preparation position and the holding of the substrate W with respect to the spin base 10 is released, the centering linear motor 49C moves the centering pusher 46C to a centering position. The centering position is a position at which the eccentricity of the substrate W with respect to the rotational axis A1 is decreased to a value within the allowable range and is set based on the eccentricity of the substrate W measured in the measuring step. The centering position may be a position between the origin position and the end position or may be the end position.

The centering pusher 46C contacts the outer peripheral surface of the substrate W before reaching the centering position and thereafter pushes the substrate W toward the rotational axis A1. When the centering pusher 46C is pushing the substrate W, the holding of the substrate W with respect to the spin base 10 is released. The substrate W thus moves horizontally with respect to the spin motor 12 while in a state of contacting the spin base 10. Thereby, the center C1 of the substrate W is brought close to the rotational axis A1. When the centering pusher 46C reaches the centering position, the eccentricity of the substrate W with respect to the rotational axis A1 is decreased to a value within the allowable range.

Thereafter, the centering linear motor 49C returns the centering pusher 46C to the origin position. In this process, the centering pusher 46C separates from the substrate W. The suction valve 15 is opened after the centering pusher 46C reaches the centering position. After the centering pusher 46C returns to the origin position and the holding of the substrate W with respect to the spin base 10 is restarted, the measuring step (return to step S32 of FIG. 18) may be performed or the above-described chemical liquid supplying step (step S3 of FIG. 18) and steps subsequent thereto may be performed without performing the measuring step a second time.

With the third preferred embodiment, the following actions and effects can be exhibited in addition to the actions and effects of the first preferred embodiment. Specifically, with the third preferred embodiment, the position setting linear motor 49L, which is an example of the position setting actuator, moves the position setting pusher 46L horizontally. The substrate W on the spin chuck 9 is thereby clamped horizontally by the two stoppers 81 and the position setting pusher 46L.

The two stoppers 81 are respectively disposed at the two positions that are symmetrical in relation to the reference plane P1. If the center C1 of the substrate W is deviated with respect to the reference plane P1, that is, if the center C1 of the substrate W is not positioned on the reference plane P1, the substrate W is guided by the two stoppers 81 and the position setting pusher 46L to the preparation position, at which the center C1 of the substrate W overlaps with the reference plane P1, and is set in position thereat.

The centering pusher 46C pushes the substrate W in the centering direction Dc, which is the horizontal direction parallel to the reference plane P1. The substrate W thereby moves horizontally with respect to the spin chuck 9. In this process, the center C1 of the substrate W moves on the reference plane P1 toward the rotational axis A1. Thereby, the center C1 of the substrate W is brought close to the rotational axis A1 and the substrate W is centered.

Fourth Preferred Embodiment

In the following description, a fourth preferred embodiment of the present invention will be described with reference to FIG. 20 to FIG. 23D. In FIG. 20 to FIG. 23D, components equivalent to the above described components shown in FIGS. 1 to 19C are designated by the same reference symbols as in FIG. 1, etc., and description thereof is omitted.

Figure 20:
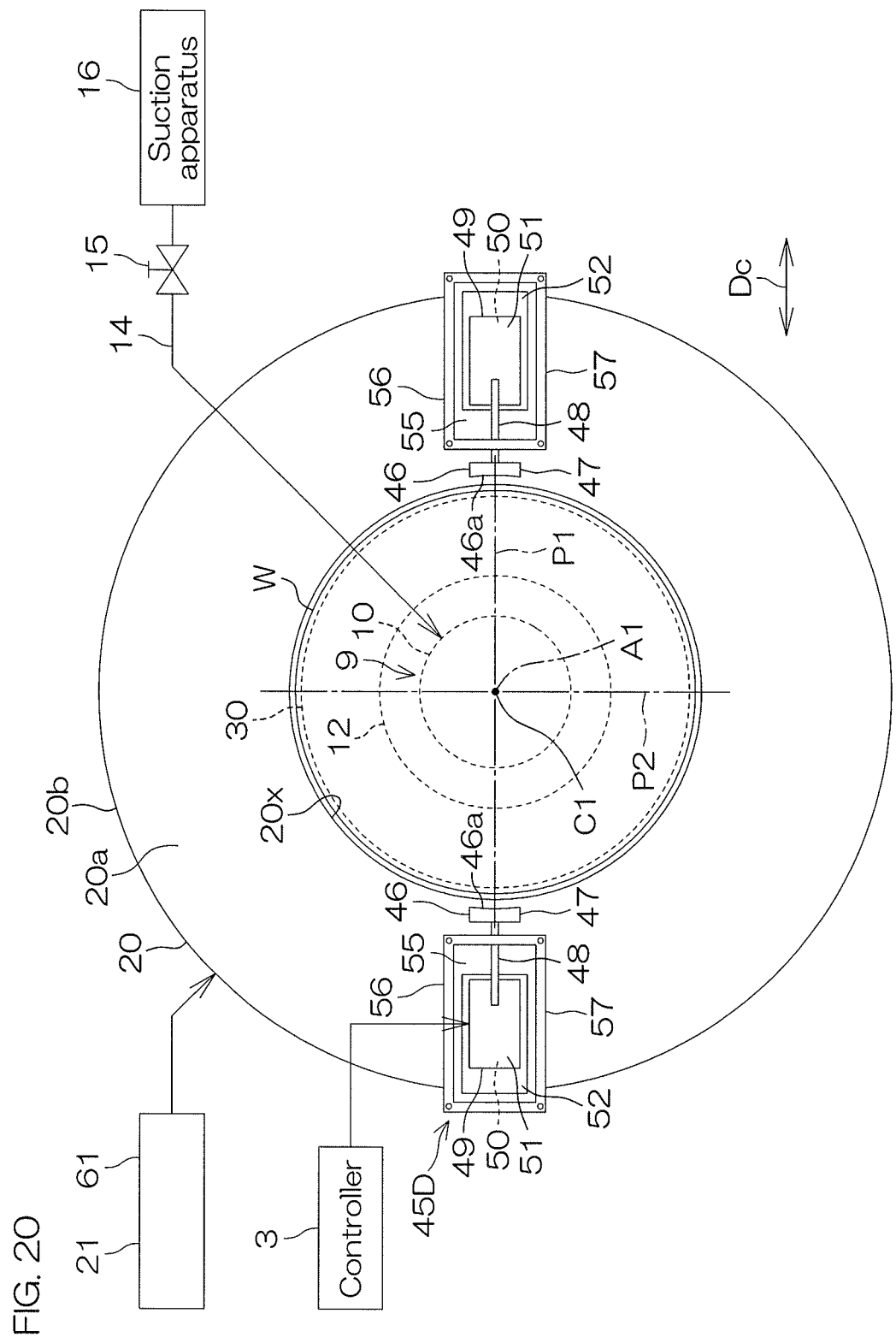
FIG. 20 is a schematic top view of a centering unit included in a centering system according to a fourth preferred embodiment of the present invention.

FIG. 20 is a schematic top view of a centering unit 45D included in a centering system according to the fourth preferred embodiment of the present invention. FIG. 20 shows a state where pushers 46 are disposed at origin positions.

The centering unit 45D includes two pushers 46, contacting the substrate W on the spin base 10, and two linear motors 49, moving the two pushers 46 individually in the centering direction Dc. The centering unit 45D further includes two main bases 52, supporting the two linear motors 49, respectively, and the base ring 54, supporting the two main bases 52 via two spacers 53. The two linear motors 49 are housed in two unit housings 56, respectively.

The two pushers 46 are disposed at the same height. The two pushers 46 are respectively disposed at two positions differing by 180 degrees in angle around the rotational axis A1. The two pushers 46 overlap with the reference plane P1 in plan view. The two pushers 46 face each other in the centering direction Dc. The two pushers 46 are movable rectilinearly on the reference plane P1.

An entirety or a portion of each linear motor 49 is disposed above the guard 20 and overlaps with the guard 20 in plan view. When the pushers 46 are disposed at the origin positions, entireties of the pushers 46 are disposed above the guard 20 and overlap with the guard 20 in plan view. The two linear motors 49 are disposed on the two main bases 52, respectively. Each main base 52 is fixed to the base ring 54.

The motive power of the centering raising/lowering unit 61 is transmitted to the base ring 54. When the base ring 54 is raised or lowered, the guard 20 and the main bases 52 move vertically with the direction, speed, and movement amount being the same as the base ring 54. In this process, the plurality of members supported by the two main bases 52, such as the pushers 46 and the linear motors 49, etc., also move vertically with the direction, speed, and movement amount being the same as the base ring 54.

Next, an example of centering processing will be described.

Firstly, an example of movements of the substrate W and the centering unit 45D when the centering processing is performed will be described. Thereafter, another example of movements of the substrate W and the centering unit 45D when the centering processing is performed will be described. The flow of the centering processing is the same in outline for the respective examples. The controller 3 conducts each of the following steps by controlling the substrate processing apparatus 1.

FIG. 21 is a flowchart for describing the example of centering processing performed by the centering system shown in FIG. 20. FIG. 22A to FIG. 22D are schematic views of one example of the movements of the substrate W and the centering unit 45D when the example of centering processing shown in FIG. 20 is being performed. FIG. 20 and FIG. 21 will be referenced in the following description. FIG. 22A to FIG. 22D will be referenced where appropriate.

When the centering of the substrate W is to be performed, a preparation step of disposing the substrate W at the preparation position is performed (step S41 of FIG. 21).

Specifically, after the substrate W is placed on the spin base 10 in the carry-in step (step S1 of FIG. 21) described above, the centering raising/lowering unit 61 raises the centering unit 45D, together with the guard 20, to a centering height in a state where each pusher 46 is positioned at the origin position. The centering height is the height at which each pusher 46 is disposed at a height equal to that of the outer peripheral portion of the substrate W. When the centering unit 45D is disposed at the centering height, the two pushers 46 face the outer peripheral portion of the substrate W horizontally.

Figure 22B:
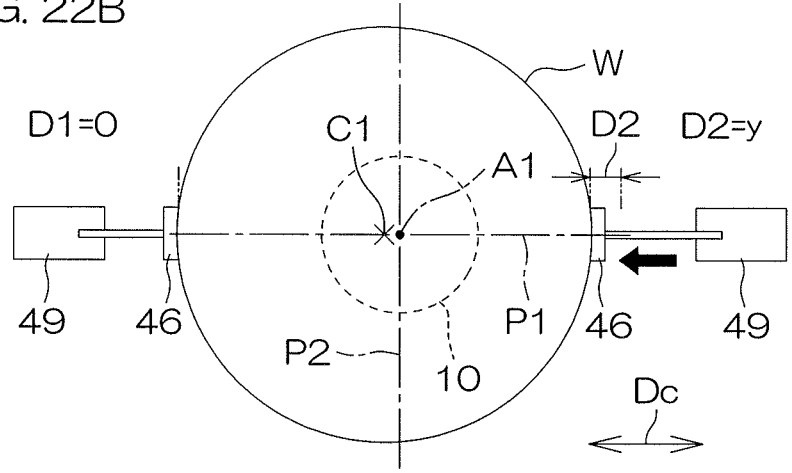
FIG. 22B is a schematic view of an example of movements of the substrate and the centering unit when the example of centering processing shown in FIG. 20 is being performed.

Thereafter, as shown in FIG. 22B, just the right side linear motor 49 moves the right side pusher 46 from the origin position to a clamping position. The clamping position is a position at which the substrate W is clamped horizontally by the two pushers 46. As the right side pusher 46 moves toward the clamping position, it contacts the outer peripheral portion of the substrate W and pushes the substrate W toward the left side pusher 46 that is positioned at the origin position.

As shown in FIG. 22B, when the right side pusher 46 is disposed at the clamping position, both pushers 46 contact the outer peripheral portion of the substrate W and the substrate W is clamped horizontally by the two pushers 46. A movement amount (distance D2) of the right side pusher 46 from the origin position to the clamping position is stored in the controller 3. FIG. 22B shows that the distance D2 from the origin position to the clamping position is a distance y.

Each pusher 46 contacts the outer peripheral portion of the substrate W at two positions that are symmetrical in relation to the reference plane P1. If the substrate W is disposed at a position differing from the preparation position, the substrate W is pushed horizontally by at least one of the two pushers 46 and the center C1 of the substrate W is disposed on the reference plane P1 before the substrate W is clamped horizontally by the two pushers 46. The substrate W is thereby disposed at the preparation position. FIG. 22A shows a state where the substrate W is disposed at a position differing from the preparation position, and FIG. 22B shows a state where the substrate W is disposed at the preparation position.

After the preparation step is performed, a centering step of pushing the substrate W horizontally by the pushers 46 to move the center C1 of the substrate W toward the rotational axis A1 is performed (step S42 of FIG. 21).

Figure 22C:
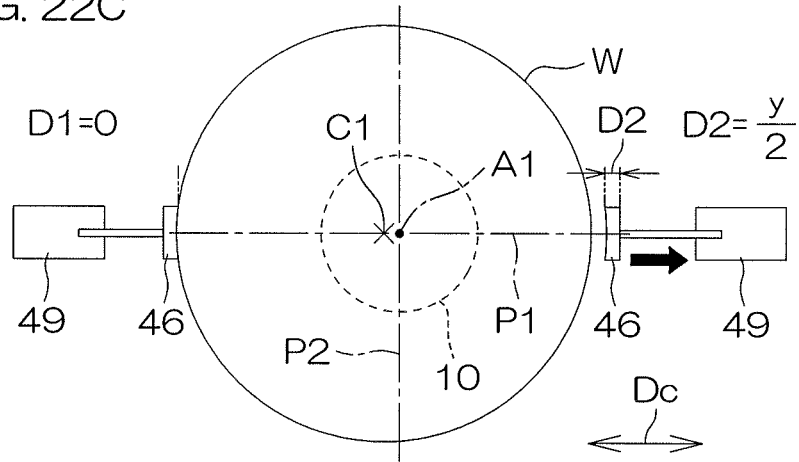
FIG. 22C is a schematic view of an example of movements of the substrate and the centering unit when the example of centering processing shown in FIG. 20 is being performed.

Specifically, as shown in FIG. 22C, the right side linear motor 49 moves the right side pusher 46 to a centering position. The centering position is a position that is "intermediate" the clamping position and the origin position. That is, a distance from the origin position to the centering position is half the distance from the origin position to the clamping position. FIG. 22C shows that the distance D2 from the origin position to the centering position is a distance y/2. When the right side pusher 46 moves toward the centering position, the right side pusher 46 separates from the substrate W in a state where the left side pusher 46 contacts the outer peripheral portion of the substrate W.

Figure 22D:
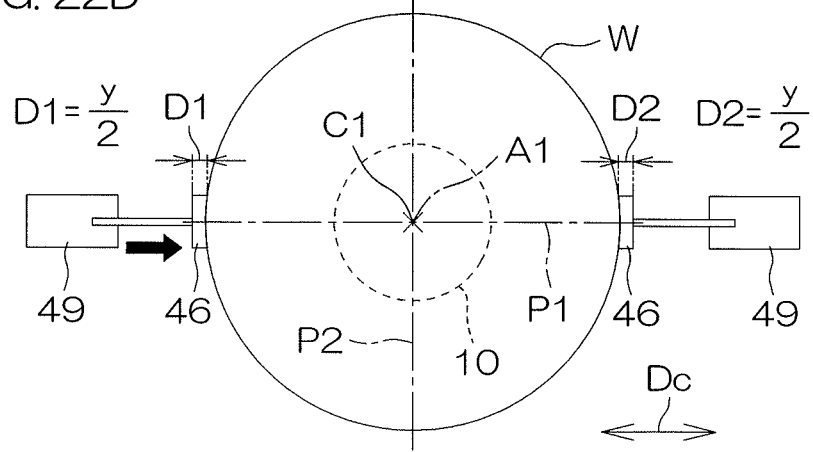
FIG. 22D is a schematic view of an example of movements of the substrate and the centering unit when the example of centering processing shown in FIG. 20 is being performed.

As shown in FIG. 22D, after the right side pusher 46 separates from the substrate W, the left side linear motor 49 moves the left side pusher 46 from the origin position to a centering position. The centering position is a position at which the outer peripheral portion of the substrate W contacts the right side pusher 46 positioned at the centering position and the substrate W is clamped horizontally by the two pushers 46. Until reaching the centering position, the left side pusher 46 pushes the substrate W toward the right side pusher 46.

As the left side pusher 46 is brought close to the centering position, the center C1 of the substrate W is brought close to the rotational axis A1 while being positioned on the reference plane P1. As shown in FIG. 22D, when the left side pusher 46 reaches the centering position, the substrate W is clamped horizontally by the two pushers 46 and the eccentricity of the substrate W with respect to the rotational axis A1 is decreased to a value within the allowable range. Thereafter, the two linear motors 49 move the two pushers 46, respectively, to the origin positions. Further, the suction valve 15 is opened and the holding of the substrate W with respect to the spin base 10 is restarted.

After the two pushers 46 return to the origin positions and the holding of the substrate W with respect to the spin base 10 is restarted, the measuring step (step S11 of FIG. 9) according to the first preferred embodiment may be performed or the above-described chemical liquid supplying step (step S3 of FIG. 21) and steps subsequent thereto may be performed without performing the measuring step. If the measuring step is performed, the chemical liquid supplying step and steps subsequent thereto can be performed in a state where the substrate W is centered reliably.

Next, the other example of the movements of the substrate W and the centering unit 45D when the example of centering processing is performed will be described.

FIG. 23A to FIG. 23D are schematic views of the other example of the movements of the substrate W and the centering unit 45D when the example of centering processing shown in FIG. 20 is being performed. FIG. 20 and FIG. 21 will be referenced in the following description. FIG. 23A to FIG. 23D will be referenced where appropriate.

When the centering of the substrate W is to be performed, the preparation step of disposing the substrate W at the preparation position is performed (step S41 of FIG. 21).

Specifically, after the substrate W is placed on the spin base 10 in the carry-in step (step S1 of FIG. 21) described above, the centering raising/lowering unit 61 raises the centering unit 45D, together with the guard 20, to the centering height in the state where each pusher 46 is positioned at the origin position. The centering height is the height at which each pusher 46 is disposed at a height equal to that of the outer peripheral portion of the substrate W. When the centering unit 45D is disposed at the centering height, the two pushers 46 face the outer peripheral portion of the substrate W horizontally.

Figure 23A:
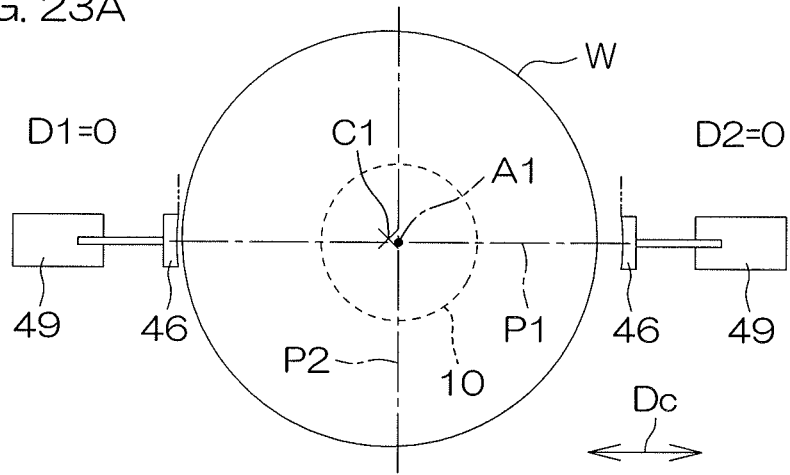
FIG. 23A is a schematic view of another example of movements of the substrate and the centering unit when the example of centering processing shown in FIG. 20 is being performed.
Figure 23B:
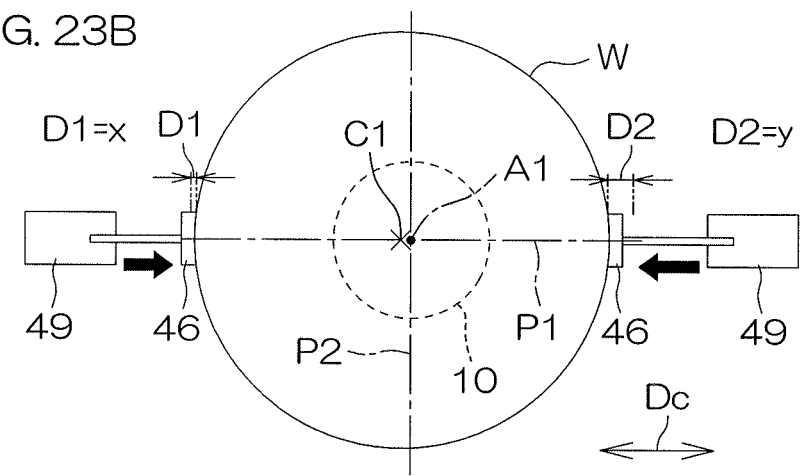
FIG. 23B is a schematic view of another example of movements of the substrate and the centering unit when the example of centering processing shown in FIG. 20 is being performed.

Thereafter, as shown in FIG. 23B, the two linear motors 49 move the two pushers 46, respectively, from the origin positions to clamping positions. The clamping positions are positions at which the substrate W is clamped horizontally by the two pushers 46. The clamping positions of the two pushers 46 may be positions that are symmetrical in relation to the orthogonal plane P2, which is the vertical plane orthogonal to the reference plane P1 and passing through the rotational axis A1, or may be positions that are asymmetrical in relation to the orthogonal plane P2. The clamping positions are not fixed positions but are positions that change in accordance with a size of the substrate W.

Movement amounts (distance D1 and distance D2) of the respective pushers 46 from the origin positions to the clamping positions are stored in the controller 3. FIG. 23B shows that the distance D2 (the movement amount of the right side pusher 46) is a distance y and the distance D1 (the movement amount of the left side pusher 46) is a distance x. As shown in FIG. 23B, when the two pushers 46 are disposed at the clamping positions, the substrate W is clamped horizontally by the two pushers 46.

If the substrate W is disposed at a position differing from the preparation position, the substrate W is pushed horizontally by at least one of the two pushers 46 and the center C1 of the substrate W is disposed on the reference plane P1 before the substrate W is clamped horizontally by the two pushers 46. The substrate W is thereby disposed at the preparation position. FIG. 23A shows a state where substrate W is disposed at a position differing from the preparation position, and FIG. 23B shows a state where the substrate W is disposed at the preparation position.

After the preparation step is performed, the centering step of pushing the substrate W horizontally by the pushers 46 to move the center C1 of the substrate W toward the rotational axis A1 is performed (step S42 of FIG. 21).

Figure 23C:
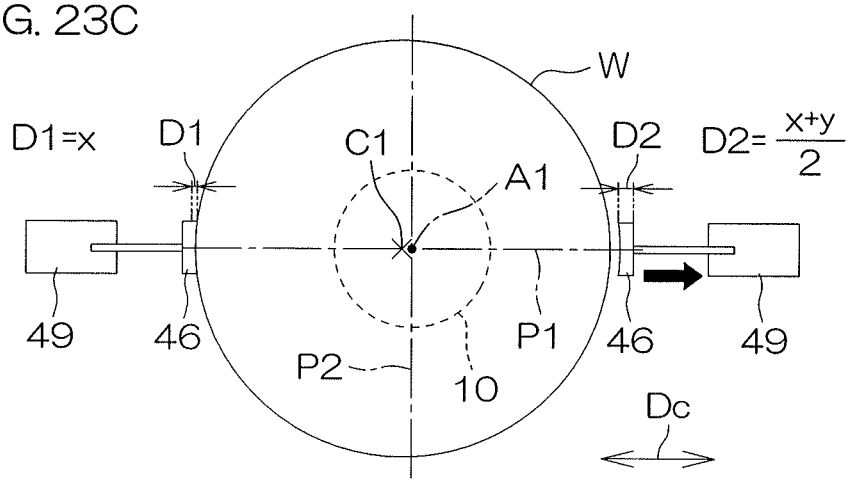
FIG. 23C is a schematic view of another example of movements of the substrate and the centering unit when the example of centering processing shown in FIG. 20 is being performed.

Specifically, as shown in FIG. 23C, if the distance y is greater than the distance x, the right side pusher 46 is returned toward the origin position and to the centering position. The centering position is a position between the clamping position and the origin position. The distance from the origin position to the centering position is ½ the sum of the movement amount (distance y) of the right side pusher 46 from the origin position to the clamping position and the movement amount (distance x) of the left side pusher 46 from the origin position to the clamping position. FIG. 23C shows that the distance D2 from the origin position to the centering position is a distance (x+y)/2.

As shown in FIG. 23C, the centering position of the right side pusher 46 is at the origin position side with respect to the clamping position and therefore when the right side pusher 46 moves toward the centering position, the right side pusher 46 separates from the substrate W. After the right side pusher 46 separates from the substrate W, the left side linear motor 49 moves the left side pusher 46 from the clamping position to the centering position. In this process, the left side linear motor 49 may move the left side pusher 46 to the centering position after making it return from the clamping position to the origin position or may move it from the clamping position to the centering position without making it return to the origin position.

The centering position of the left side pusher 46 is a position further to the rotational axis A1 side than the clamping position of the left side pusher 46. The centering position of the left side pusher 46 is a position at which the outer peripheral portion of the substrate W contacts the right side pusher 46 positioned at the centering position and the substrate W is clamped horizontally by the two pushers 46. The substrate W on the spin base 10 is pushed by the left side pusher 46 and moves toward the right side pusher 46.

Figure 23D:
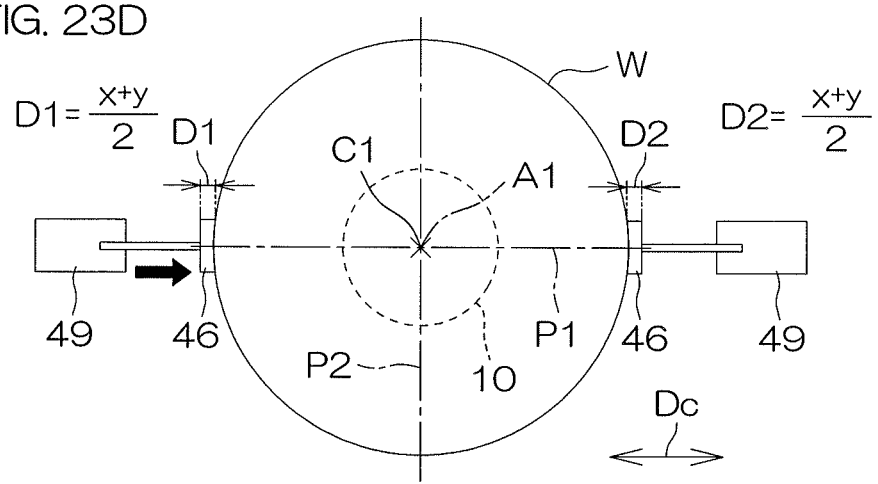
FIG. 23D is a schematic view of another example of movements of the substrate and the centering unit when the example of centering processing shown in FIG. 20 is being performed.

As the left side pusher 46 is brought close to the centering position, the center C1 of the substrate W is brought close to the rotational axis A1 while being positioned on the reference plane P1. As shown in FIG. 23D, when the left side pusher 46 reaches the centering position, the substrate W is clamped horizontally by the two pushers 46 and the eccentricity of the substrate W with respect to the rotational axis A1 is decreased to a value within the allowable range. Thereafter, the two linear motors 49 move the two pushers 46, respectively, to the origin positions. Further, the suction valve 15 is opened and the holding of the substrate W with respect to the spin base 10 is restarted.

After the two pushers 46 return to the origin positions and the holding of the substrate W with respect to the spin base 10 is restarted, the measuring step (step S11 of FIG. 9) according to the first preferred embodiment may be performed or the above-described chemical liquid supplying step (step S3 of FIG. 21) and steps subsequent thereto may be performed without performing the measuring step. If the measuring step is performed, the chemical liquid supplying step and steps subsequent thereto can be performed in a state where the substrate W is centered reliably.

With the fourth preferred embodiment, the following actions and effects can be exhibited in addition to the actions and effects of the first preferred embodiment. Specifically, with the fourth preferred embodiment, at least one of the two pushers 46 moves in the centering direction Dc. The substrate W on the spin chuck 9 is thereby clamped horizontally by the two pushers 46. The hand portion 47 of each pusher 46 contacts the outer peripheral portion of the substrate W on the spin chuck 9 at two positions symmetrical in relation to the reference plane P1. If the center C1 of the substrate W is deviated with respect to the reference plane P1, the substrate W is guided by the two pushers 46 to the preparation position, at which the center C1 of the substrate W overlaps with the reference plane P1, and is set in position thereat.

After the substrate W is disposed at the preparation position, one of the pushers 46 pushes the substrate W in the centering direction Dc. The substrate W thereby moves horizontally with respect to the spin chuck 9 and the center C1 of the substrate W moves on the reference plane P1 toward the rotational axis A1. The pair of pushers 46 thus not only disposes the substrate W at the preparation position but also brings the center C1 of the substrate W close to the rotational axis A1 and therefore the number of components of the substrate processing apparatus 1 can be decreased in comparison to a case where separate members perform the position setting of the substrate W and the centering of the substrate W.

Other Preferred Embodiments

The present invention is not restricted to the contents of the above described preferred embodiments and various modifications are possible.

For example, the housing chamber 55 may be formed not by the guard 20 and the unit housing 56 but by just the unit housing 56.

If the components, such as the linear motor 49, etc., that are housed inside the unit housing 56 are waterproofed, the unit housing 56 may be omitted.

The processing cup 17 may include a plurality of guards 20. In this case, a plurality of ceiling portions 20a are overlapped in the up/down direction and a plurality of cylindrical portions 20b are disposed concentrically. The centering unit 45, 45B, 45C or 45D is provided at the guard 20 that includes the ceiling portion 20a that is positioned uppermost.

Figure 24:
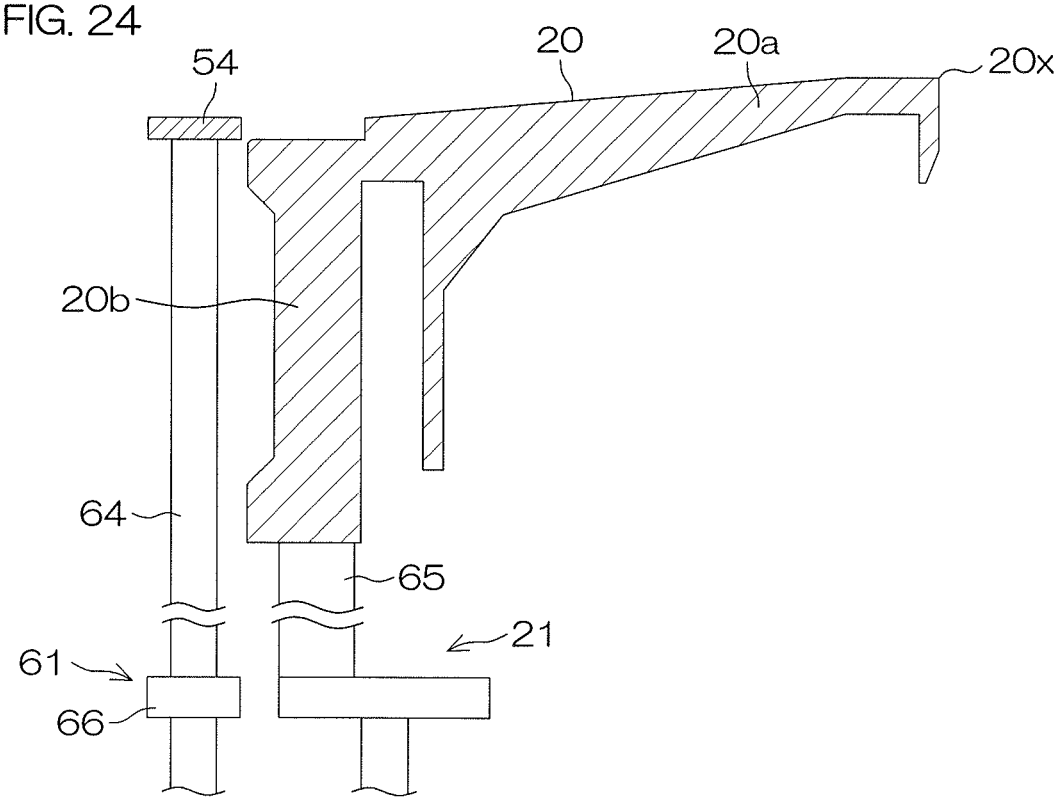
FIG. 24 is a schematic view of another example of a centering raising/lowering unit that raises and lowers the centering unit.

The support column 64 of the centering raising/lowering unit 61 may be disposed, not inside the penetrating hole 20y (see FIG. 7) of the guard 20, but at the periphery of the guard 20 as shown in FIG. 24. As show in FIG. 24, the centering raising/lowering unit 61 may be a unit separate from the guard raising/lowering unit 21 that raises and lowers the guard 20. In the latter case, the centering unit 45 can be raised and lowered independently of the raising and lowering of the guard 20. Further, the guard raising/lowering unit 21 can be made compact in comparison to a case where the guard raising/lowering unit 21 raises and lowers both the guard 20 and the centering unit 45.

In the case where the centering raising/lowering unit 61 is a unit separate from the guard raising/lowering unit 21, a motive power of a raising/lowering actuator of the guard raising/lowering unit 21 is transmitted to the guard 20 via the raising/lowering bracket 65. In this case, the support column 64 of the centering raising/lowering unit 61 and the raising/lowering bracket 65 of the guard raising/lowering unit 21 may be disposed at mutually different phases (angles around the rotational axis A1), and the support column 64 may be disposed either in the penetrating hole 20y (see FIG. 7) of the guard 20 or a position at the periphery of the guard 20.

Figure 25:
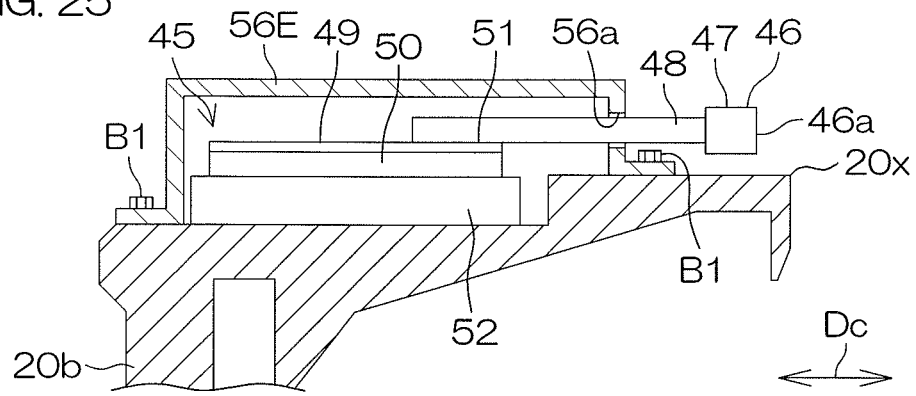
FIG. 25 is a schematic view of another example of a unit housing that houses the centering unit.
Figure 26:
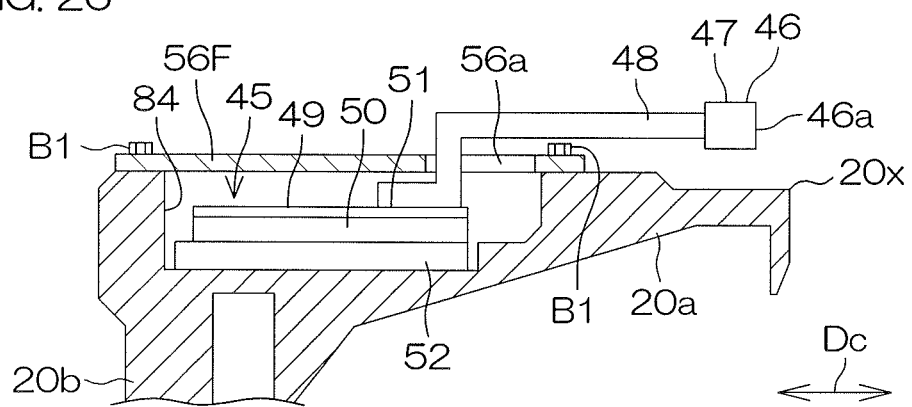
FIG. 26 is a schematic view of yet another example of a unit housing.

As shown in FIG. 25, an entirety of a unit housing 56E may be detachably mounted to the guard 20 by bolts B1. As shown in FIG. 26, the centering unit 45 may be housed in a housing groove 84 that is downwardly recessed from an upper surface of the ceiling portion 20a of the guard 20. In this case, an opening of the housing groove 84 may be closed by the lid 58 included in a unit housing 56D.

The processing of the substrate W may be a full-surface processing of supplying the processing liquid to the entire upper surface or lower surface of the substrate W instead of the bevel processing of supplying the processing liquid to just the outer peripheral portion of the substrate W.

In the third preferred embodiment, the measuring step (step S11 of FIG. 9) according to the first preferred embodiment may be performed instead of the measuring step (step S32 of FIG. 18) according to the third preferred embodiment.

The preparation position of the third preferred embodiment may be a position, at which the center C1 of the substrate W is positioned between the position setting pusher 46L and the rotational axis A1 in plan view, instead of the position, at which the center C1 of the substrate W is positioned between the centering pusher 46C and the rotational axis A1 in plan view.

In this case, the center C1 of the substrate W can be brought close to the rotational axis A1 by disposing the substrate W at the preparation position and thereafter pushing the substrate W horizontally by the position setting pusher 46L, and therefore, the centering pusher 46C and the centering linear motor 49C may be omitted. In other words, the position setting pusher 46L and the position setting linear motor 49L may respectively serve in common as the centering pusher 46C and the centering linear motor 49C.

In the third preferred embodiment, if, when the substrate W is clamped horizontally by the two stoppers 81 and the position setting pusher 46L, each stopper 81 pushes the position setting pusher 46L against the substrate W at a strength of not moving from the end position, the position setting actuator may be the air cylinders 74 instead of the linear motor 49.

In the fourth preferred embodiment, the measuring step (step S11 of FIG. 9) and the eccentricity judging step (step S12 of FIG. 9) according to the first preferred embodiment may be performed before the preparation step (step S41 of FIG. 21).

In the centering step (step S42 of FIG. 21) of the fourth preferred embodiment, the left side pusher 46 may be moved to the centering position with the right side pusher 46 being positioned as it is at the origin position instead of disposing both pushers 46 at the centering positions. However, if both pushers 46 are disposed at the centering positions, the substrate W is clamped horizontally by the two pushers 46 and therefore the substrate W can be set in position at a higher precision than in the case where just one of the pushers 46 is disposed at the centering position.

Two or more arrangements among all the arrangements described above may be combined. Two or more steps among all the steps described above may be combined.

The present application corresponds to Japanese Patent Application No. 2017-108730 filed on May 31, 2017 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing apparatus comprising:
   a substrate holder, rotating a disk-shaped substrate around a vertical rotational axis passing through a central portion of the substrate while holding the substrate horizontally;
   a processing liquid supplying unit, including a nozzle that discharges a processing liquid toward the substrate held by the substrate holder;
   a cylindrical guard, surrounding the substrate holder and receiving the processing liquid scattered outward from the substrate held by the substrate holder;
   a centering unit, which includes at least one contacting portion, contacting the substrate on the substrate holder, and a centering actuator, moving the at least one contacting portion horizontally to move the substrate horizontally with respect to the substrate holder and bring a center of the substrate close to the rotational axis, wherein at least a portion of the centering actuator is disposed above the guard such as to overlap with the guard in plan view; and
   a unit housing, disposed above the guard such as to overlap with the guard in plan view and defining a housing chamber that houses the centering actuator.

2. The substrate processing apparatus according to claim 1, wherein at least a portion of the contacting portion is disposed above the guard such as to overlap with the guard in plan view when the at least one contacting portion is not in contact with the substrate.

3. The substrate processing apparatus according to claim 1, wherein the centering actuator is a linear motor that rectilinearly moves the at least one contacting portion horizontally.

4. The substrate processing apparatus according to claim 1, wherein the unit housing defines, together with the guard, the housing chamber that houses the centering actuator.

5. The substrate processing apparatus according to claim 4, wherein the nozzle of the processing liquid supplying unit discharges the processing liquid toward an upper surface of the substrate held by the substrate holder, the processing liquid supplying unit includes a nozzle mover, moving the nozzle horizontally between a processing position, at which the processing liquid discharged from the nozzle is supplied to the upper surface of the substrate held by the substrate holder, and a standby position, at which the nozzle is positioned at a periphery of the guard in plan view, and at least one of the unit housing, the centering actuator, and the at least one contacting portion is disposed below a passing region, through which the nozzle passes, and overlaps with the passing region in plan view.

6. The substrate processing apparatus according to claim 4, wherein the unit housing includes an insertion hole, in which the contacting portion is inserted, and the substrate processing apparatus further comprises: a sealing member, surrounding the contacting portion and preventing entry of liquid into the unit housing via the insertion hole.

7. The substrate processing apparatus according to claim 1, further comprising: a raising/lowering unit that includes a raising/lowering actuator, generating motive power to raise and lower the guard and the centering unit.

8. The substrate processing apparatus according to claim 1, further comprising: a guard raising/lowering unit that includes a guard raising/lowering actuator, generating motive power to raise and lower the guard; and a centering raising/lowering unit, being separate of the guard raising/lowering unit and including a centering raising/lowering actuator, generating motive power to raise and lower the centering unit independently of the guard.

9. The substrate processing apparatus according to claim 1, wherein the substrate processing apparatus further comprises: a raising/lowering unit that includes a raising/lowering actuator, generating motive power to raise and lower the centering unit, and a transmission mechanism, transmitting the motive power of the raising/lowering actuator to the centering unit; and the transmission mechanism includes a support column that is inserted in a penetrating hole, penetrating through the guard in an up/down direction, and is raised and lowered together with the centering unit.

10. The substrate processing apparatus according to claim 1, further comprising: an eccentricity detector that detects eccentricity with respect to the rotational axis of the substrate on the substrate holder without contacting the substrate.

11. The substrate processing apparatus according to claim 1, wherein the at least one contacting portion includes a pusher that contacts an outer peripheral portion of the substrate on the substrate holder to push the substrate on the substrate holder horizontally.

12. The substrate processing apparatus according to claim 1, wherein the at least one contacting portion includes two lifters that contact a lower surface of the substrate on the substrate holder to lift the substrate on the substrate holder, and the substrate processing apparatus further comprises: a centering raising/lowering unit that includes a centering raising/lowering actuator, generating motive power to raise and lower the two lifters.

13. The substrate processing apparatus according to claim 12, wherein the centering unit further includes a slide bracket, supporting each of the two lifters and being driven horizontally by the centering actuator.

14. The substrate processing apparatus according to claim 12, wherein the substrate processing apparatus further comprises: a guard raising/lowering unit that includes a guard raising/lowering actuator, generating motive power to raise and lower the guard; and the centering raising/lowering unit is the same unit as the guard raising/lowering unit.

15. The substrate processing apparatus according to claim 1, wherein the at least one contacting portion includes two stoppers, respectively disposed at two positions that are symmetrical in relation to a reference plane that is a vertical plane passing through the rotational axis, a position setting pusher, pushing the substrate on the substrate holder horizontally toward the two stoppers until an outer peripheral portion of the substrate on the substrate holder contacts the two stoppers, and a centering pusher, pushing the substrate on the substrate holder in a centering direction, which is a horizontal direction parallel to the reference plane, to move the center of the substrate toward the rotational axis after the substrate on the substrate holder is horizontally clamped by the two stoppers and the position setting pusher, and the centering unit further includes a position setting actuator, moving the position setting pusher horizontally to horizontally clamp the substrate on the substrate holder by the two stoppers and the position setting pusher.

16. The substrate processing apparatus according to claim 1, wherein the at least one contacting portion includes two pushers, movable in a centering direction that is a horizontal direction parallel to a reference plane, which is a vertical plane passing through the rotational axis, and contacts an outer peripheral portion of the substrate on the substrate holder to horizontally clamp the substrate on the substrate holder, and each of the two pushers includes a hand portion, contacting the outer peripheral portion of the substrate on the substrate holder at two positions symmetrical in relation to the reference plane.

\* \* \* \* \*